(12) United States Patent
Samuels

(10) Patent No.: US 12,272,536 B2
(45) Date of Patent: *Apr. 8, 2025

(54) SYSTEMS AND METHODS FOR DELAY AND AMPLITUDE CORRECTION

(71) Applicant: Advanced Energy Industries, Inc., Fort Collins, CO (US)

(72) Inventor: Chad S. Samuels, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 523 days.

This patent is subject to a terminal disclaimer.

(21) Appl. No.: 17/685,931

(22) Filed: Mar. 3, 2022

(65) Prior Publication Data

US 2023/0282464 A1 Sep. 7, 2023

(51) Int. Cl.
*H01J 37/32* (2006.01)
*H03K 5/00* (2006.01)
*H03K 5/02* (2006.01)

(52) U.S. Cl.
CPC .... *H01J 37/3299* (2013.01); *H01J 37/32183* (2013.01); *H03K 5/02* (2013.01); *H01J 2237/327* (2013.01); *H03K 2005/00019* (2013.01)

(58) Field of Classification Search
None
See application file for complete search history.

(56) References Cited

U.S. PATENT DOCUMENTS

| | | |
|---|---|---|
| 11,990,324 B2 | 5/2024 | Samuels et al. |
| 2012/0170639 A1 | 7/2012 | Salsbury |
| 2014/0152189 A1 | 6/2014 | Gilmore |
| 2016/0351375 A1 | 12/2016 | Valcore, Jr. et al. |
| 2019/0295827 A1 | 9/2019 | Ohmori et al. |
| 2023/0075152 A1* | 3/2023 | Samuels ........... H01J 37/32174 |
| 2023/0080707 A1* | 3/2023 | Samuels ........... H01J 37/32926 700/30 |
| 2023/0089945 A1* | 3/2023 | Samuels ................... H02P 9/02 700/287 |

(Continued)

OTHER PUBLICATIONS

Kari Rodriguez, International Search Report, Jul. 21, 2023, Alexandria Virginia.

(Continued)

*Primary Examiner* — Srinivas Sathiraju
(74) *Attorney, Agent, or Firm* — NOD IP Law

(57) ABSTRACT

This disclosure describes systems, methods, and apparatus for generating a control signal for one or more actuators that is adjusted from a control signal dictated by setpoints, where the adjustment accounts for predicted delays and amplitude errors. More specifically, cross correlation between measurements of the actuator(s) outputs and time-shifted setpoints can be optimized for a time-shift that minimizes the cross correlation. The time-shifted setpoints along with the measurements can then be used to determine an amplitude difference and to remove noise from the amplitude difference. Dynamic uncertainty can then be found from this denoised data set and further optionally used to find the noise that was removed. The time delay, noise, and dynamic uncertainty can be used to preemptively adjust the control signal.

20 Claims, 44 Drawing Sheets

(56) References Cited

U.S. PATENT DOCUMENTS

| | | | | |
|---|---|---|---|---|
| 2023/0106863 A1* | 4/2023 | Samuels | ........... | H01J 37/32174 700/287 |
| 2023/0125521 A1* | 4/2023 | Samuels | ........... | H01J 37/32174 315/111.21 |
| 2023/0140542 A1* | 5/2023 | Samuels | .............. | G11C 7/1006 711/154 |
| 2023/0280719 A1* | 9/2023 | Samuels | ............. | H01J 37/3299 700/266 |
| 2023/0282462 A1* | 9/2023 | Samuels | ........... | H01J 37/32926 700/160 |
| 2023/0282464 A1* | 9/2023 | Samuels | .................. | H03K 5/02 156/345.24 |
| 2024/0004353 A1* | 1/2024 | Samuels | ............. | G05B 13/042 |
| 2024/0004354 A1* | 1/2024 | Samuels | ........... | H01J 37/32926 |
| 2024/0006151 A1* | 1/2024 | Samuels | ........... | H01J 37/32137 |
| 2024/0006169 A1* | 1/2024 | Samuels | ........... | H01J 37/32174 |
| 2024/0012370 A1* | 1/2024 | Samuels | ........... | G05B 13/0275 |
| 2024/0012371 A1* | 1/2024 | Samuels | ............. | G05B 13/042 |
| 2024/0012372 A1* | 1/2024 | Samuels | ............. | G05B 13/042 |
| 2024/0014017 A1* | 1/2024 | Samuels | ........... | H01J 37/32935 |
| 2024/0019818 A1* | 1/2024 | Samuels | ............. | G05B 13/042 |
| 2024/0019819 A1* | 1/2024 | Samuels | ............. | G05B 13/042 |

OTHER PUBLICATIONS

PCT, International Preliminary Report on Patentability issued in PCT/US2023/014211, Sep. 12, 2024, 14 pages.

* cited by examiner

Time shown in Milliseconds

Time shown in Milliseconds

Time shown in Milliseconds

Time shown in Milliseconds

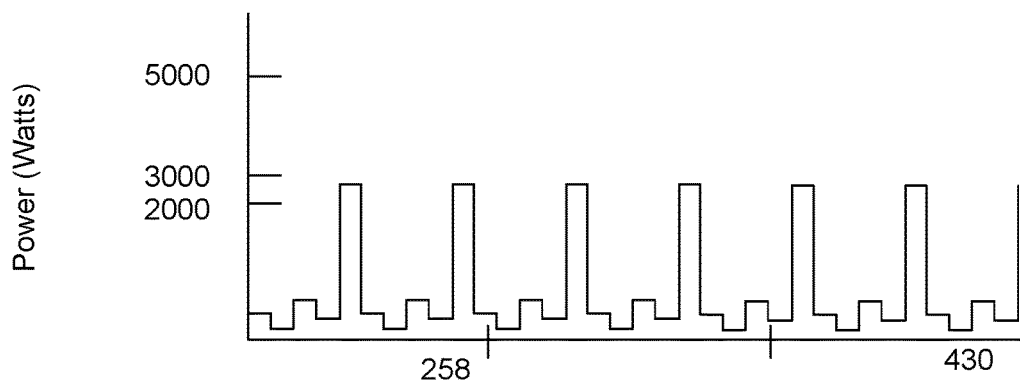
FIG. 18A
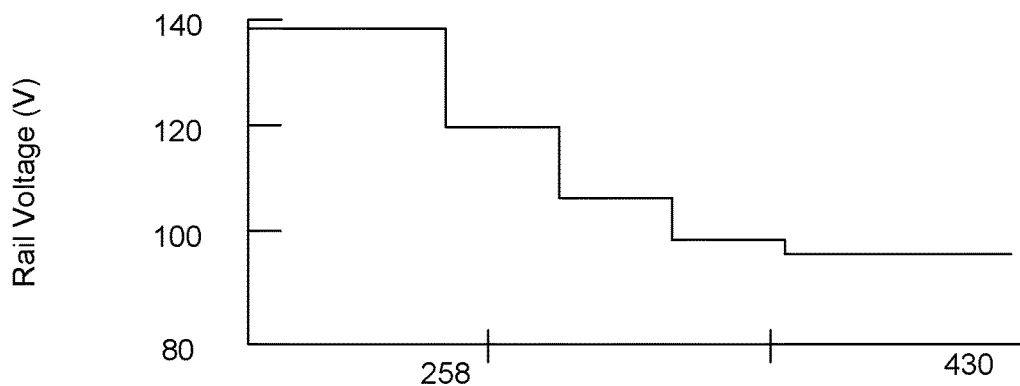
FIG. 18B
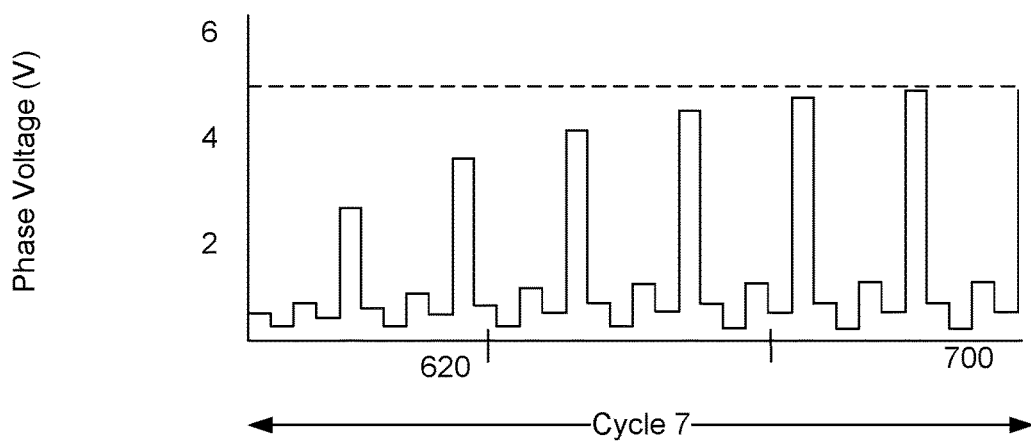
Time shown in Milliseconds       FIG. 18C Time shown in Milliseconds

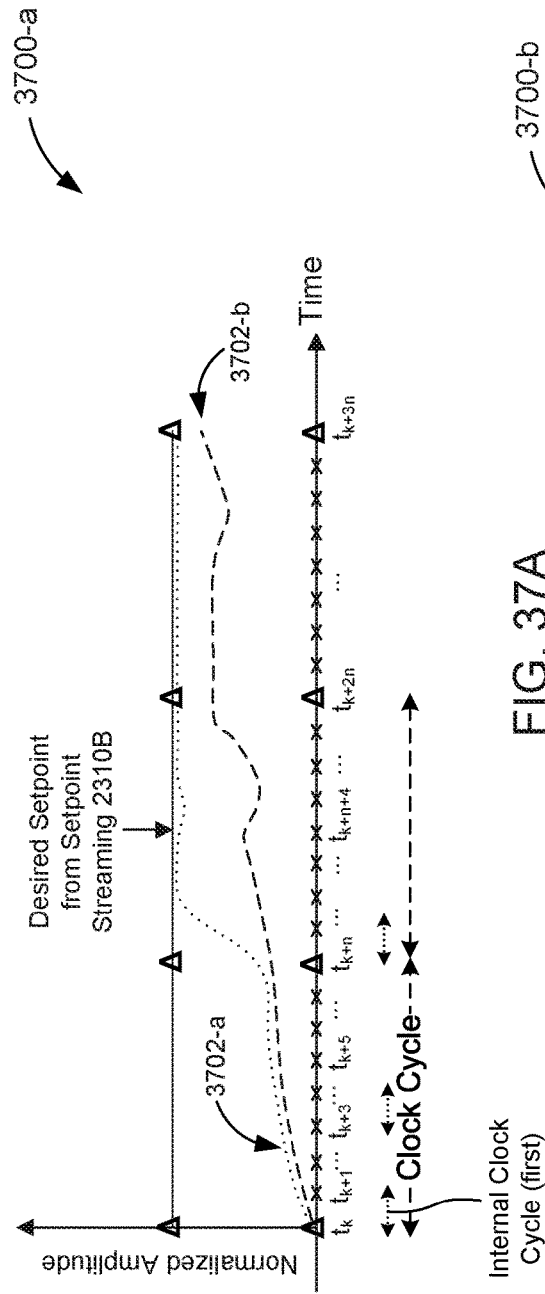
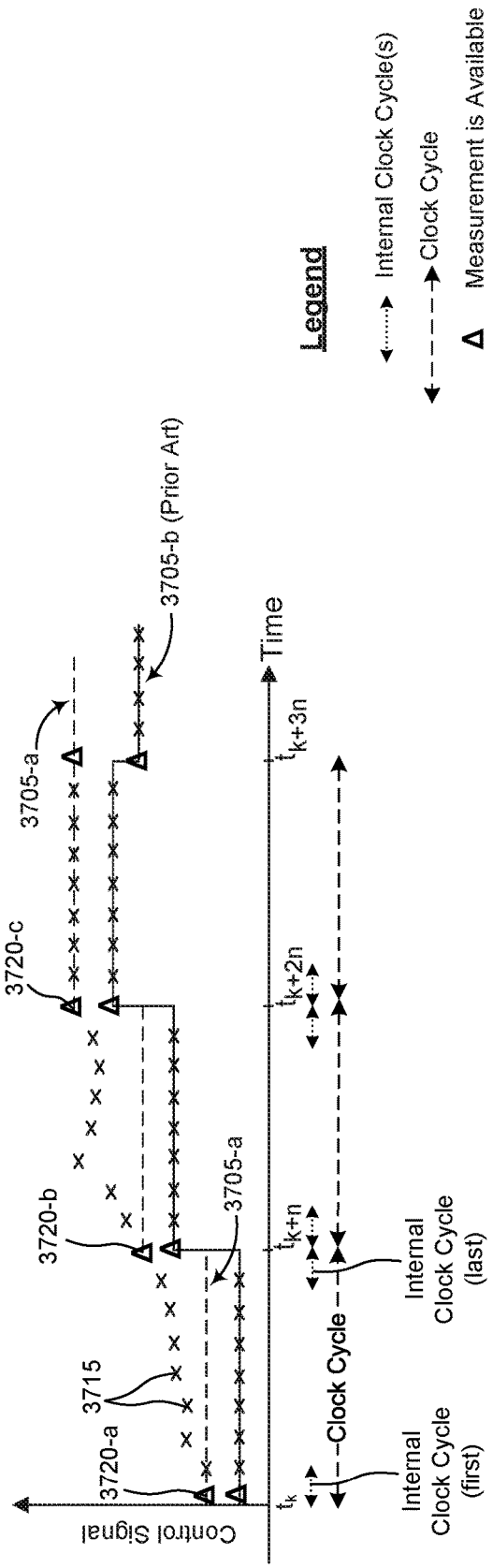
FIG. 37A
FIG. 37B

SYSTEMS AND METHODS FOR DELAY AND AMPLITUDE CORRECTION

FIELD OF THE DISCLOSURE

The present disclosure relates generally to provision of power to a plasma processing chamber. In particular, but not by way of limitation, the present disclosure relates to systems, methods and apparatuses for controlling actuators in a plasma processing system.

DESCRIPTION OF RELATED ART

Control systems have important applications in many technology areas, including plasma applications, semiconductor processing and other materials processing, robotics, vehicle control systems for automobiles, aircraft, and spacecraft, and other electronic, manufacturing, and industrial systems. Semiconductor processing and other advanced materials processing rely on increasingly sophisticated plasma processes. Such plasma processes, in turn, require increasingly sophisticated power systems and control systems, to subject inherently unstable and nonlinear plasmas to increasing precision and consistency. Such plasmas are used for processes such as plasma etch processes, plasma-enhanced chemical vapor deposition (CEPVD) processes, plasma-enhanced atomic layer deposition (PEALD) processes, plasma-assisted atomic-layer deposition (PA-ALD), RF sputtering deposition, and other plasma processing applications.

In some plasma processing recipes, it is desirable to provide a pulsed waveform having multiple states (or power levels) as exemplified by the illustrative waveform in FIG. 2. Each recipe includes a number of pulse cycles (PC), number of pulses per pulse cycle, and a number of states per pulse. Each state has a different target power level. In this example, two pulse cycles are shown, the first pulse cycle having six pulses and each of those pulses having three states. The second pulse cycle has four pulses each having four states. Plasma processing systems comprise many actuators to achieve a desired application of power such as is shown in FIG. 2. But in many instances, the actuators respond differently to control signal because different actuators inherently have different response times (e.g., some actuators respond much faster than other actuators) and/or the actuators operate in an asynchronous manner. In the context of this disclosure, actuators may include, without limitation, higher-level constructs such as generators, match networks, remote plasma sources, and bias supplies. In addition, actuators may include, without limitation, lower-level constructs such as DC rail supplies, RF amplifiers, variable capacitors, and power supplies within bias supplies and remote plasma source. In today's plasma processing systems, control (e.g., for precision and consistency) over the high-level actuators and low-level actuators is critical in view of the increasing speeds of the actuators and the ever-decreasing dimensions of the resultant processed-workpieces.

As an additional example, an RF generator for providing the pulsed waveform in FIG. 2 may have actuators that include a DC section and a power amplifier where the DC section provides a rail voltage to the power amplifier and the power amplifier provides the desired pulsed waveform (e.g., FIG. 2) using the rail voltage. The power amplifier is relatively fast (e.g., ~250 ns) compared to changes in the target voltage, but the DC section or the rail, is relatively slow (e.g., ~1 ms). As a consequence, existing control systems tend to hold the rail at a high level for much of a pulse cycle (e.g., at a highest level needed for a given pulse cycle). However, this can lead to overheating of components and premature system failure and maintenance needs as well as inefficiency since the rail is often far above the level needed at any moment in time (i.e., for a given state within a pulse of a pulse cycle).

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

An aspect of this disclosure may be characterized as a plasma processing system that preemptively accounts for time delay and amplitude error in the system. The system can include a user interface, at least one sensor, a delay/amplitude estimator, and a predictive control section. The user interface can be configured to receive a reference signal defining target values for a parameter that is controlled at an output within the plasma processing system. The least one sensor can obtain a measure of the parameter that is controlled at the output. The delay/amplitude estimator can be configured to: calculate a delay between the target values of the reference signal and corresponding actual parameter values achieved at the output; and provide, based upon the delay, a time-shifted amplitude error indicative of an error between the target values and the actual parameter values, the error encompassing at least noise and dynamic uncertainty. The predictive control section can be configured to preemptively adjust at least one actuator, based upon the delay and the time-shifted amplitude error.

Another aspect of the disclosure can be characterized as a method of modifying control signals to one or more actuators based on measurements of one or more parameters of outputs of the one or more actuators and based on setpoints. The method can include finding a total time delay that minimizes a total time delay between (1) time-shifted versions of the setpoints and (2) the measurements; selecting a one of the time-shifted versions of the setpoints corresponding to the total time delay as a set of selected time-shifted setpoints; determining an amplitude difference between the measurements and the set of selected time-shifted setpoints; removing noise from the amplitude difference to form a denoised amplitude difference; using the denoised amplitude difference to find a dynamic uncertainty of the amplitude difference; using the noise, the dynamic uncertainty, and the total time delay, to generate a time-shifted amplitude error; and passing a control signal to the one or more actuators that predictively accounts for the total time delay and the time-shifted amplitude error.

Another aspect of the disclosure can be characterized as a non-transitory, tangible computer readable storage medium, encoded with processor readable instructions to perform a method for generating control signals that preemptively account for delay and amplitude errors in a control system. The method can include taking measurements at an output of one or more actuators; finding a total time delay that minimizes a total time delay between (1) time-shifted versions of setpoints for the one or more actuators and (2) the measurements; selecting a one of the time-shifted versions of the setpoints corresponding to the total time delay as a set of selected time-shifted setpoints; determining an amplitude difference between the measurements and the set of selected time-shifted setpoints; removing noise from the amplitude difference to form a denoised amplitude difference; using the denoised amplitude difference to find a dynamic uncertainty of the amplitude difference; using the noise, the dynamic uncertainty, and the total time delay, to generate a time-shifted amplitude error; and controlling the one or more actuators preemptively to account for the total time delay and the time-shifted amplitude error.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 18A illustrates details of the seventh cycle of the waveform shown in FIG. 13A;

FIG. 18B illustrates details of the seventh cycle of the waveform shown in FIG. 13B;

FIG. 18C illustrates details of the seventh cycle of the waveform shown in FIG. 13C;

FIG. 37A depicts a graph of normalized signal amplitude against time for a controlled parameter, according to various aspects of the present disclosure;

FIG. 37B depicts a graph of control output values used to adjust an actuator, according to various aspects of the present disclosure;

DETAILED DESCRIPTION

Figure 1:
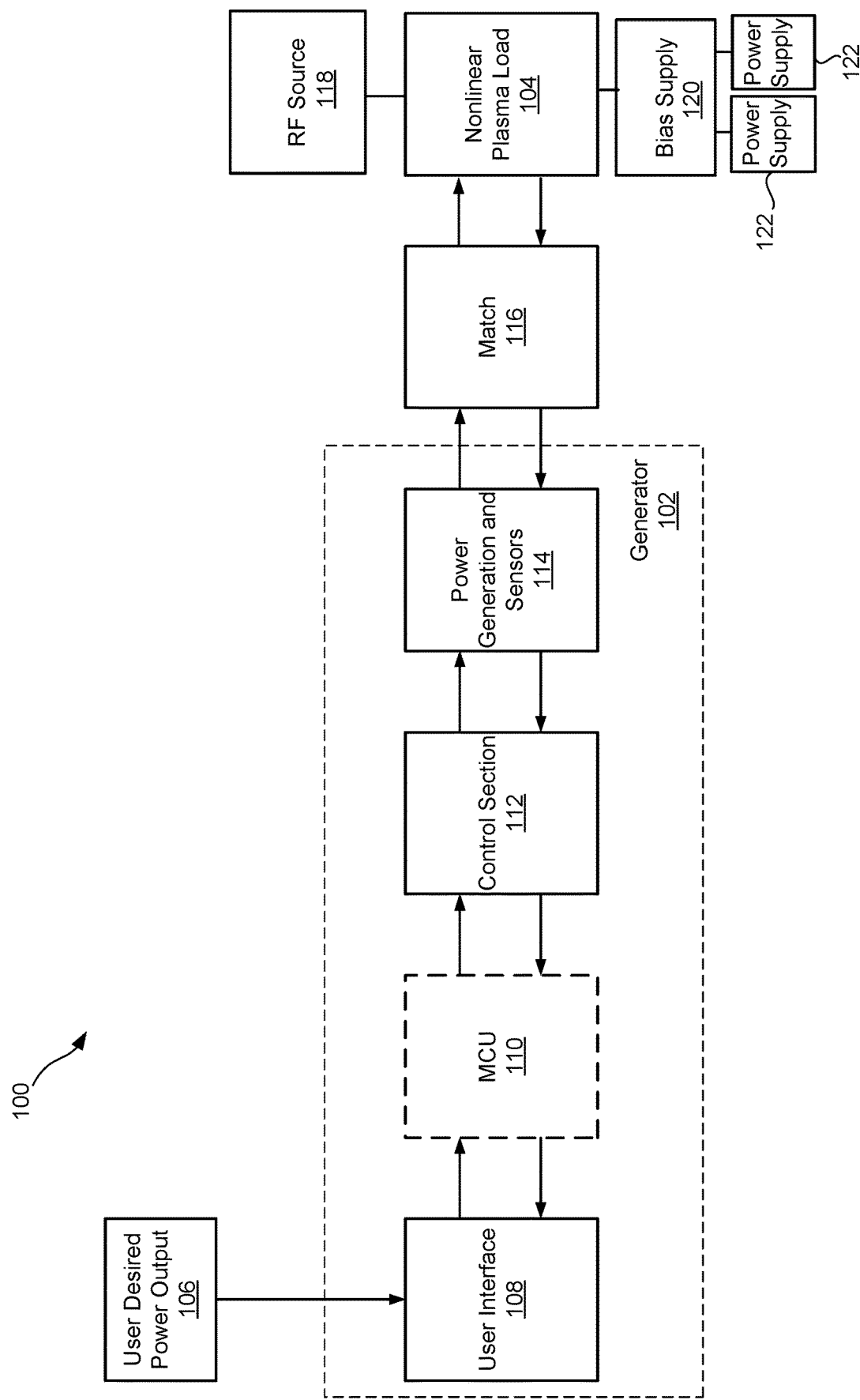
FIG. 1 is a block diagram that illustrates a system-level view of a plasma processing system.

The present disclosure relates generally to an RF generator for plasma processing, and more specifically to more efficient control of the rail voltage used to power an RF power amplifier producing a multi-level pulsed output.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods and computer program products according to various embodiments of the present disclosure. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items, and may be abbreviated as "/".

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 illustrates a system-level view of a plasma processing system 100 comprising actuators including a generator 102, for providing a variety of types of waveforms (such as pulsed waveforms) to a nonlinear and/or chaotic load 104 (e.g., a plasma load) based on a user-defined power output 106 where the user may be a person, an input from another controller, or an input from a control construct within the plasma processing system 100. The RF generator (or "generator" for short) 102 can include a user interface 108, a master control unit (MCU) 110, a control section 112 (e.g., an FPGA, CPU, or combination of FPGA and CPU), and power generation and sensors 114. Other actuators depicted in FIG. 1 include and a match network 116, an RF source 118, a bias supply 120 and power supplies 122 coupled to the bias supply 120. The high-level actuators in FIG. 1 may include lower-level constructs (that are subcomponents of the higher-level constructs) such as, for example without limitation, DC rail supplies, RF amplifiers, variable capacitors, and direct current (DC) power supplies within the bias supply 120. In general, FIG. 1 depicts a multi-actuator and multi-knob nonlinear system, and aspects of this disclosure detailed further herein relate to control over the multi-actuator and multi-knob system.

Figure 3:
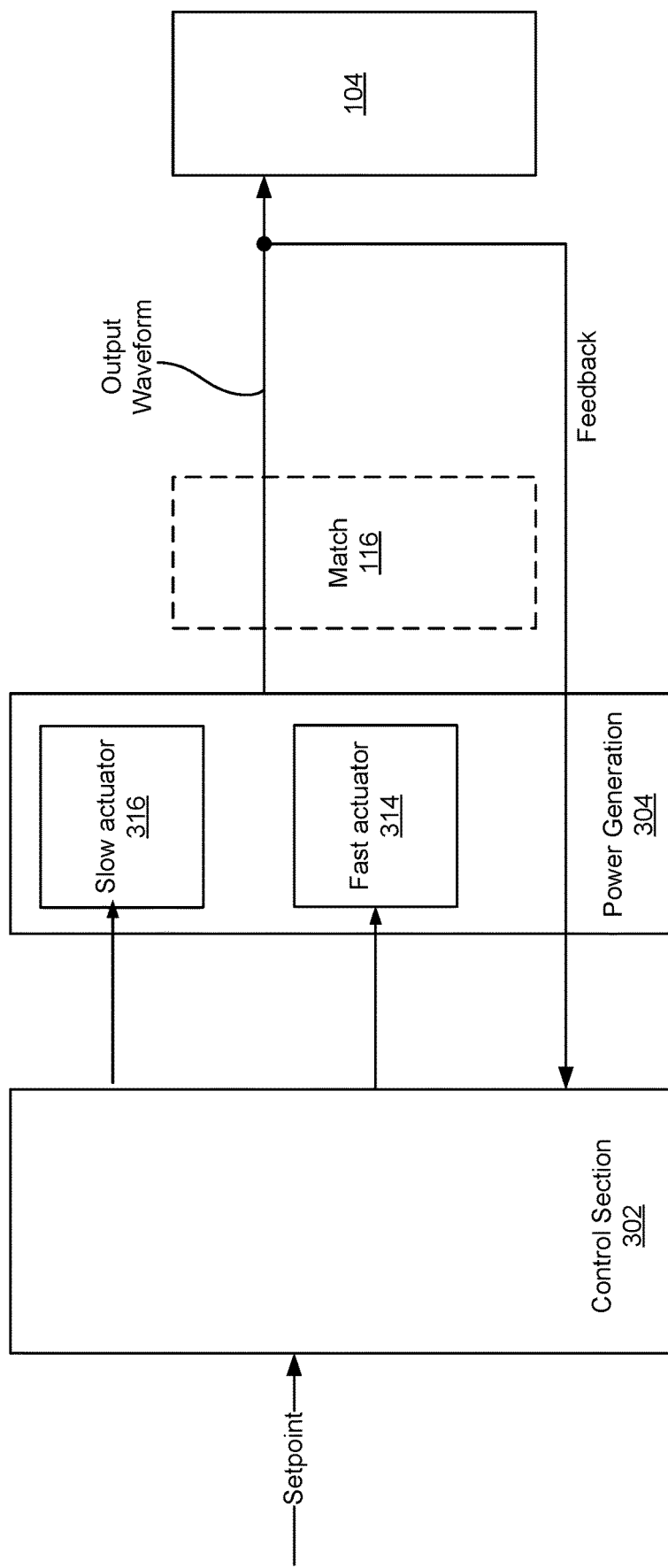
FIG. 3 is a block diagram depicting aspects of an RF generator.
Figure 4:
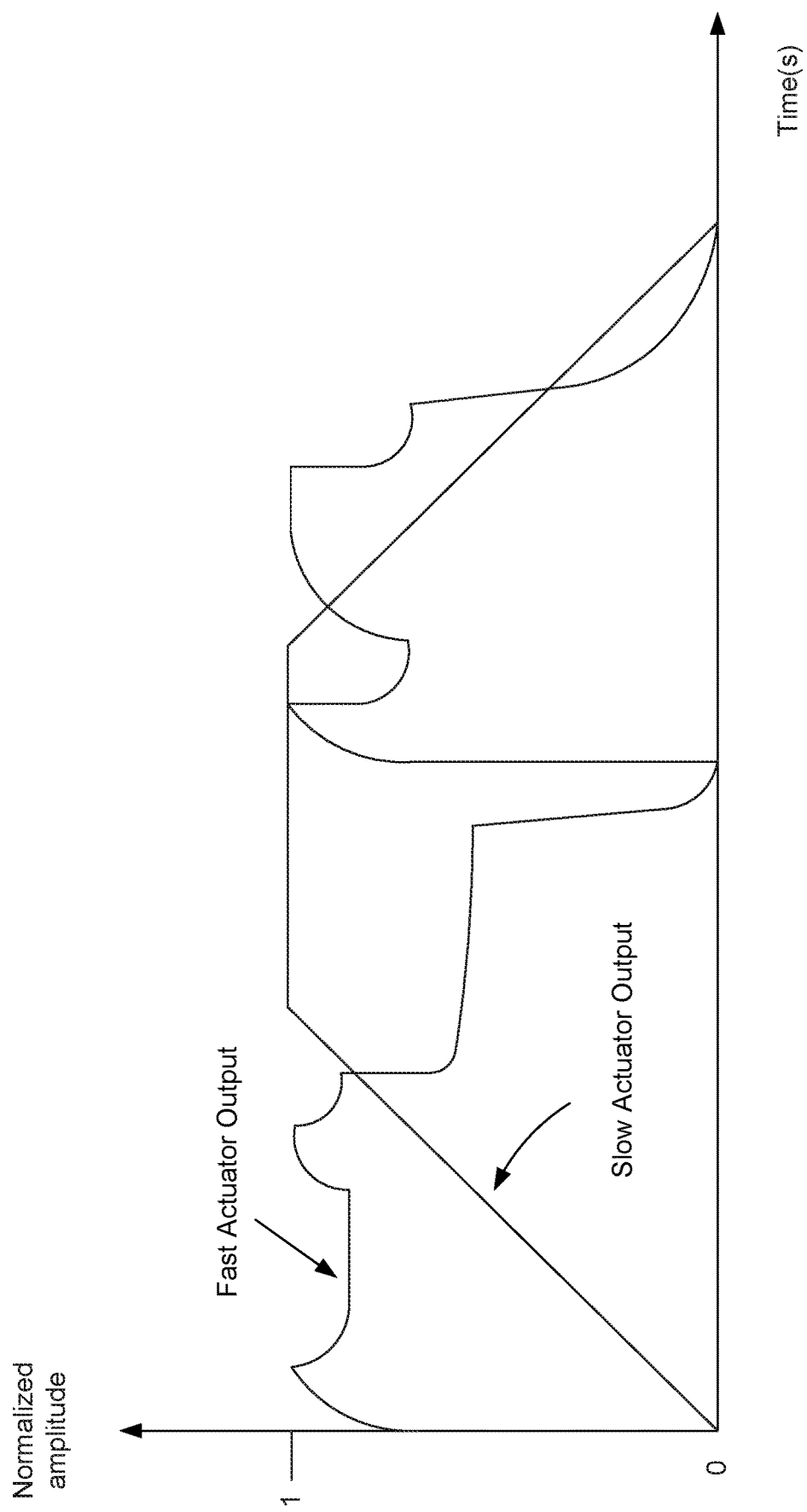
FIG. 4 is a graph depicting outputs of the slow actuator and the fast actuator of FIG. 3.

In many instances, actuators of a plasma processing system may comprise many actuators where the actuators operate at different speeds. As an example, FIG. 3 depicts a power generation system 304 that includes a fast actuator 314 and a slow actuator 316, and FIG. 4 is a graph of normalized amplitude over time of a fast actuator output (output from the fast actuator 314) and a slow actuator output from the slow actuator 316. These signals are illustrative of a variety of other actuator outputs that may be generated with methods, systems, and devices of this disclosure, which may be intrinsically scalable (which may be due at least in part to their tensorial nature), and their use of a tensor signal processing engine, in various examples.

In general, the actuator outputs depicted in FIG. 4 are values physically achieved in response to the actuators receiving corresponding control signals. The values of the actuator outputs may be, for example, values of controlled parameters, such as for example and without limitation, voltage, current, phase, frequency, forward power, reflected power, and a reflection coefficient. The particular parameter that is regulated depends upon the actuators being controlled and the control methodology being utilized.

The "fast" actuator output may be considered fast because its slew rate ((Max−Min/Tmax−Tmin)) may be relatively greater than that of the "slow" actuator output. In other words, for a given amount of time, the fast actuator output can move between values at a much greater rate than the relatively slower slow actuator output. The present disclosure provides many examples where the fast actuator comprises an RF amplifier and the slow actuator comprises a DC rail, but these are only examples to help describe how control systems and methodologies disclosed herein operate, and the control methodologies disclosed herein are generally applicable to different types of actuators.

Figure 5A:
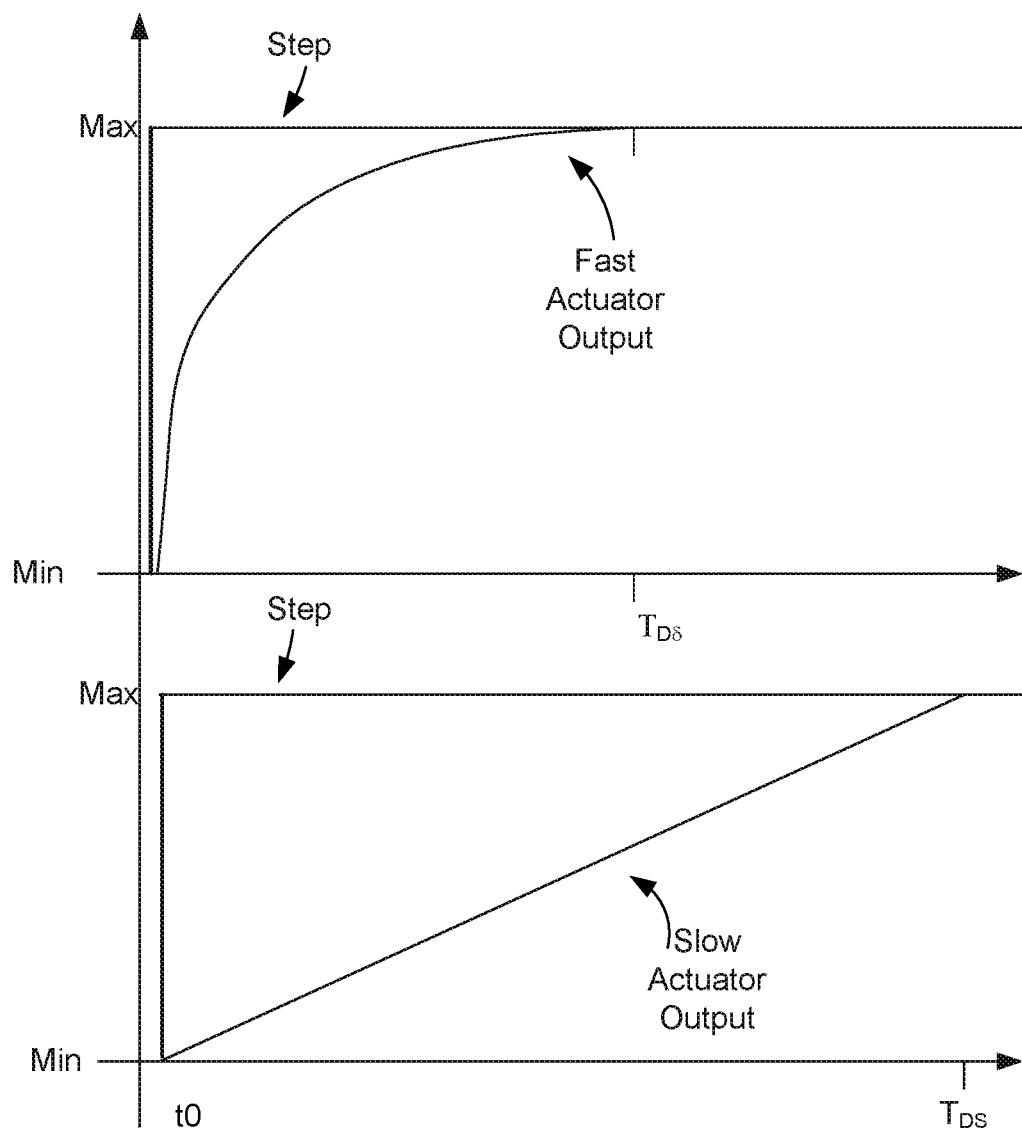
FIG. 5A is another graph depicting operational aspects of the slow actuator and the fast actuator of FIG. 3.

While FIG. 4 shows how actuators may operate over of the course of time (e.g., in connection with processing steps to vary an output waveform of a power generation system 304, and FIG. 5A is a graph depicting the time it takes for each of the fast actuator 314 and the slow actuator 316 to reach an output in response to step command. More specifically, FIG. 5A, shows a graph of normalized amplitude over time of the fast actuator output and the slow actuator output where both outputs are reacting to a step input to go from a minimum to a maximum. A normalized cross-delay $X_D$ may be defined as the difference between the time at which the slow actuator output reaches its maximum (due to the step input from minimum to maximum) and the time at which the fast actuator output control reaches its maximum (due to the step input from minimum to maximum). A normalized reverse cross-delay $RX_D$ may be defined analogously as the normalized cross-delay $X_D$ but with a step input going from maximum to minimum, where the normalized reverse cross-delay $RX_D$ is the time between the fast control and the slow control each reaching their minima. In other words, the normalized cross-delay $X_D$ may be defined as $$X_D = T_{DS} - T_{DF} \qquad \text{Equation 1}$$

where $TD_F$ is the control delay of the fast actuator output, and $TD_S$ is the control delay of the slow actuator output. A normalized reverse cross-delay $RX_D$ may be defined equivalently (assuming symmetrical response times going from high to low as from low to high).

As long as a control rate or dynamic load required response time is greater than the control delay of the slow actuator output $TD_S$, this time delay does not affect operations. But due to the fast nature of plasma transients, on the order of nanoseconds, DC converters, RF amplifiers, and other actuators typically can barely, if at all, keep up with required control rates or dynamic load required response times.

For example, one illustrative advanced plasma processing system may have a fast actuator control output $TD_F$, for an RF amplifier drive/bias voltage, of 250 nanoseconds (ns), and a slow actuator control output $TD_S$, for a DC rail voltage, of 1.5 milliseconds (ms), where the slow actuator output is four orders of magnitude slower than the fast actuator output, and around six orders of magnitude slower than the nanosecond-scale, "near-instantaneous" plasma dynamics.

As another example, a more advanced plasma processing system may have a slow actuator output $TD_S$ of 1.5 microseconds (µs), which is a three orders of magnitude improvement over the example system indicated above, but this response time is still not ideal response time. In this example system, the added speed of the slow actuator may come at the expense of not reaching high power levels, and needing several RF amplifiers, such as four RF amplifiers, to achieve just 3 kilowatts (kW) of power.

Figure 5B:
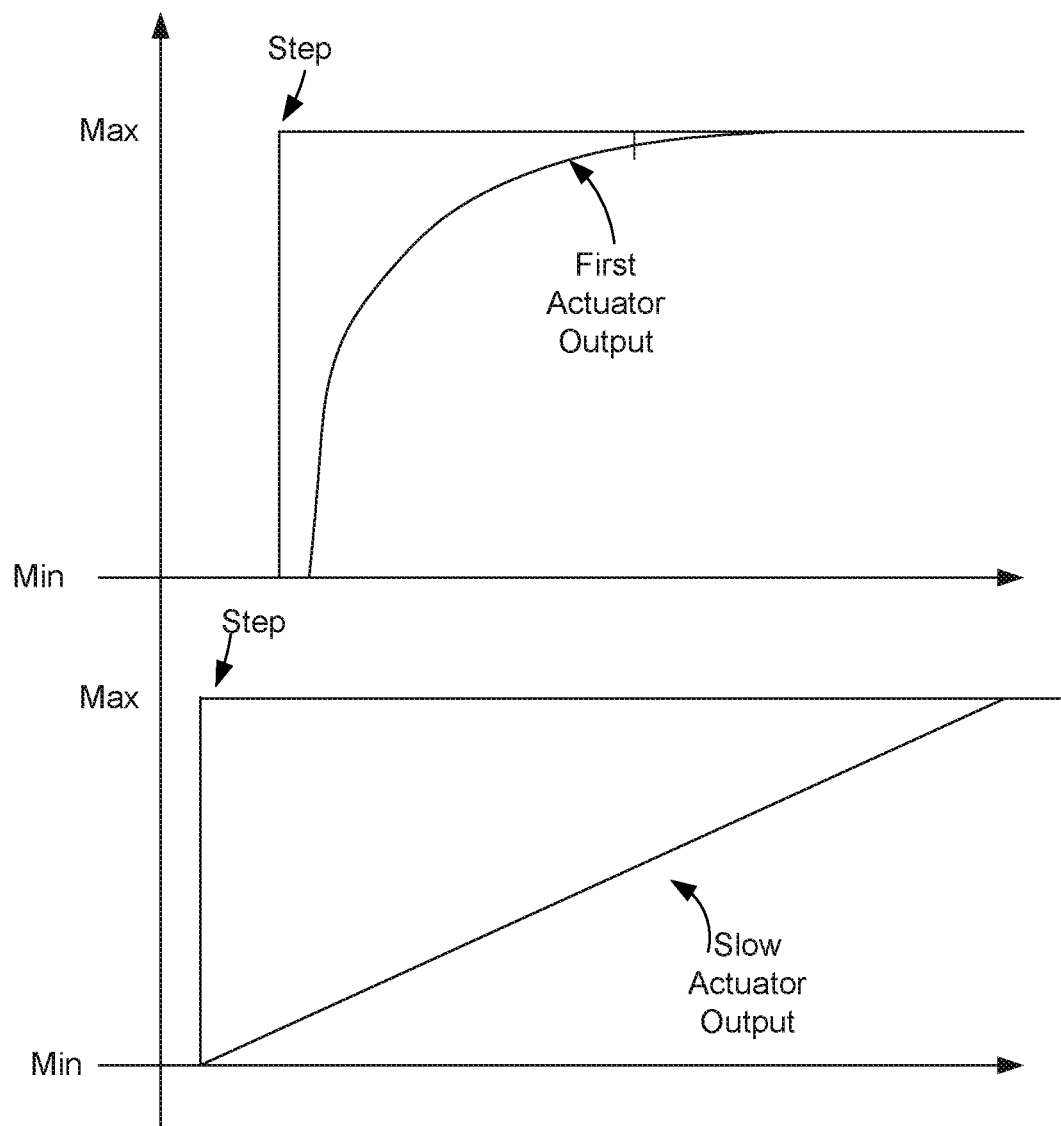
FIG. 5B is yet another graph depicting operational aspects of the slow actuator and the fast actuator of FIG. 3.

Another issue that is faced in the context of controlling multiple actuators is the asynchronous operation that may occur between multiple actuators. FIG. 5B for example depicts an example of asynchronous control that may be used in connection with two actuators. The problems of associated with differential response times and/or differential delays are addressed by the various embodiments disclosed herein.

According to one aspect of this disclosure, control over actuators may be performed reactively (as discussed with reference to FIGS. 6-19) to address the delay issues discussed above. And according to another aspect, actuators may be controlled preemptively (as discussed herein with reference to FIGS. 20 through 30) to address the delay and asynchronous issues discussed above.

Figure 2:
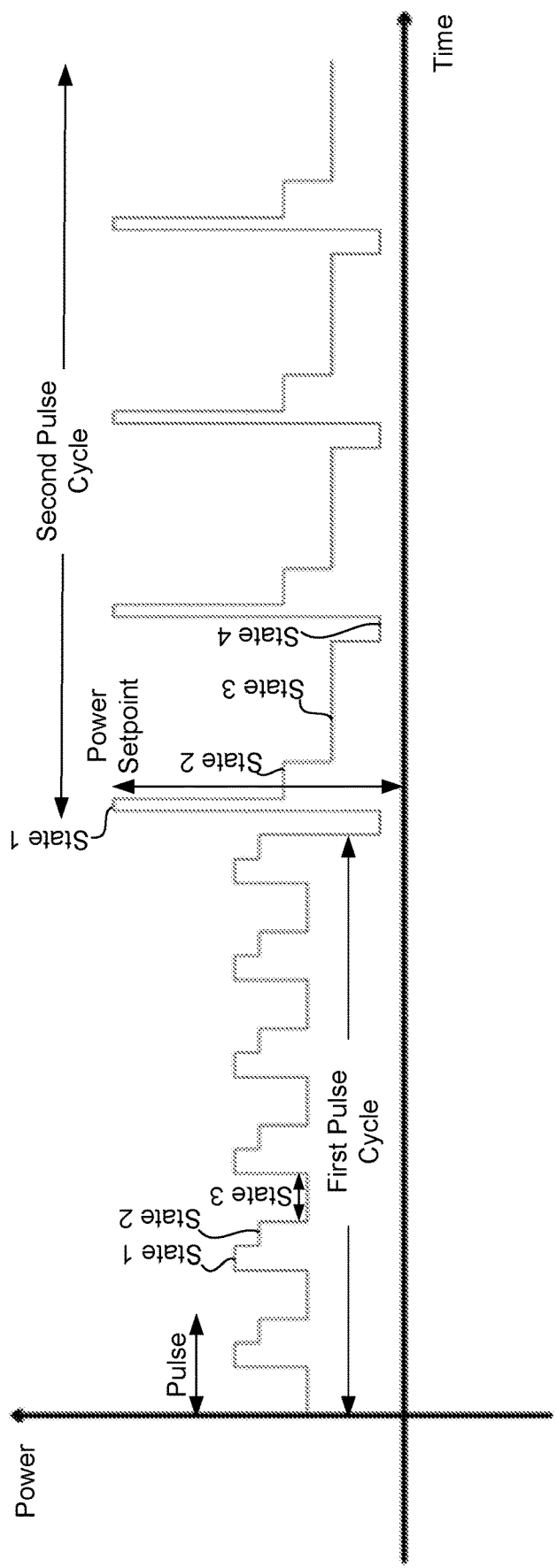
FIG. 2 illustrates a multi-level pulsed waveform that may be produced by the RF generators disclosed herein.
Figure 6:
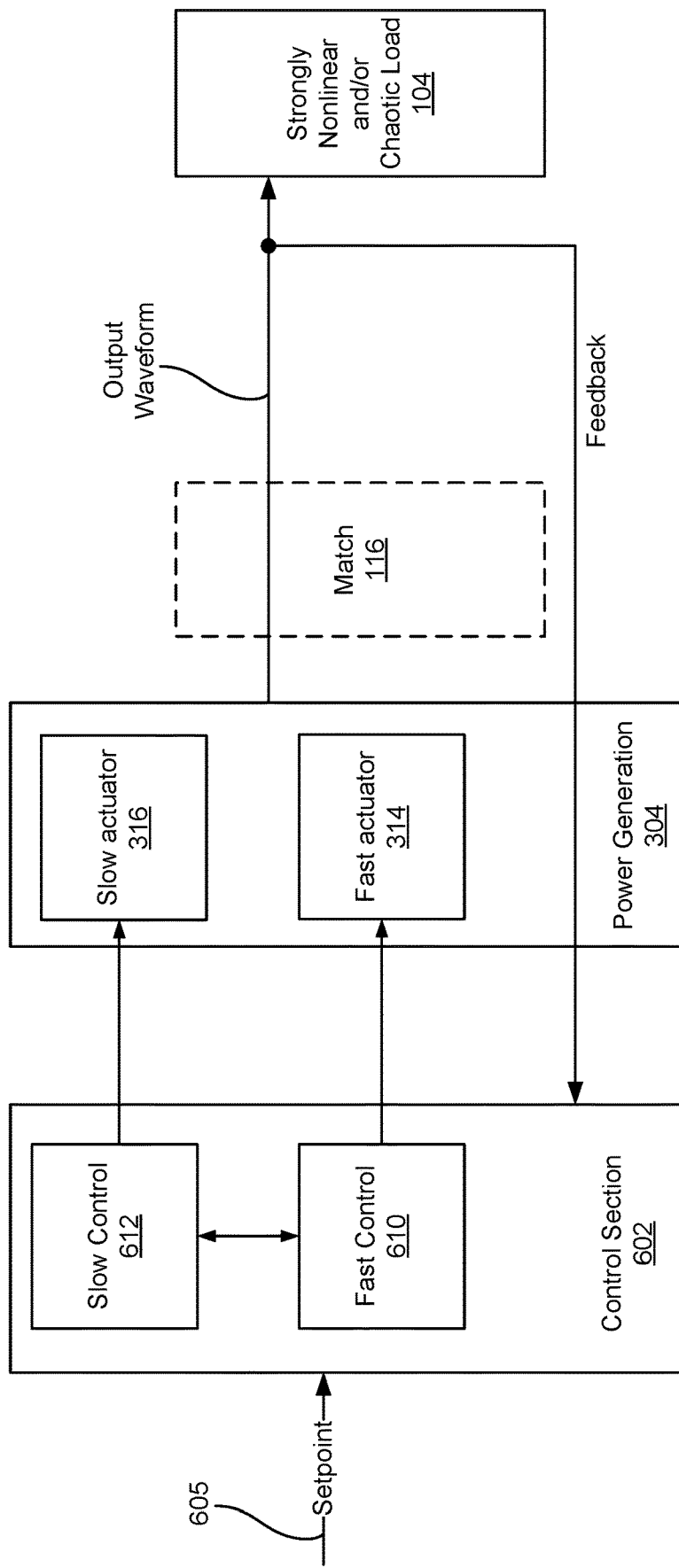
FIG. 6 is a block diagram depicting an example RF generator.

Referring to FIG. 6, shown is a block diagram depicting aspects of a plasma processing system. As shown, a setpoint 605 (also referred to as a reference signal 605) is provided to the control section 602, and the setpoint 605 may define a target value or target values for any controlled parameter. Although a single setpoint 605 is shown in FIG. 6, it should be recognized that there may be multiple setpoints (e.g., defining a multi-level or arbitrary waveform) received at the control section 602. In the context of FIG. 6, the setpoint 605 defines a target output waveform that is desired at the output of the match network 116. As discussed further herein, the setpoint 605 may be a streaming setpoint. The control section 602 may be implemented, for instance, in an FPGA and/or other processing components (e.g., a processor in connection with processor-executable instructions). The target waveform defined by the setpoint 605 can be any arbitrary waveform and is not limited to pulsed waveforms such as that seen in FIG. 2. The power generation system 304 attempts to provide an output waveform (e.g., forward power) to the nonlinear and/or chaotic load 104 (e.g., a plasma load) that tracks the target waveform. The control section 602 uses feedback from an output waveform of the power generation system 304 to control the power generation system 304 to track the target waveform.

A component providing a rail voltage is an example of a slow actuator 316 because rails typically do not change value quickly relative to the fast actuator 314. On the other hand, the fast actuator 314 may use a switching topology or other means, for example, to carry out rapid changes in current and/or voltage. Half-bridge or full-bridge switching amplifiers are two examples of the fast actuator 314. The fast actuator 314 and the slow actuator 316 work together to generate the output waveform based on control signals from the control section 602. The control section 602 may include a separate control for each of the fast actuator 314 and the slow actuator 316. For instance, a fast control 610 may control the fast actuator 314, and the slow control 612 may control the slow actuator 316. The fast control 610 and the slow control 612 may work together to control aspects of the power generation system 304. For instance, the fast control 610 may instruct the slow control 612 to instruct the slow actuator 316 to provide greater power to the fast actuator 314 when the fast control 610 recognizes that the fast actuator 314 cannot provide sufficient power to track the target waveform at a given power level provided by the slow actuator 316. But it should be appreciated that although the slow actuator 316 can provide power to the fast actuator 314, in other embodiments, the fast actuator 314 may provide power to the slow actuator 316.

Figure 7:
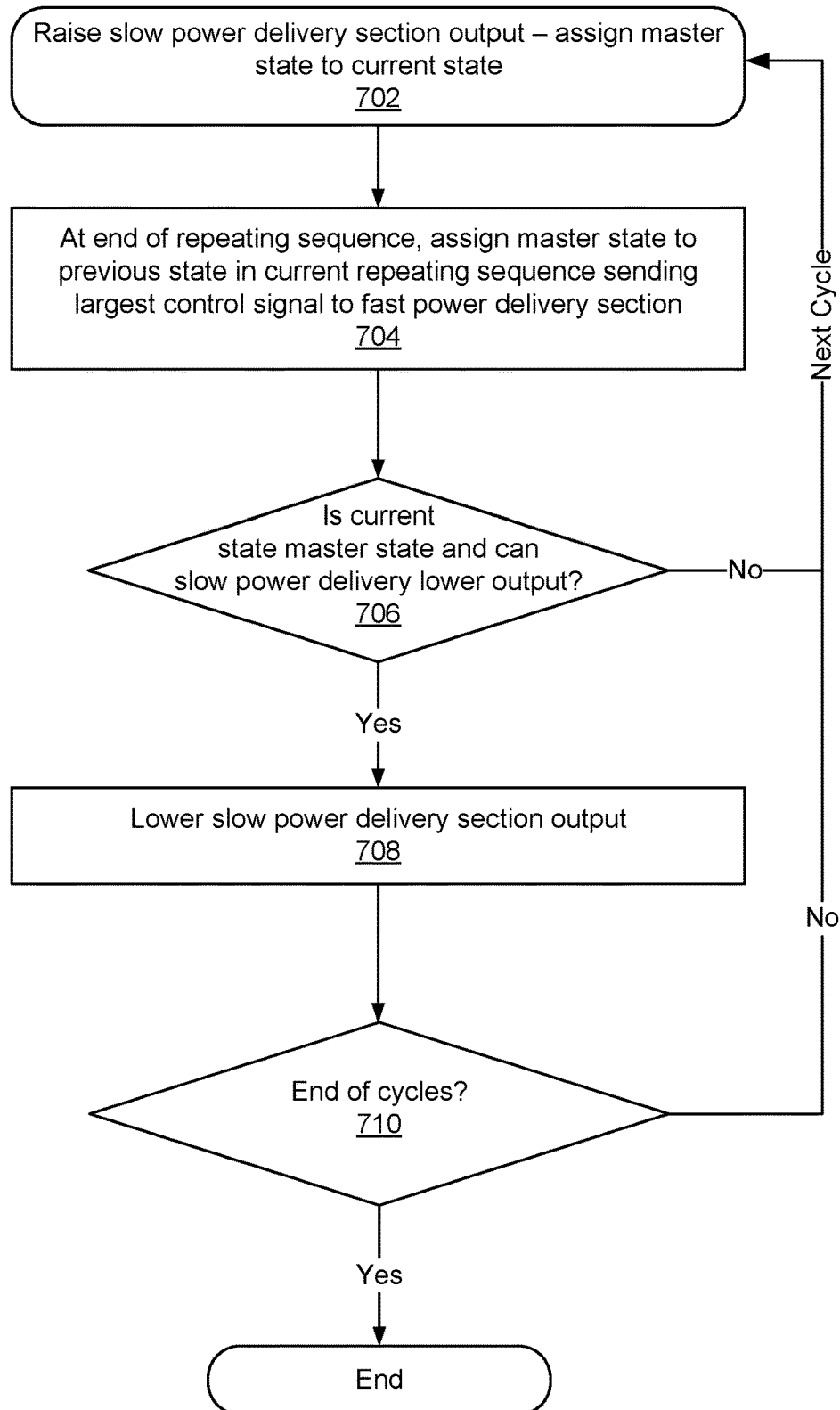
FIG. 7 illustrates a method of selecting a master state capable of lowering the slow control in the power generation system of FIG. 6.

Referring next to FIG. 7, a method is described that can be implemented in the slow control 612 that selects a master state, which is the only state that can lower the slow actuator 316 output. Both the fast control 610 and slow control 612 have a bias range of 0-100%. Assuming that the slow actuator 316 provides power to the fast actuator 314, the slow control 612 can assign a master state any time that the fast control 610 instructs the slow control 612 to raise a power level of the slow actuator 316 (Block 702). The slow control 612 can also assign a master state at an end of any repeating sequence of power outputs (e.g., a pulse cycle) to a previous state calling for a highest fast power delivery section output for the current repeating sequence of power outputs (Block 704). In some cases, the master state selected at Block 704 will not differ from that selected at Block 702. As power delivery progresses, if a state assigned the master state returns, then the slow control 612 looks at whether the slow actuator 316 can lower its output while still allowing the power generation system 304 to track to the target waveform for that state (Decision 706). If so, then the slow control 612 instructs the slow actuator 316 to lower its output (Block 708). These two master state selections at Block 702 and Block 704 can then repeat until all repeating sequences of power outputs have completed (Decision 710).

Figure 8:
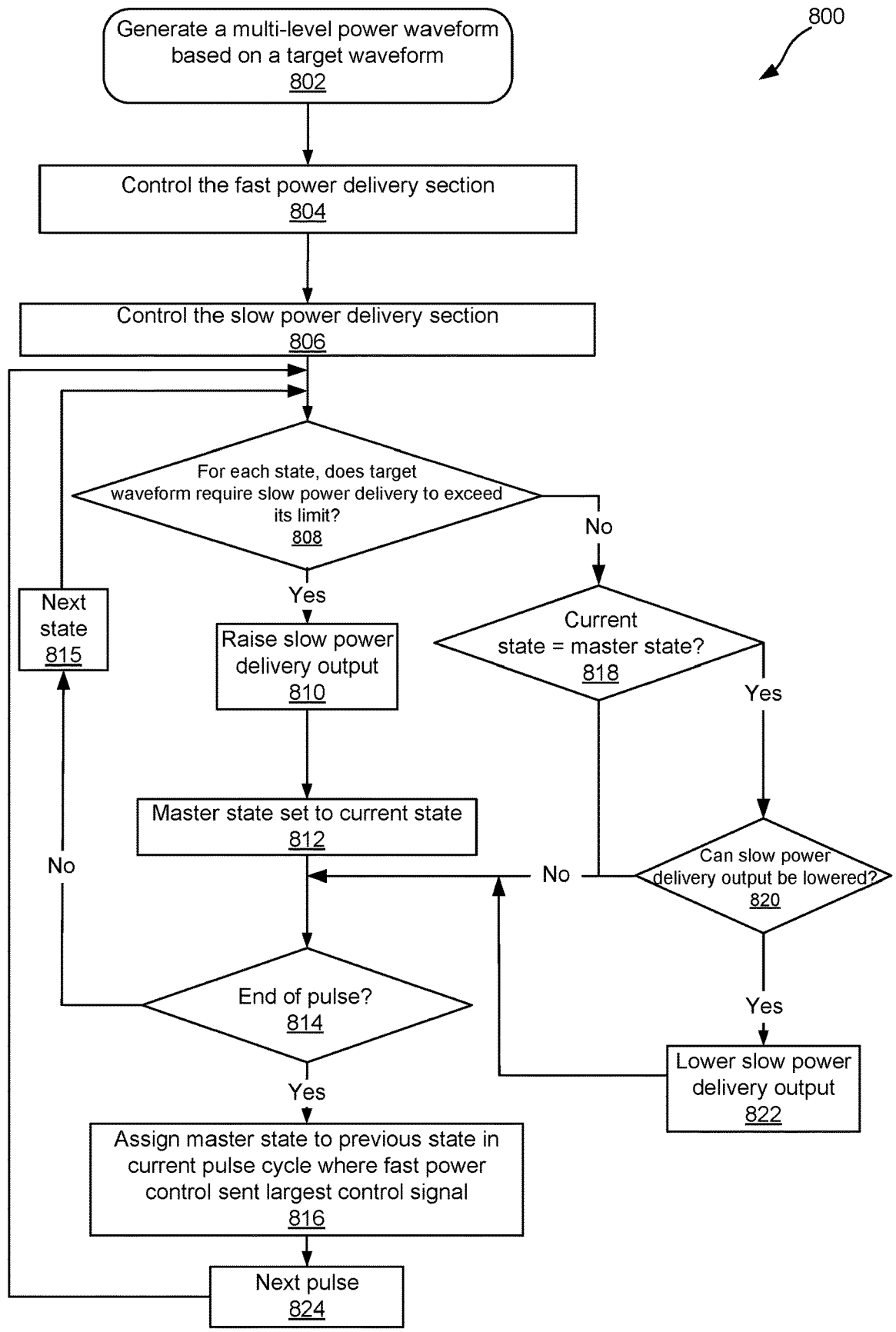
FIG. 8 illustrates another method of selecting a master state capable of lowering the slow control in the power generation system of FIG. 6.

In an alternative, FIG. 8 shows another method to control the fast actuator 314 and slow actuator 316. The method 800 focuses on decisions within a single pulse, but in view of this disclosure one of skill in the art can, without undue experimentation, extend this method 800 to multiple pulse cycles. The method 800 starts by generating a multi-level power waveform based on a target waveform using the fast actuator 314 and deriving power from the fast actuator 314 (Block 802). An RF power amplifier and DC rail are respective non-limiting examples of the fast actuator 314 and slow actuator 316 discussed in the method 800. The generated waveform may have multiple pulse cycles where each pulse cycle has multiple repeating pulses, and each pulse may have three or more states where each state has a different power level. The method 800 further includes controlling the fast actuator 314 with a control or drive or bias range (Block 804). An upper limit of this range is illustrated further herein for instance, as the dashed horizontal line in FIGS. 13C, 14C, 15C, 116C, 17C, 18C, and 19C, all around 5V. In addition to controlling the fast actuator 314, the method 800 also controls the slow actuator 316 (Block 806). Given these control parameters and the target waveform, the slow control 612 raises the slow actuator 316 (Block 810) if the target waveform requests that the fast actuator 314 exceed its output range (i.e., exceed the range of the fast control 610) (Decision 808=Yes). If such a condition exists (e.g., a state raises the rail voltage), then the method 800 makes that state (that raised the slow actuator 316 output) the master state (Block 812). The method 800 then determines whether the current pulse is at an end (Decision 814). If the target waveform could be met within the range of the fast actuator 314 (i.e., within the range of the fast control 610) (Decision 808=No), then no changes to the slow actuator 316 or master state occur. However, for each state, the method 800 checks to see if a current state is the master state (Decision 818), and if so, allows the current state to lower the slow actuator 316 output if possible (Decision 820). If both conditions are not met (Decision 820=No), then the method 800 determines if the current pulse has ended (Decision 814). If both conditions are met (Decision 820=Yes), then the slow control 612 instructs the slow power delivery section 316 to lower its output (Block 822) and then the method 800 determines if the current pulse has ended (Decision 814).

Whichever path brings the method 800 to the determination of pulse ending (Decision 814), if the pulse has not ended, then the method 800 moves to a next state (Block 815). If the pulse has ended, then the method 800 assigns the master state to a previous state in a current one of the multiple pulse cycles having the greatest fast power delivery section control signal (Block 816) and proceeds to the next pulse (Decision 824).

Figure 9:
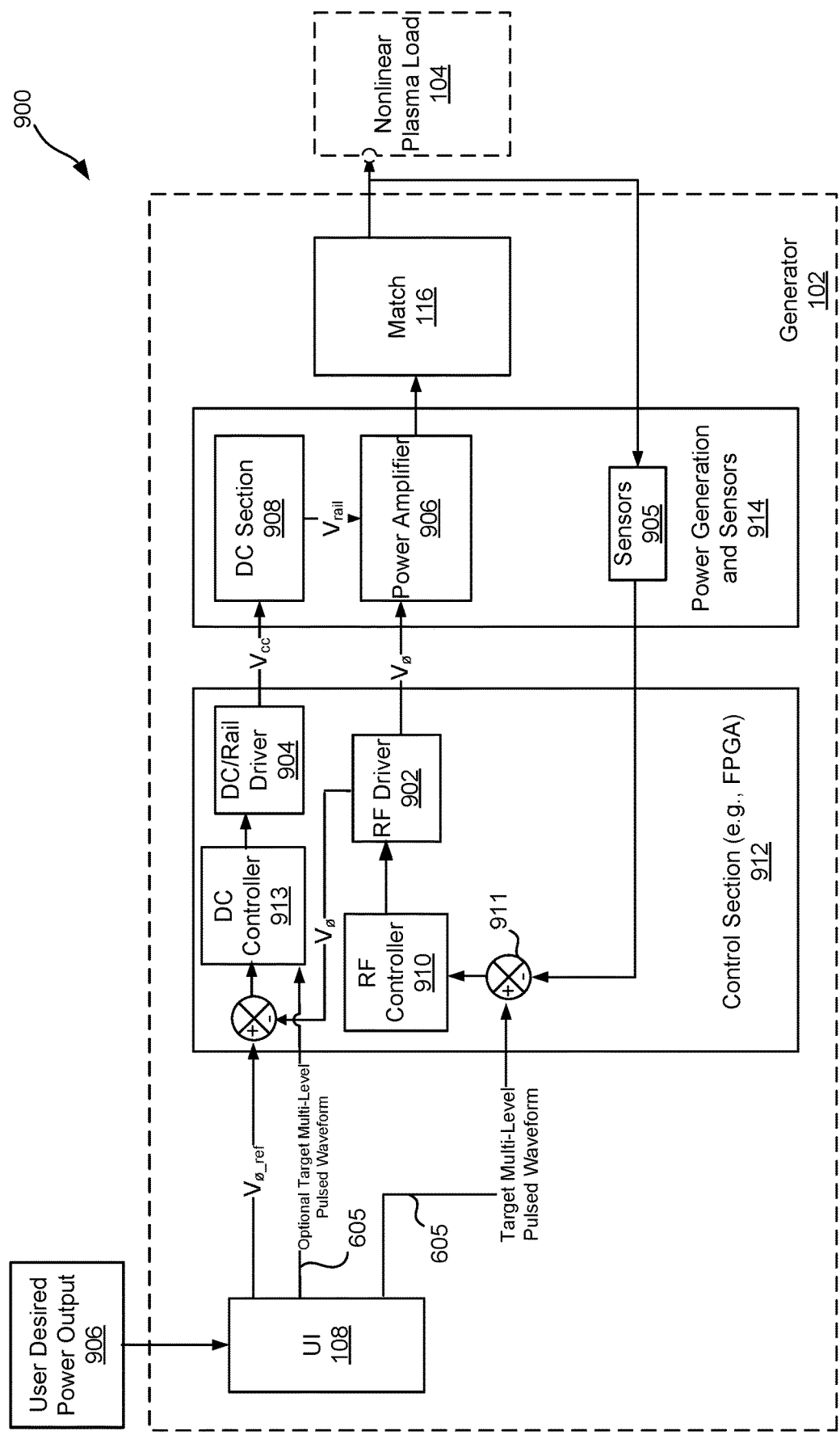
FIG. 9 is a block diagram depicting an example of the RF generator depicted in FIG. 6.

Referring next to FIG. 9, shown is a block diagram depicting an example plasma processing system 900 where a power generation and sensors 914 of a generator 102 comprises a DC section 908 which is an example of a slow actuator 316 and a power amplifier 906, which is an example of the fast actuator 314. The UI 108 provides a phase/drive threshold or reference voltage, $V_{\varnothing\_ref}$, selected by the user as well as a target multi-level pulsed waveform (e.g., such as that seen in FIG. 2) to the DC controller 913. The setpoint 605 depicted I FIG. 9 may define a "target waveform," which will be used interchangeably with "target multi-level pulsed waveform." The control section 912 includes an RF controller 910 and a DC controller 913 and an RF driver 902 and a DC/rail driver 904. As shown, the RF controller 910 may receive feedback from sensors 905 in the power generation and sensors 914 taking measurements from the match network output (or the chamber or nonlinear plasma load 104 or chamber input). The sensors 905 may include, for example, a directional coupler, which (as those of ordinary skill in the art will appreciate) may provide an output indicative of forward power that is applied at an output of the match network 116. It should be recognized that the power generation and sensors 914 is not intended to depict a housing, and that some or all of the sensors 905 may or may not be collocated with the DC section 908 and power amplifier 906. Those of ordinary skill in the art will also appreciate that it is possible to monitor power applied at an input to the match network 116 by modeling the match network 116 to predict what the forward power is applied at the output of the match network 116.

The RF driver 902 provides a phase/drive control signal, $V_\emptyset$, to the power amplifier 906 of the power generation and sensors 914, while the DC/rail driver 904 provides a rail voltage control signal, $V_{CC}$, to the DC section 908. The DC section 908 provides the rail voltage to the power amplifier 906 that then uses the rail voltage to generate the target waveform for provision to the match network 116. It will be appreciated that even though the match network 116 is shown inside the RF generator 102, in other embodiments, the match network 116 can be arranged outside the generator 102—between the generator 102 and the nonlinear and/or chaotic load 104.

The control functionality of the generator 102 depicted in FIG. 9 is distributed between the RF controller 910 and the DC controller 913. In particular, the RF controller 910 determines a phase/drive signal based on an error signal produced based upon a difference (produced by a summing junction 911) between the target waveform (defined by the setpoint 605) and feedback signals (indicative of the output waveform) from the sensors 905. Where the desired power output can be achieved via adjustment of the power amplifier 906 alone (i.e., at the current rail voltage), the RF controller 910 merely instructs the RF driver 902 to provide a control signal to the power amplifier 906 corresponding to the desired power output for that state. However, where the desired power output is greater than what is possible at the current rail voltage, as determined by the phase/drive control signal reaching or exceeding the reference voltage, $V_{\emptyset\_ref}$, the DC controller 913 can instruct the DC/rail driver 904 to send a higher rail control signal, $V_{CC}$, to the DC section 908, which can then provide a higher rail voltage, $V_{rail}$, to the power amplifier 906. When this occurs, the state that called for the rail raising becomes the "master state," and is then solely able to lower the rail voltage for the remainder of the current pulse.

When the next pulse begins, the master state from the previous state can remain the master state unless there was a previous state in the pulse cycle that called for a higher drive/phase voltage. Whichever of these two situations occurs, whenever the master state comes around again in this next pulse, the controllers 910 and 912 will look at the power requirement from the target waveform, determine whether that requirement can be met without raising the rail and also determine whether the rail can be lowered while still achieving the target waveform. Where the power can be lowered for this state, the DC controller 913 instructs the DC/rail driver 904 to pass a rail control signal, $V_{cc}$ to the DC section 908 to lower the rail. At the same time, the RF controller 910 instructs the RF driver 902 to pass a phase/drive control signal, Vo, to the power amplifier 906 to adjust its output to meet the power requirement for the current state (a level that will be lower than the lowered rail). This cycle repeats with the controllers 910 and 912 in each pulse determining whether the master state can lower the rail voltage. This can continue within the current pulse cycle until the end of the pulse cycle or until another state desires to raise the rail voltage, at which point that state becomes the new master state or takes lone control of the ability to lower the rail voltage.

The RF power amplifier 906 is controlled by either a drive voltage or a phase signal, and thus we call the control signal a phase/drive control signal, Vo. In some embodiments, the drive signal can span a minimum to a maximum value and may be used as a bias signal for a single-ended amplifier such as a transistor. In some embodiments, the phase signal can span a minimum to a maximum value and may be used to control balanced amplifiers.

Figure 10:
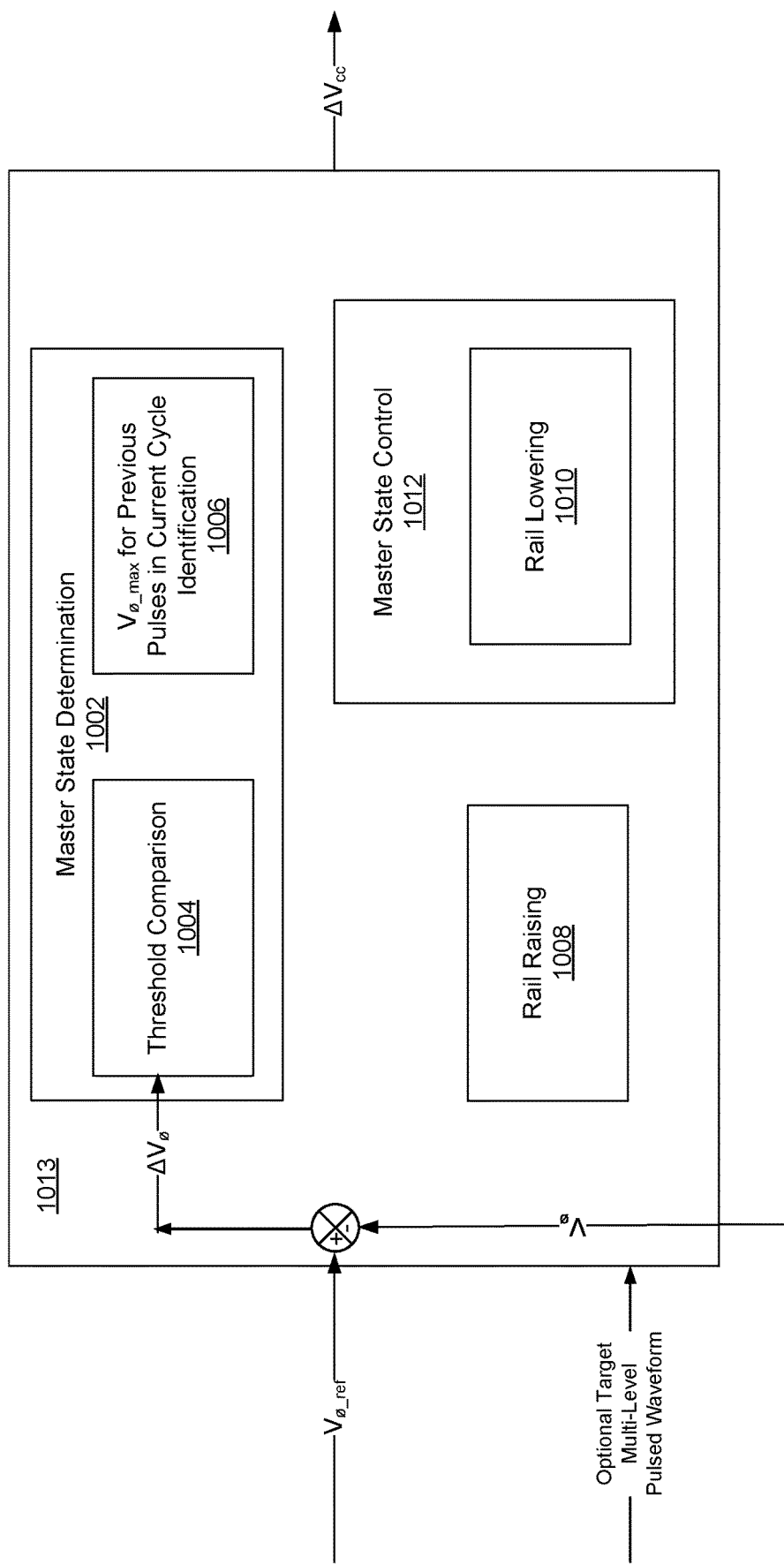
FIG. 10 illustrates details of an example of the DC controller depicted in FIG. 9.

A specific example of the DC controller 913 can be seen in FIG. 10. The DC controller 1013 can include a master state determination module 1002 comprising a threshold comparison component 1004 and a current cycle identification component 1006 to provide $V_{\emptyset\_max}$ for previous pulses. The DC controller 1013 can also include a rail raising component 1008 and a master state control 1012. The master state control 1012 can include a rail lowering component 1010. Generally, the master state determination 1002 can look at the target waveform, the drive/phase voltage threshold $V_{\emptyset\_ref}$, and a current drive/phase voltage $V_\emptyset$, and previous drive/phase voltages $V_\emptyset$ for the current pulse cycle to identify and assign the master state. This determination takes place for every state in a process, though the rules for determining the master state can depend on the state being investigated. For instance, each state has its drive/phase voltages Vo compared to the drive/phase voltage threshold $V_{\emptyset\_ref}$ by the threshold comparison component 1004, and if the drive/phase voltage $V_\emptyset$ is greater than the drive/phase voltage threshold $V_{\emptyset\_ref}$ and not in a first pulse of a new pulse cycle, then the rail raising component 1008 raises the rail (increased $V_{cc}$) and the master state determination 1002 identifies the current state as the master state. At the same time, at an end of each pulse, the $V_{\emptyset\_max}$ for previous pulses in current cycle identification component 1006 looks back on all states in the current pulse cycle and identifies the state that had the highest drive/phase voltage $V_\emptyset$ and assigns the master state to the current state. Furthermore, DC controller 1013, through the master state control 1012 and its rail lowering component 1010, can check each state to see if the current state is the master state (from a previous assignment by the master state determination module 1002), and if so, and if the drive/phase voltages Vo is less than the drive/phase voltage threshold $V_{\emptyset\_ref}$, then instruct the DC section 908 to lower its output if possible (decreased $V_{cc}$). In some cases, the rail voltage may be at a lowest value, and thus further lowering may not be possible (e.g., see Cycle 8 in FIG. 19B where rail lowering would occur based on the drive/phase voltage demanded, yet it does not because the rail is at a minimum value).

The rail lowering component 1010 can determine whether to lower the output of the DC section 908 based on whether the target waveform can be met with a lower DC section output and while keeping the drive/phase voltage of the RF power amplifier 906 below the drive/phase voltage threshold. In other words, typically when the rail voltage is lowered, the drive/phase voltage is increased, such that the combined change still meets the target waveform of the setpoint 605. If the rail is lowered too far, then the drive/phase voltage will be raised above the drive/phase voltage threshold, and such a decision typically won't be allowed. Instead, the rail voltage will is lowered so far as possible while keeping the drive/phase voltage below the drive/phase voltage threshold. In some cases, the control algorithm attempts to push the drive/phase voltage to just under the threshold and thereby maximize the rail lowering for a given state. On the other hand, some control algorithms may prefer to keep the drive/phase voltage somewhat further below the threshold and not decrease the rail as much for a given state—a controller that could lead to greater stability, but slower responses. The design of this aspect of the controller does not change how the disclosure is implemented and should be left to the designer to select a preferred tradeoff.

Figure 11:
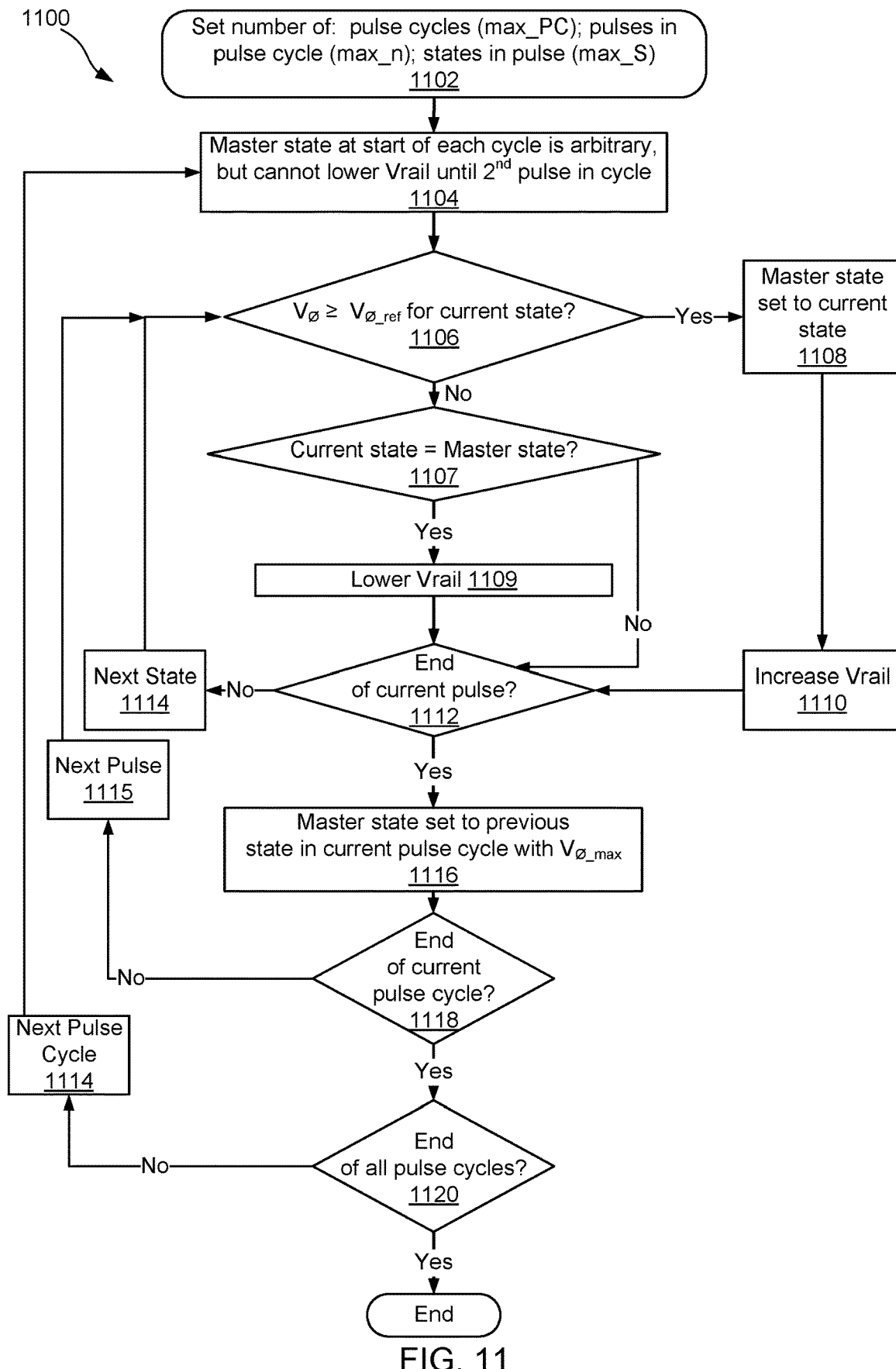
FIG. 11 illustrates a n-level control algorithm for an RF generator having a DC section providing a rail voltage to an RF amplifier for providing a pulsed-waveform to a plasma load or other nonlinear load.
Figure 12:
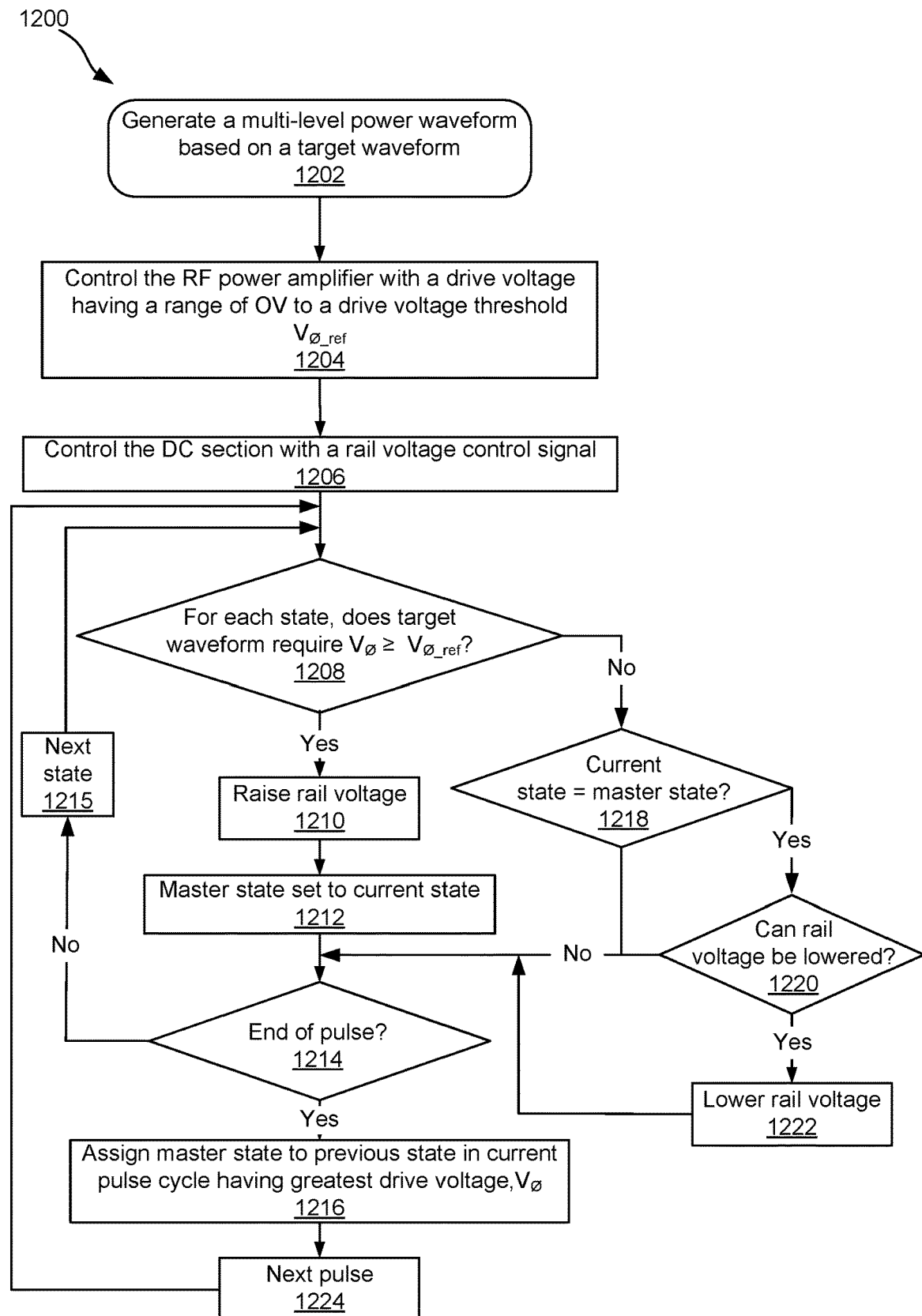
FIG. 12 illustrates another n-level control algorithm for an RF generator having a DC section providing a rail voltage to an RF amplifier for providing a pulse-waveform to a plasma load or other nonlinear load.
Figure 13A:
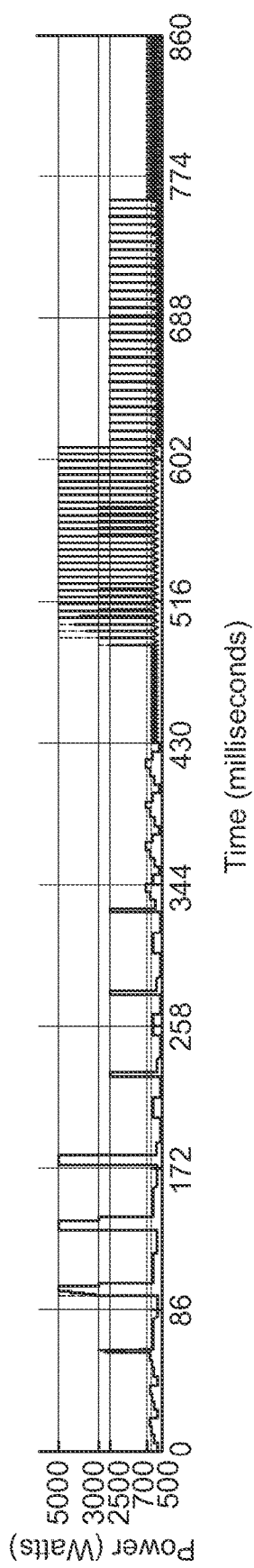
FIG. 13A illustrates a simulated waveform for target and output power corresponding to the systems shown in FIGS. 1 and 9.
Figure 13B:
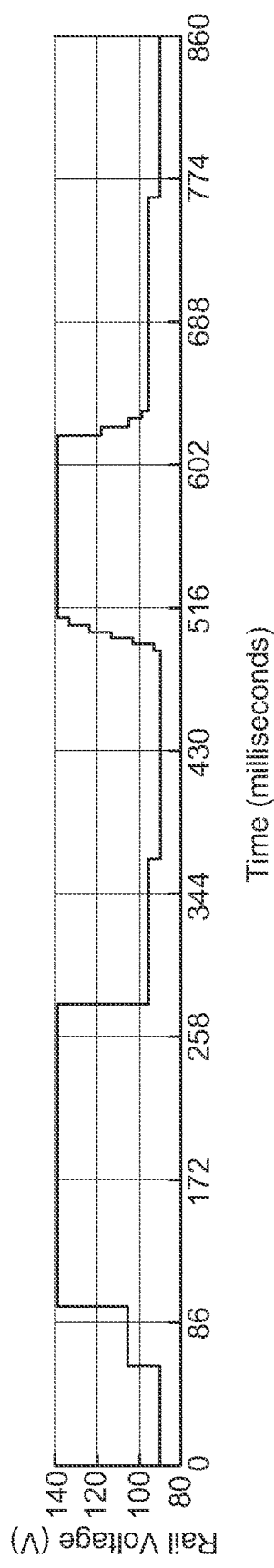
FIG. 13B illustrates a simulated waveform for rail voltage corresponding to the systems shown in FIGS. 1 and 9.
Figure 13C:
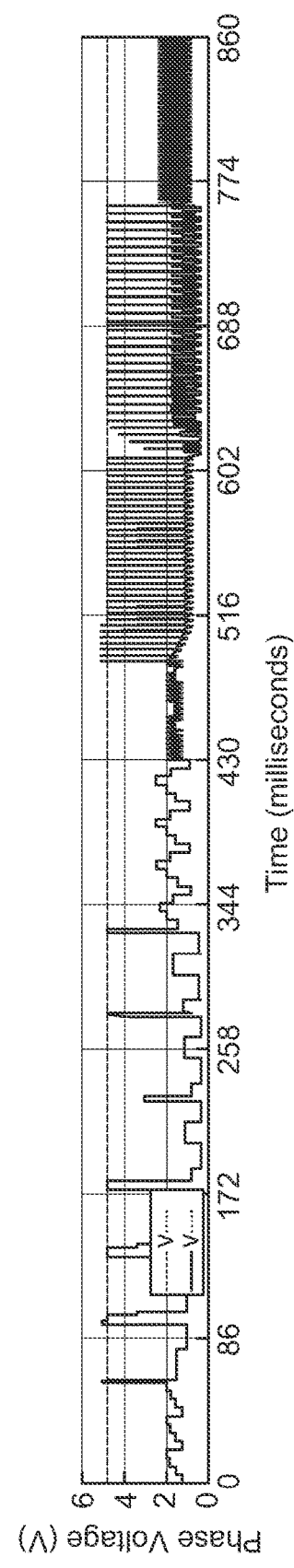
FIG. 13C illustrates a simulated waveform for phase/drive voltage and the drive voltage threshold corresponding to the systems shown in FIGS. 1 and 9.
Figure 14A:
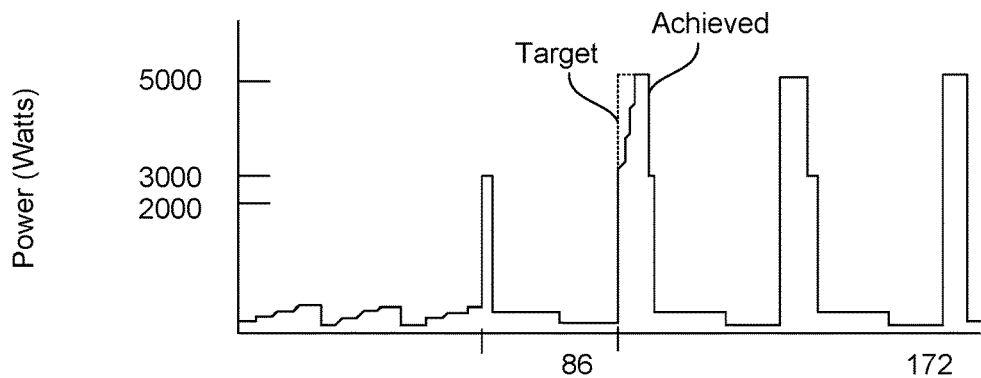
FIG. 14A illustrates details of the first and second cycles of the waveform shown in FIG. 13A.
Figure 14B:
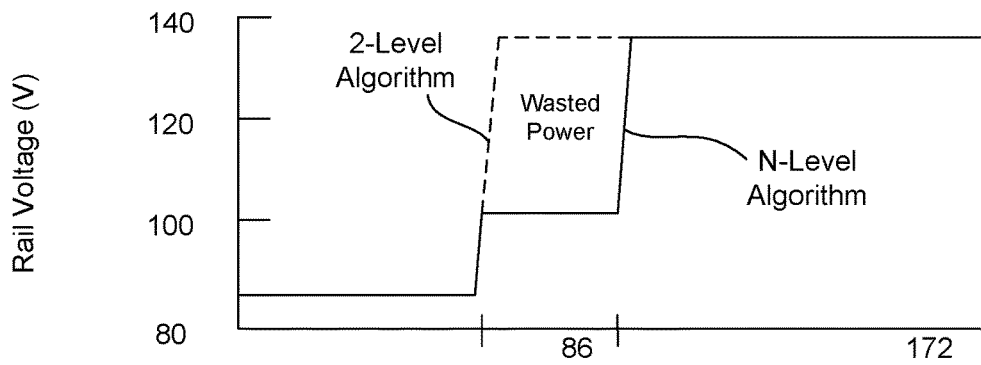
FIG. 14B illustrates details of the first and second cycles of the waveform shown in FIG. 13B.
Figure 14C:
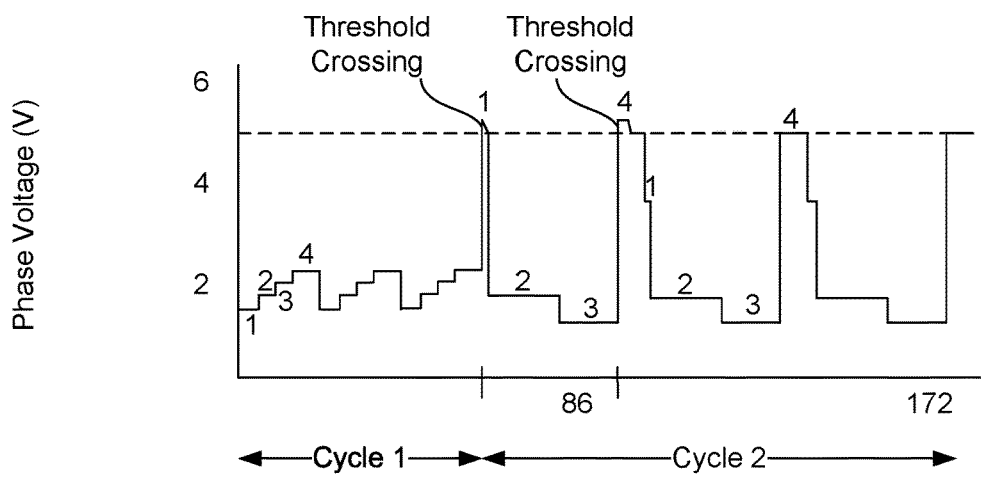
FIG. 14C illustrates details of the first and second cycles of the waveform shown in FIG. 13C.
Figure 15A:
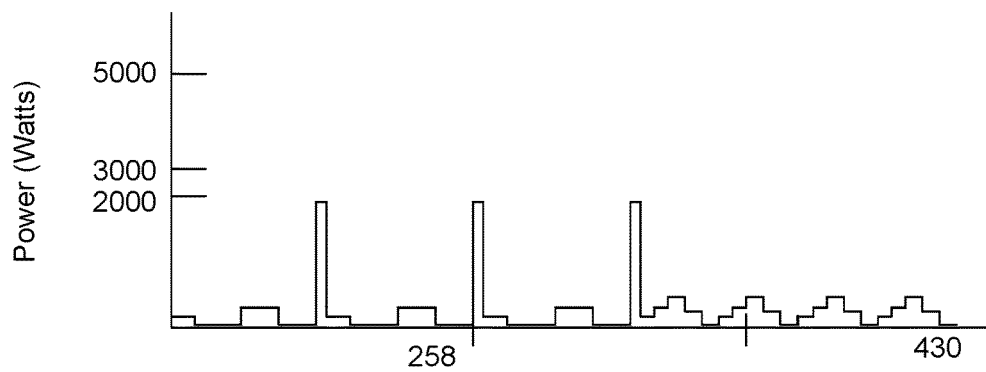
FIG. 15A illustrates details of the third and fourth cycles of the waveform shown in FIG. 13A.
Figure 15B:
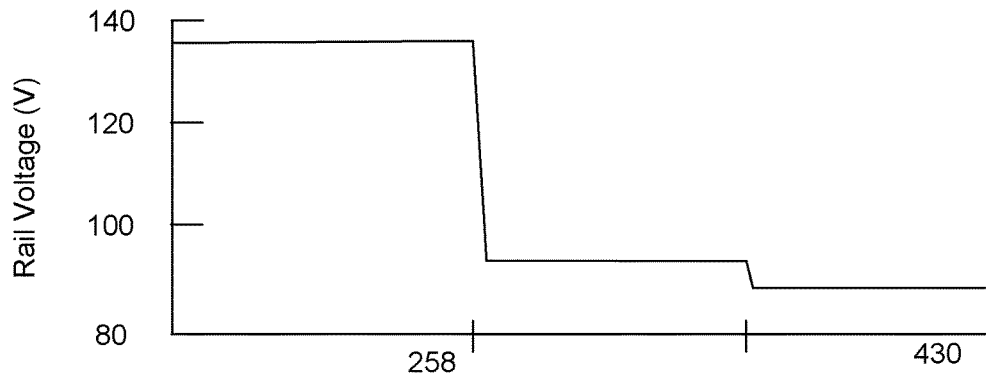
FIG. 15B illustrates details of the third and fourth cycles of the waveform shown in FIG. 13B.
Figure 15C:
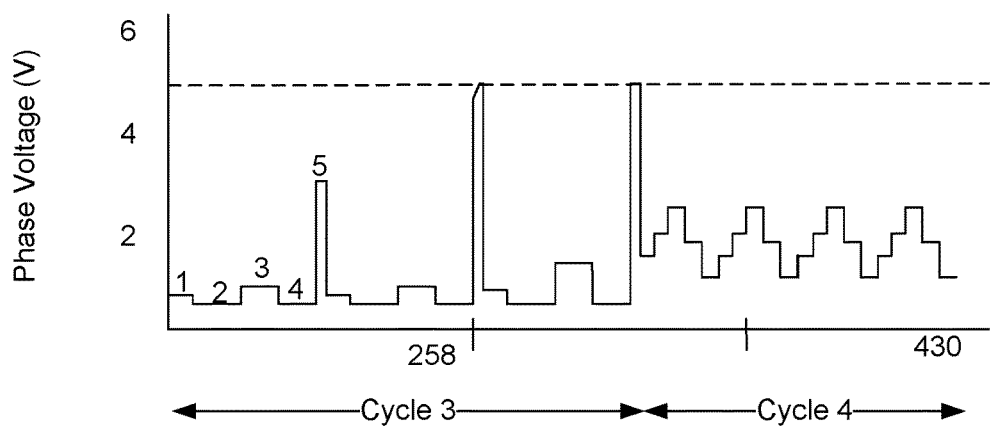
FIG. 15C illustrates details of the third and fourth cycles of the waveform shown in FIG. 13C.
Figure 16A:
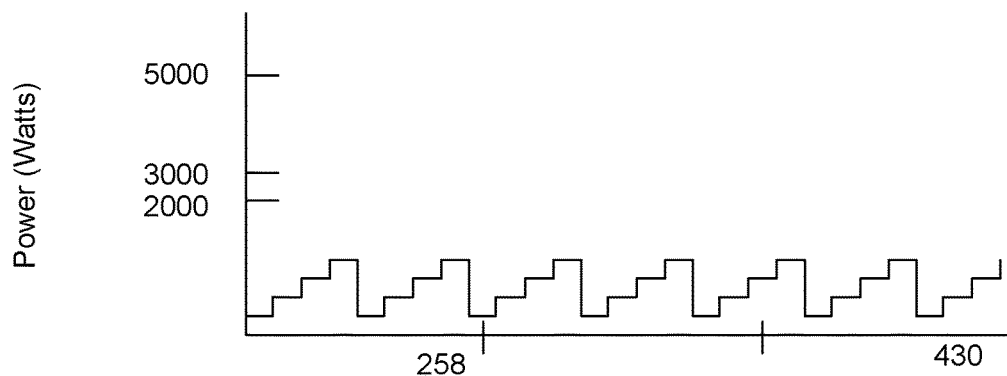
FIG. 16A illustrates details of the fifth cycle of the waveform shown in FIG. 13A.
Figure 16B:
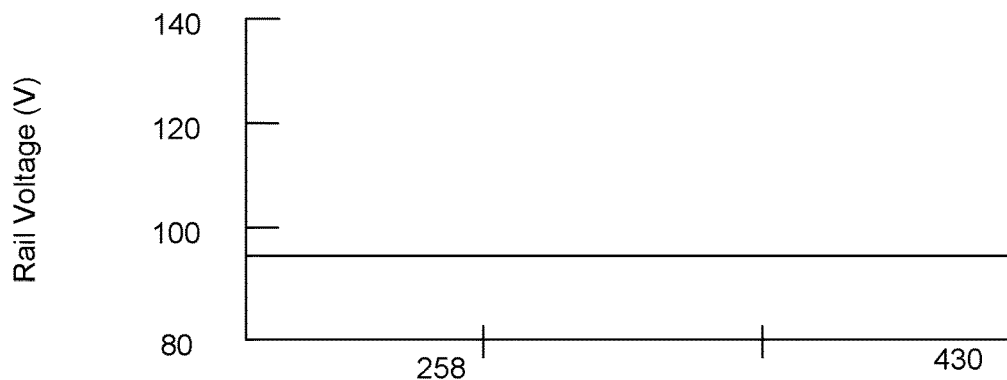
FIG. 16B illustrates details of the fifth cycle of the waveform shown in FIG. 13B.
Figure 16C:
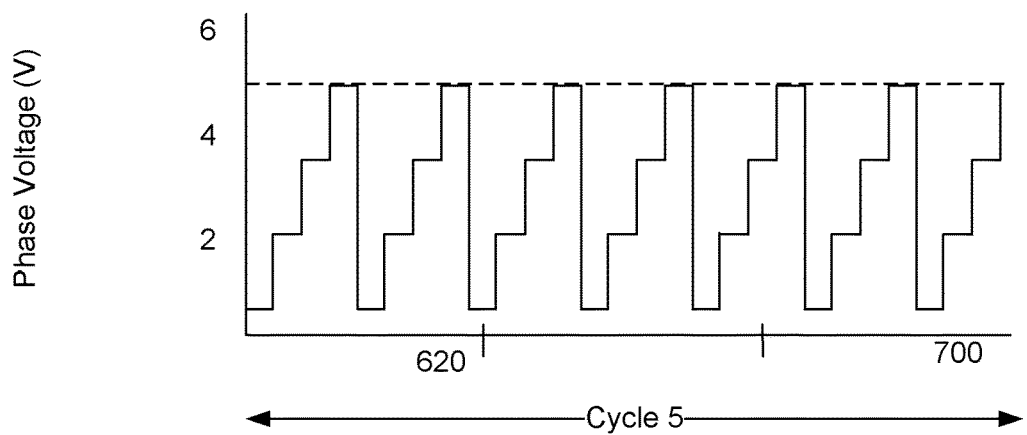
FIG. 16C illustrates details of the fifth cycle of the waveform shown in FIG. 13C.
Figure 17A:
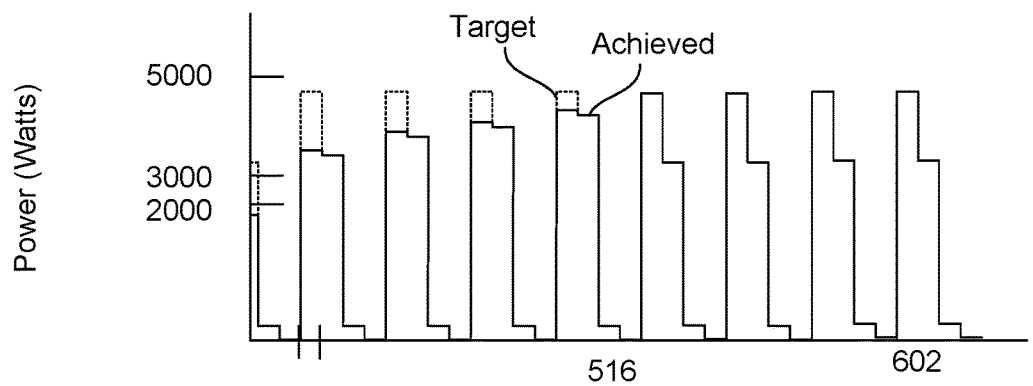
FIG. 17A illustrates details of the sixth cycle of the waveform shown in FIG. 13A.
Figure 17B:
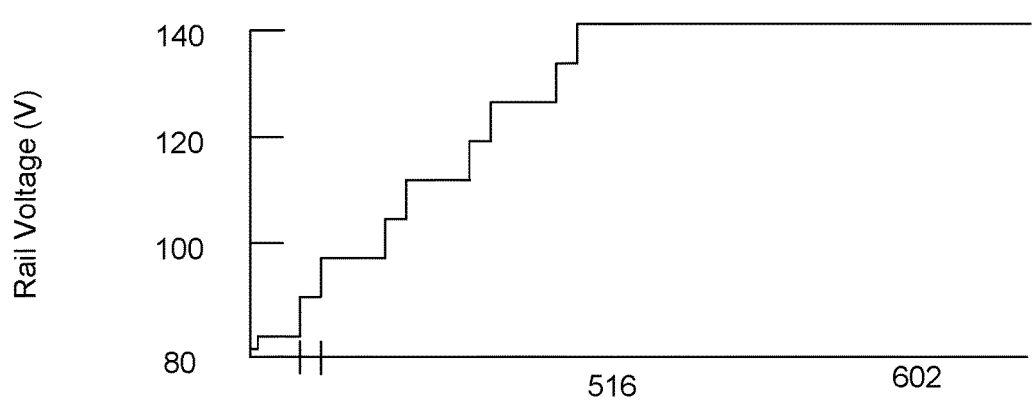
FIG. 17B illustrates details of the sixth cycle of the waveform shown in FIG. 13B.
Figure 17C:
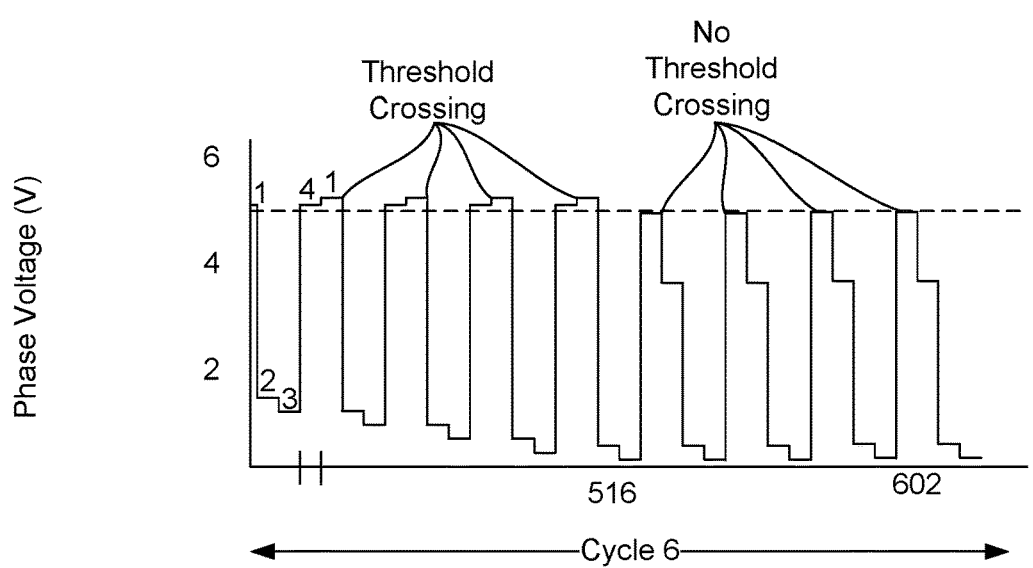
FIG. 17C illustrates details of the sixth cycle of the waveform shown in FIG. 13C.
Figure 19A:
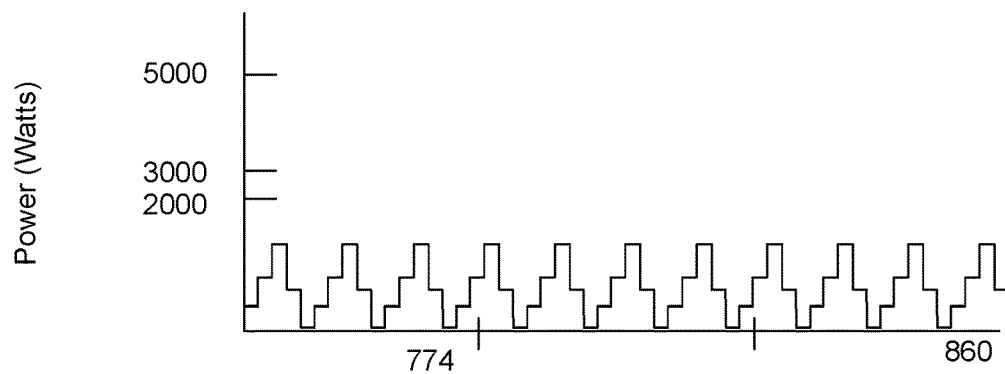
FIG. 19A illustrates details of the eighth cycle of the waveform shown in FIG. 13A.
Figure 19B:
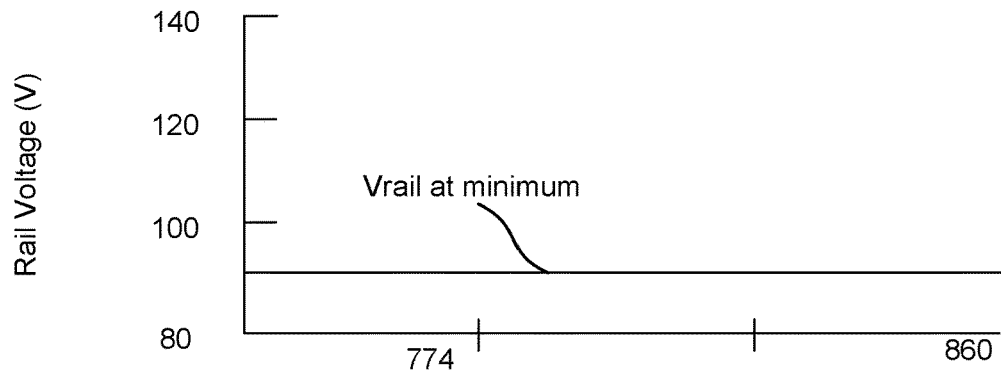
FIG. 19B illustrates details of the eighth cycle of the waveform shown in FIG. 13B.
Figure 19C:
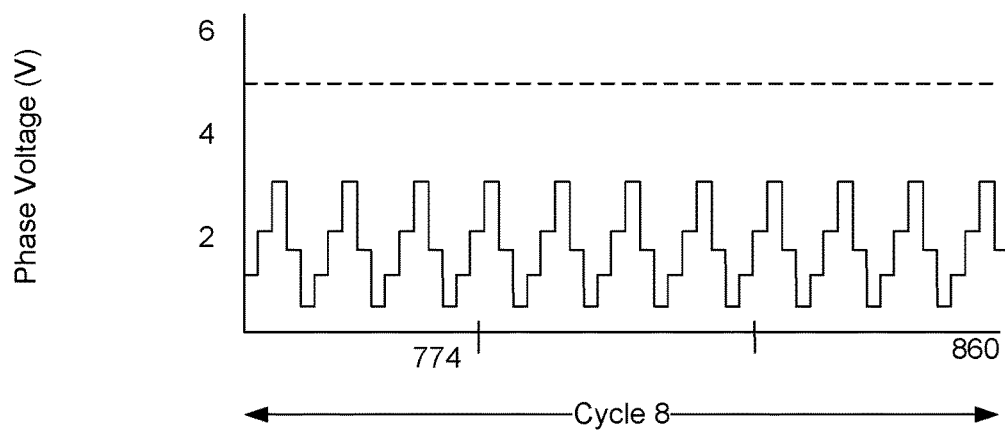
FIG. 19C illustrates details of the eighth cycle of the waveform shown in FIG. 13C.

The operation of the controllers 910 and 912 can be further illustrated via reference to the method 1100 shown in FIG. 11 and the plots in FIGS. 13-1913. FIGS. 7A, 7B, and 7C show exemplary timing charts for a target waveform of the generator (FIG. 13A) (e.g., output of power amplifier 906 or generator 102), rail voltage (FIG. 13B), and drive/phase voltage (FIG. 13C) over eight different pulse cycles. As show, the output power is equal to the target waveform (i.e., effective power tracking is achieved in most instances of this simulation), though FIGS. 14A, 14B, 14C and FIGS. 16A, 16B, and 16C show some instances where the target waveform is not reached immediately upon a change in the target waveform. The rail voltage (e.g., as provided by DC section 908) is slow to control and is a variable that may be controlled with greater efficiency than was possible in the prior art (e.g., lowering the rail voltage more often than was possible in the art). The drive or phase voltage that is output by the power amplifier 906 is the controllable aspect of the RF power amplifier 906. The eight illustrated pulses cycles in FIGS. 7A to 19C are derived from a simulation, and walk-through waveforms that show various features of the method 1100 not known in the art. FIGS. 7A-19C provide more detailed views of certain pulse cycles from FIGS. 13A-13C. Each pulse cycle has a different number of pulses, and each pulse has a different number of states. For instance, in FIGS. 8A, 8B, and 8C one can see the first and second pulse cycles, each with three pulses and each pulse having four states. In FIGS. 15A, 15B, and 15C one can see third and fourth pulse cycles, the third pulse cycle having three pulses and five states for each pulse, and the fourth pulse cycle having four pulses and five states per pulse cycle. In these simulated pulse cycles, the RF power amplifier 906 is seen to take rail voltage from the DC section 908 and then uses the drive or phase voltage to determine an ultimate output power based on the available rail voltage. A threshold can be seen as a dotted line around 5 V in the bottom plots, and whenever the drive/phase voltage reaches or exceeds this threshold, the rail voltage is raised to provide more power to the RF power amplifier 906. In some cases, the rail will not rise fast enough to meet an increased power requirement of the target waveform, and multiple threshold crossings in a short time may occur as the rail is raised in a stepwise fashion, such as illustrated in FIGS. 17A, 17B, and 17C (where the target waveform is not achieved until the fifth pulse in the pulse cycle). The third and fourth cycles in FIGS. 15A, 15B, and 15C show instances where the power requirement of the target waveform is low enough that the rail voltage can be lowered, reducing power consumption and heating as compared to prior art methods. FIGS. 14A, 14B, and 14C also shows a comparison between traditional methods for raising the rail voltage and that of the current disclosure. One can see that the first threshold crossing leads to a rail voltage increase, which would have pulled to the rail's maximum in traditional methods, but in this disclosure, the rail is pulled to around 100V, and then raised again at the next threshold crossing to the rail max near 140V. As a result, this more granular tracking of target waveform leads to a large decrease in wasted power as seen in the area between the dashed line (resulting from a traditional "2-Level Algorithm") and the solid line (resulting from the herein-disclosed N-Level Algorithm).

The user can initiate the process by setting a number of pulse cycles (max_PC), setting a number of pulses in each pulse cycle (max_n), and setting a number of states in each pulse (max_S) (Block 1102). As power delivery begins (i.e., the first pulse cycle), and at the start of each subsequent pulse cycle, the master state initiation can be arbitrary (i.e., any of the states in the first pulse of a pulse cycle can be the master state (or none)) since the method 1100 avoids relying on memory of state or drive/phase voltage between cycles (Block 1104). In other words, each pulse cycle selects a first master state afresh, without knowledge of or reliance on any master state from the previous pulse cycle, and thus the initial master state can be arbitrarily selected by the designer. Along these same lines, when a first master state is determined in a pulse cycle, that master state cannot lower the rail until at least the second pulse in the current pulse cycle. In other words, even if a state raises the rail and becomes the master state in the first pulse of a new pulse cycle, it will be unable to lower the rail voltage until the second pulse in the pulse cycle. This feature is illustrated in FIG. 9. An exception to this rule is when a state raises the rail voltage and then seeks to lower the voltage rail, both within the same state. In this case of a rapid rise and fall of the rail voltage, the first state will be able to perform this rail lowering. This is an exception to Block 1104, but the exception is not explicitly illustrated.

Then, for the current state, the DC controller 913 determines whether the voltage rail needs to be raised, for instance by determining if the drive/phase voltage, $V_\emptyset$, requested is equal to or greater than the threshold phase voltage, $V_{\emptyset\_ref}$ (Decision 1106). This effectively determines whether the rail is to be raised. If the appropriate drive/phase voltage, $V_\emptyset$, is greater than the threshold phase voltage, $V_{\emptyset\_ref}$ (Decision 1106=Yes), then the master state is set to the current state (Block 1108) and the rail controller increases the rail voltage (Block 1110).

For example, in FIGS. 14A, 14B, and 14C, for the first state of the first pulse of the first pulse cycle, the power requirement of the target waveform is fairly low, around 85V, and thus a relatively low drive/phase voltage is able to achieve this target waveform even with the rail voltage starting fairly low (~85V). So, decision 1106 for the first state of the process would=No. Where decision 1106=No, the rail controller can then determine if the current state became the master state via a previous decision. For instance, a previous threshold crossing (Decision 1106) or a previous end-of-pulse identification (Block 1116) could set the master state for the current pulse even if the current pulse doesn't see a threshold crossing. More specifically, state 5 in the first pulse of pulse cycle 3 becomes the master state by virtue of having the largest drive/phase voltage, $V_\emptyset$, in pulse cycle 3, and is thus the master state when state 5 in the second pulse comes around (despite no threshold crossing). In other words, state 5 in the second pulse became the master state due to a previous decision. When this type of master state selection occurs, Decision 1107=yes, and the rail controller can lower the voltage rail to conserve power (Block 1109). For instance, and again looking at the second pulse of the third pulse cycle in FIGS. 15A, 15B, and 15C, there is a rail reduction controlled by state 5 as the master state. More specifically, and as will be understood via later steps in the method 1100, state 5 becomes the master state in the first pulse of the third pulse cycle. When state 5 comes around again in the second pulse, the power requirement is low enough that even at a maximum value of the drive/phase voltage, $V_\emptyset$, that power requirement can be met with a lower rail voltage, so the DC controller 913 is able to lower the rail voltage at state 5. This same rail voltage is sufficient for the next instance of state 5 in the third pulse of the third cycle, so the rail controller (or state 5 as the master state), does not lower the rail, so the rail voltage stays flat through to the fourth cycle. As another example of rail voltage lowering, pulse cycle 7 sees the fifth state become the master state at the end of the first pulse by virtue of having, $V_{\emptyset\_max}$, to that point in pulse cycle 7. However, becoming the master state (at Block 1116) means that lowering the rail voltage is not possible until that state returns in the next pulse, and hence the rail voltage around time 200 remains constant despite state 5 becoming the master state. It is not until state 5 returns in the second pulse that the rail controller determines that the current state is the master state (Decision 1107=Yes) and lowers the rail voltage (Block 1109) to around 120V. At the same time, since the rail voltage is being reduced, the RF controller 910 also determines (based upon the error between the target waveform and the actual waveform), that greater drive/phase voltage will allow the target waveform to be achieved and therefore raises the phase/drive voltage output by the power amplifier 906 as seen in the second pulse. This cycle of lowering the rail voltage and increasing the phase/drive voltage continues until the RF controller 910 determines that the rail voltage cannot be lowered further. In the simulation this occurs at the sixth pulse and where state 5 is just below the threshold. Although a particular combination of rail lowering and phase/drive voltage raising is shown, various control algorithms can be used to achieve the rail lowering without affecting the method 1100, and those of skill in the art can select from these various options without departing from the spirit of this disclosure. For instance, other control algorithms might lead to faster or slower reductions in the rail voltage than seen in FIGS. 12A, 12B, and 12C.

Returning to Decision 1107, if the current state is not the master state, then the method 1100 determines if the current pulse has ended (Decision 1112). Similarly, after the rail has been lowered (Block 1109), the method 1100 determines if the current pulse has ended (Decision 1112). If not, then the method 1100 moves to the next state and decisions (at Block 1106 and possibly at Block 1107), repeat. For instance, for the first three states of each pulse in the first pulse cycle, Decision 1112=No, and the method 1100 loops back to Decision 1106 for a next state (Block 1114).

If the end of the current pulse has been reached (Decision 1112=Yes), then the RF controller 910 looks to set to the master state based on previous drive/phase voltages in the current pulse cycle (Block 1116). More specifically, the RF controller 910 looks back at the phase/drive voltages for each state in the current pulse cycle and identifies a largest value therein. For instance, at the end of the first pulse of the first pulse cycle in FIGS. 14A, 14B, and 14C, the phase/drive controller would determine that state 4 had the highest drive/phase voltage level for the pulse cycle to that point and therefore set the master state to state 4 (if it was not already the master state) (Block 1116). This same analysis at the end of the second pulse would again determine that state 4 had the highest drive/phase voltage level and thus leave state 4 as the master state. In the second cycle the first state would become the master state by virtue of crossing the threshold (Decision 1106=Yes), and then state 4 would become the master when it crosses the threshold (Decision 1106=Yes), and at the end of the second pulse the phase/drive controller would look back at all states in the second pulse cycle and determine that state 4 had called for the highest drive/phase voltage level and thus leave state 4 as the master state (Block 1116). As another example, the phase/drive controller assigns the master state to state 5 in the third cycle, and the phase/drive controller assigns the master state to state 3 in the fourth cycle via this look-back analysis. On the other hand, if state 1 had called for a higher drive/phase voltage level than state 4 during the first two pulses of the second pulse cycle, then the phase/drive controller would make state 1 the master state. As another example, in the third pulse cycle no state reaches the threshold (Decision 1106≠Yes for any state), but at the end of the first pulse, phase/drive controller would determine that state 5 had the highest drive/phase voltage level in the third pulse cycle and make state 5 the master state. From these examples it should be apparent that the phase/drive controller, via Block 1116, at the end of each pulse can select a new master state.

Either way, at the end of each pulse, the method 1100 determines if the current pulse cycle has ended (Decision 1118). If not, the method 1100 moves to the next pulse (Block 1115), and if the pulse cycle has ended, then the method 1100 assesses whether the process has ended (i.e., have all pulse cycles ended) (Decision 1120). If not, then then the method 1100 proceeds to a next pulse cycle (Block 1114) and returns to Block 1104, where the phase/drive voltage and rail voltage are held the same through to the first state of the new pulse cycle, and the master state is arbitrarily selected by the designer.

Pulse cycle 8 shows an additional feature of the method 1100 that is not explicitly shown, namely, that the rail voltage has a minimum. One can see that state 3 in pulse cycle 8 becomes the master state via Block 1116 at the end of the first pulse and remains the master state in subsequent pulses since no other state needs to raise the rail (Decision 1106) or has a higher phase/drive voltage (Block 1116). However, unlike previous examples, even though state 3 is the master state and the phase/drive voltage needed to achieve the target waveform is lower than the threshold (Decision 1106=No), the rail controller does not lower the rail voltage as should be required by Block 1109. This is because the rail voltage is at a minimum and thus can't be lowered further. In other words, Block 1109 will be skipped or not apply if the rail voltage is already at its minimum.

FIG. 12 illustrates another n-level control algorithm for the RF generator 102. The method 1200 focuses on decisions within a single pulse, but in view of this disclosure one of skill in the art can, without undue experimentation, extend this method 1200 to multiple pulse cycles. The method 1200 starts by generating a multi-level power waveform based on a target waveform using an RF power amplifier with a variable output and deriving power from a DC section 908 providing a variable rail voltage (Block 1202). A multi-level (or n-level) power waveform can be seen, for instance, in FIG. 13A. The multi-level power waveform (output or generated waveform) and the target waveform (input) typically are close in shape since the method is effective at tracking the target waveform, and therefore, for purposes of this disclosure, FIG. 13A will be used to discuss both the input and output waveforms. RF power amplifier 906, and DC section 908, are non-limiting examples of the RF power amplifier and DC section discussed in the method 1200. The generated waveform has multiple pulse cycles, each pulse cycle having multiple repeating pulses, and each pulse having three or more states, each state having a different power level. The method 1200 further includes controlling the RF power amplifier 906 with a drive voltage having a range of 0V to a drive voltage threshold, $V_{\varnothing\_ref}$ (Block 1204). This threshold is illustrated for instance, as the dashed horizontal line in FIGS. 13C, 14C, 15C, 16C, 17C, 182C, and 19C, all around 5V. For instance, the controlling at Block 1204 can be performed by RF controller 910 and RF driver 902. In addition to controlling the RF power amplifier 906, the method 1200 also controls the DC section 908 with a rail voltage control (e.g., $V_{cc}$). For instance, the controlling at Block 1206 can be performed by the DC controller 913 and the DC/Rail driver 904. Thus, the method 1200 can be distributed between the controllers 910 and 912. Given these control parameters and the target waveform, the method 1200 raises the rail voltage (Block 1210) if the target waveform specifies the drive voltage to equal or exceed the drive voltage threshold, $V_{\varnothing\_ref}$ (Decision 1208=Yes). If such a condition exists (i.e., a state raises the rail voltage), then the method 1200 makes that state that caused the rail voltage to rise, the master state (Block 1212). The method 1200 then determines whether the current pulse is at an end (Decision 1214). If the target waveform could be met with the drive voltage staying below the drive voltage threshold, $V_{\varnothing\_ref}$ (Decision 1208=No), then no changes to the rail voltage or master state occur. However, for each state, the method checks to see if a current state is the master state (Decision 1218), and if so, allows the current state to lower the rail voltage if possible (Decision 1220). In particular, lowering the rail voltage is possible if the target waveform can be achieved with the lower rail voltage and via a drive voltage below the drive voltage threshold, $V_{\varnothing\_ref}$. If both conditions are not met (Decision 1220=No), then the method determines if the current pulse has ended (Decision 1214). If both conditions are met (Decision 1220=Yes), then the method 1200 lowers the rail voltage (Block 1222) and then determines if the current pulse has ended (Decision 1214).

Whichever path brings the method 1200 to the determination of pulse ending (Decision 1214), if the pulse has not ended, then the method 1200 moves to a next state (Block 1215). If the pulse has ended, then the method 1200 assigns the master state to a previous state in a current one of the multiple pulse cycles having the greatest drive voltage, $V_{\varnothing}$, (Block 1216) and proceeds to the next pulse (Decision 1224).

Figure 20:
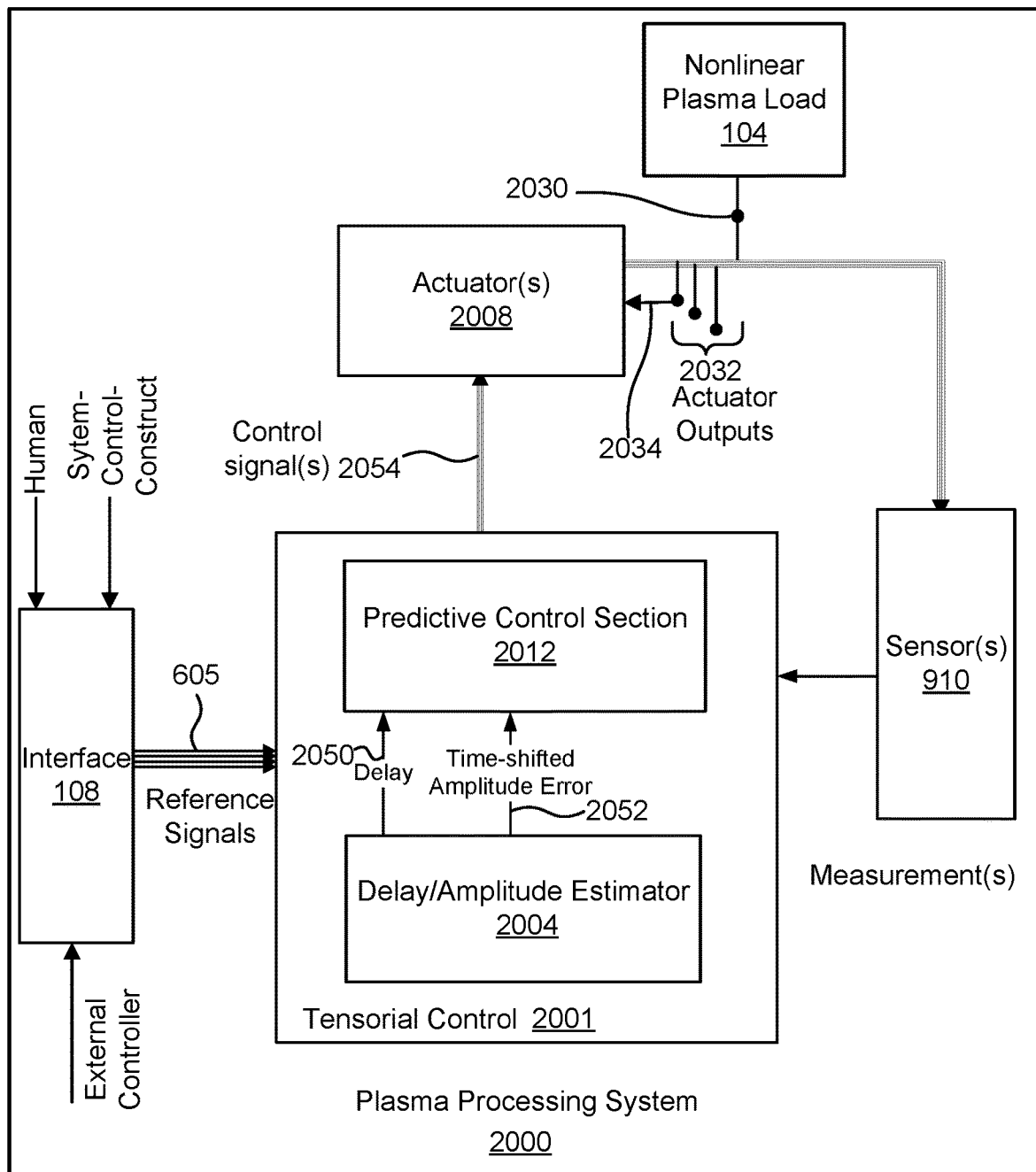
FIG. 20 is a block diagram depicting aspects of a control system and a plasma processing system.

Referring next to FIG. 20 shown is a block diagram depicting aspects of a predictive and tensorial control approach that may be utilized in connection within a plasma processing system 2000. Shown in FIG. 20 is a tensorial control block 2001, which is coupled to a user interface 108, actuators 2008, and sensors 905. Shown within the tensorial control block 2001 are a delay/amplitude estimator 2004 and a predictive control section 2012. The tensorial control block 2001 (also referred to as a detection, estimation, and prediction engine 2001) represents the collective functionality of the delay/amplitude estimator 2004 and the predictive control section 2012. As discussed further herein, the delay/amplitude estimator 2004 and the predictive control section 2012 may be further separated into functional subcomponents or consolidated, and the functionality of the delay/amplitude estimator 2004 and the predictive control section 2012 may be carried out in pipelining-type approaches or may be serially effectuated, which one of ordinary skill in the art, in view of this disclosure, will understand.

Figure 30:
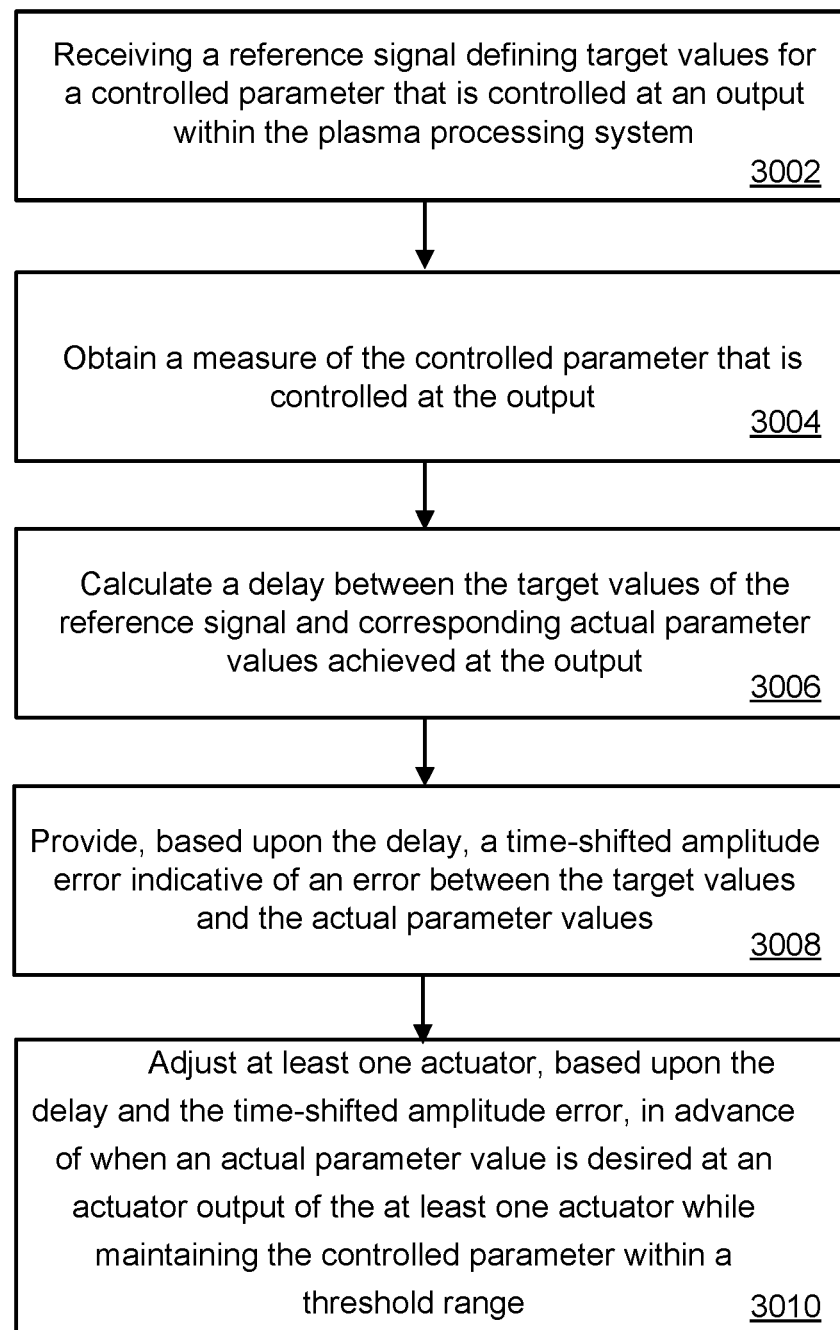
FIG. 30 is a flow chart depicting a method that may be traversed in connection with embodiments disclosed herein.

While referring to FIG. 20, simultaneous reference is made to FIG. 30, which is a flow chart depicting steps that may be traversed in connection with embodiments disclosure herein. The user interface 108 is configured to receive (Block 3002) a setpoint 605 defining target values (or setpoints) for a controlled parameter that is applied to a controlled output within the system. The target values may represent multi-level pulsed waveforms or any arbitrary waveform. As shown, the controlled outputs within the system 2000 may include a load output 2030, which is a node that is coupled to the nonlinear and/or chaotic load 104, and/or the controlled outputs may include one or more actuator outputs 2032. In other words, the tensorial control 2001 may be used to control one or more controlled parameters at the load output 2030 that may include power-related parameters including, for example and without limitation, DC power, forward power, reflected power, reflection coefficient, frequency, and current. In addition, the tensorial control 2001 may be used to control controlled parameters that are applied at the actuator outputs 2032. The controlled parameters applied to actuator outputs 2032 may include the power-related parameters listed above (in connection with the output 2130 (load output)) and control-related parameters such as a phase-control signal, frequency control signal, and voltage-control signals. In addition, one or more particular actuator outputs 2032 may feed as an input 2034 to one or more other actuators 2008.

As shown, at least one sensor 905 is configured to obtain a measure (Block 3004) of the parameters such as the power-related parameters and the control-related parameters listed above. The at least one sensor 905 may include, for example and without limitation, directional couplers, VI sensors, current transducers, and simple voltage sensors. Those of ordinary skill in the art will appreciate that the signals from the at least one sensor 905 may be sampled and converted into digital format for use by the tensorial control 2001.

A delay/amplitude estimator 2004 is configured to calculate a delay (Block 3006) between the target values of the reference signal and corresponding actual parameter values achieved at the controlled output. The delay/amplitude estimator 2004 is also configured to provide, based upon the delay, a time-shifted amplitude error 2052 indicative of an error between the target values and the actual parameter values (Block 3008). According to one aspect, the predictive control section 2012 is beneficially configured to adjust at least one of the actuators 2008 (based upon the delay 2050 (at Block 3006) and the time-shifted amplitude error 2052 (at Block 3008)) in advance of when an actual parameter value is needed (at an actuator output of the at least one actuator) while maintaining the controlled parameter at the controlled output within a threshold range (Block 3010).

Figure 25:
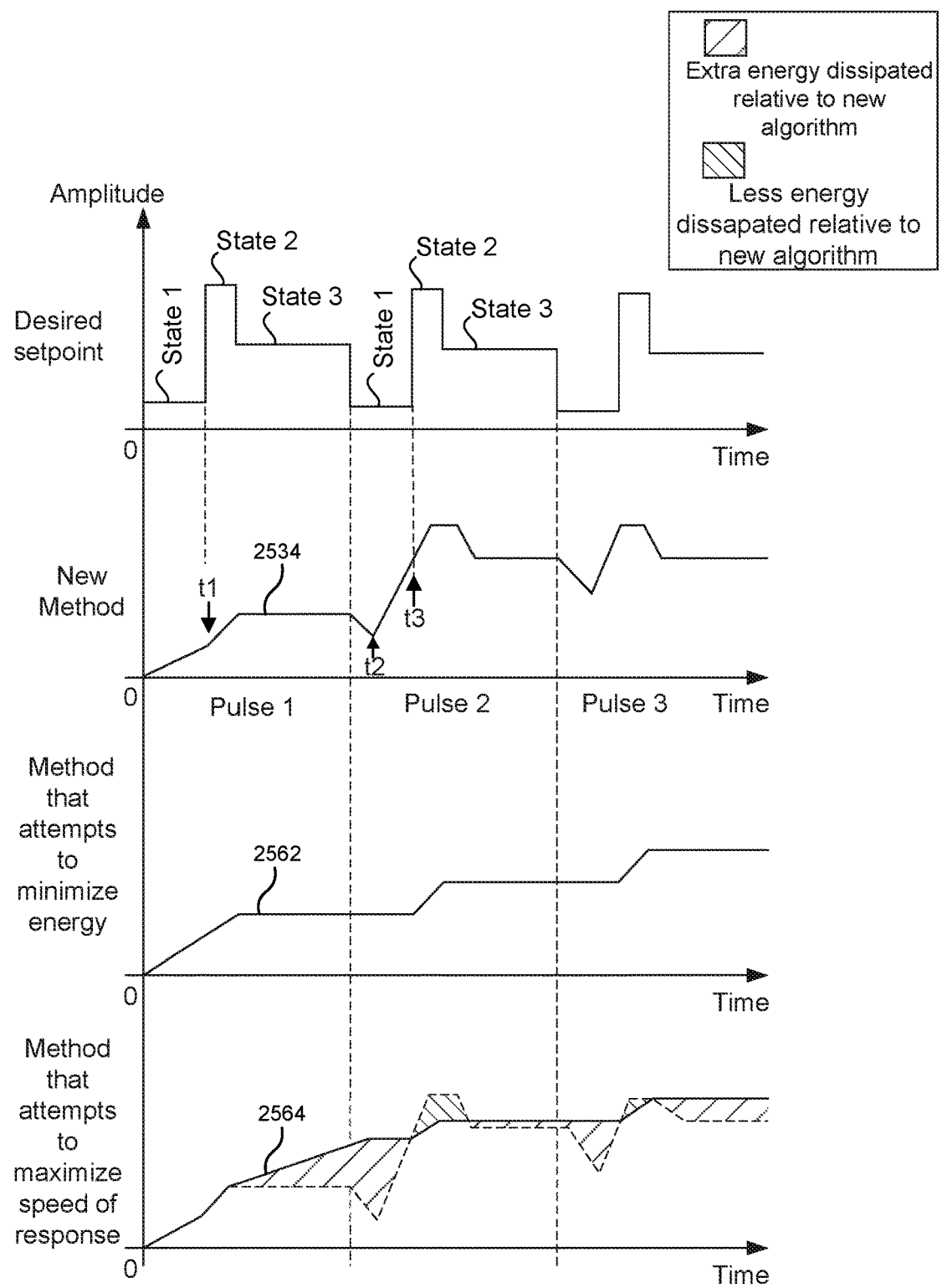
FIG. 25 is a collection of graphs that illustrates differences in actuator control and energy dissipation between control methods.

Referring briefly to FIG. 25 for example, shown is an example of an actuator output 2534 (e.g., rail voltage, $V_{rail}$) that is produced (using the tensorial control 2001) in response to a desired setpoint where the desired setpoint comprises three pulses and each pulse includes three target values (desired at the controlled output for a controlled parameter): state 1, state 2, and state 3. Each state of the desired setpoint corresponds to a target value of a controlled parameter at the output 2030 (e.g., forward power). As shown, during pulse 1, the actuator output 2534 is adjusted, at $t_1$, in very close connection with a time when it is needed—at the change in the setpoint from state 1 to state 2. But during pulse 2, the actuator output is adjusted, at $t_2$, in advance of when the actuator output 2534 needs to be increased to produce the target value of state 2 at the output 2030. As a consequence, the controlled parameter (e.g., forward power) at the controlled output (e.g., load output 2030) will reach the desired setpoint faster than prior control methodologies that attempt to minimize energy dissipation (using actuator output 2562), and faster than prior methods that attempt to maximize a speed of response (using actuator output 2564). As discussed further herein, the predictive functionality of the predictive control section 2012 enables the tensorial control 2001 to adjust the actuator (e.g., rail voltage) in advance of when it is needed by predicting the effects of adjusting the actuator in advance of when it is needed so that adverse consequences (e.g. setpoint errors or over voltage conditions) are avoided.

Figure 22A:
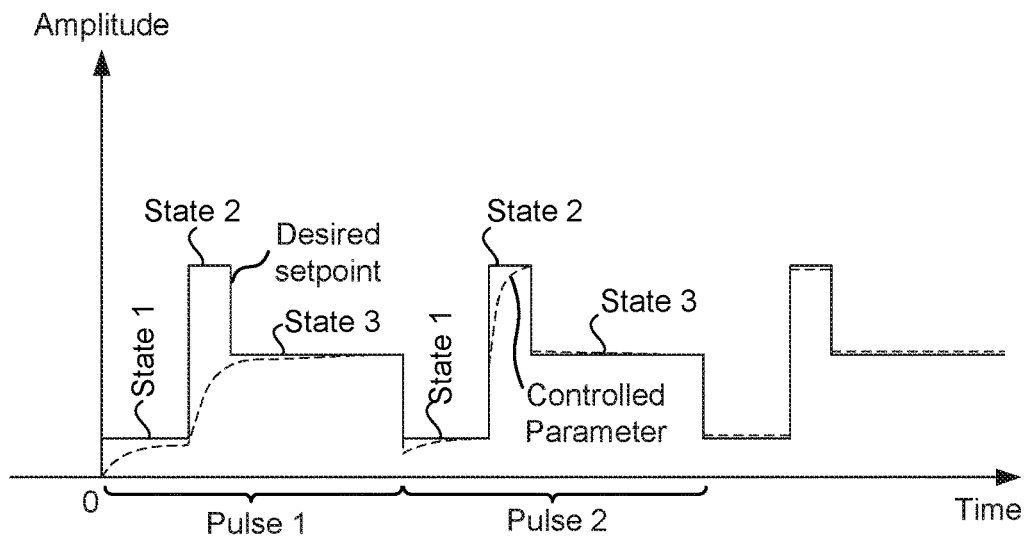
FIG. 22A is a graph depicting operation aspects of the generator depicted in FIG. 21.
Figure 22B:
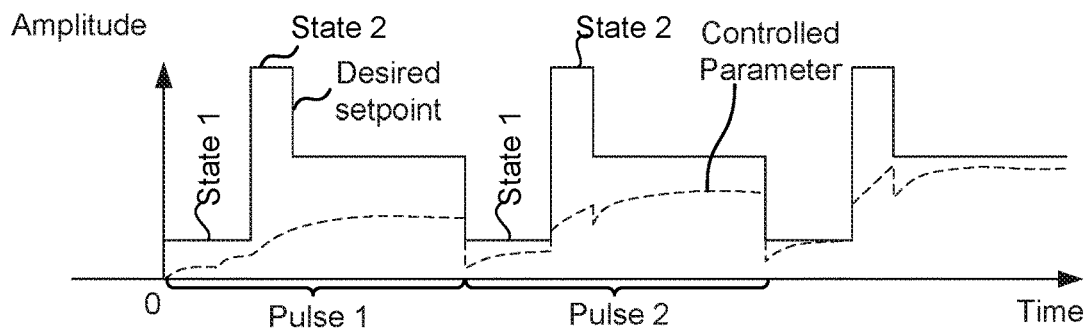
FIG. 22B is a graph depicting operational aspects of control systems that attempt to minimize energy.
Figure 22C:
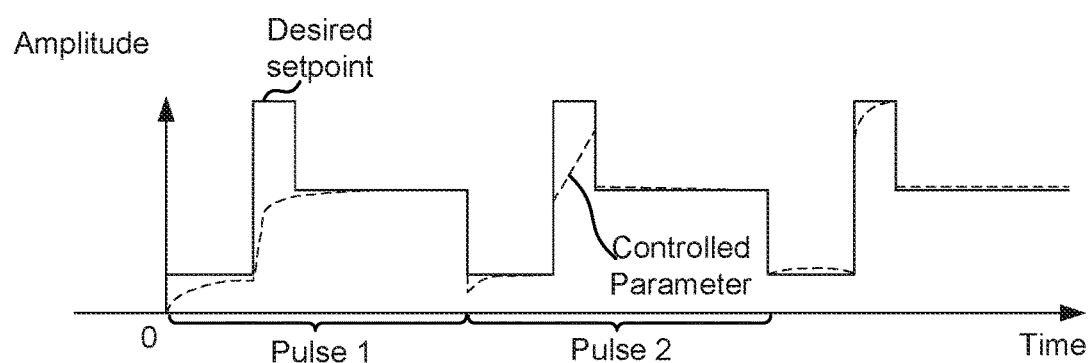
FIG. 22C is a graph depicting operational aspects that maximize speed while dissipating more energy.

Referring to FIGS. 22A, 22B, 22C for example, shown are three graphs, and each of the three graphs depicts the same desired setpoint that is shown in FIG. 25 with the same three desired states per pulse. FIG. 22A depicts the controlled parameter actually achieved at the controlled output using the predictively produced actuator output 2534;

FIG. 22B depicts the controlled parameter actually achieved at the controlled output using the actuator output 2562; and FIG. 22C depicts the controlled parameter actually achieved at the controlled output using the actuator output 2564. As shown in FIG. 22A, the controlled parameter is closer to the desired setpoint during pulse 2 when the controlled actuator is controlled (in advance of when it is needed) to produce the actuator output 2534 as compared to both the controlled parameter values in FIGS. 22B and 22C.

As discussed further herein, the delay/amplitude estimator 2004 may be implemented with different levels of complexity, but in general, the delay/amplitude estimator 2004 is configured to detect a delay 2050 between a desired setpoint (from the user interface 108) and the time when the actual output of one or more actuators 2008 reaches the setpoint. As discussed further herein, the reference may be a time varying streaming setpoint (e.g., a setpoint that mirrors the pulses and states in FIG. 2) and, as discussed further herein, the delay 2050 may be determined based upon a cross correlation between the streaming setpoint and the actual time-varying output of one or more actuators 2008 in the system. Moreover, as discussed further herein, the delay 2050 may be a simple delay (e.g., between a setpoint and an output when the setpoint is achieved) or the delay 2050 based on several constituent delay components including delays within an actuator 2008 and/or external delays outside of the actuator 2008. With knowledge of the delay 2050, the delay/amplitude estimator 2004 may determine a time-shifted amplitude error 2052, which is generally indicative of an error value based upon a difference between the streaming setpoint and the output that is determined after the streaming input waveform and an output waveform are relatively time-shifted (based upon the delay 2050) so that, on an ongoing basis, a portion of the output waveform is aligned with the corresponding portion of the reference waveform that effectuated the portion of the output waveform. Once the output waveform is aligned with the streaming setpoint, an error value, represented as the time-shifted amplitude error 2052, may be calculated.

The predictive control section 2012 utilizes the delay 2050 and the time-shifted amplitude error 2052 to predict how the control signal(s) and or actuator output(s) will react to potential control signal changes—in advance of actually changing the control signals. By predicting how the actuator outputs will be affected (in advance of actually changing the control signals to the actuators 2008) the predictive control section 2012 may adjust the control signals to achieve desired outputs. For example, based upon predicted-control-signal outputs, the predictive control section 2012 may adjust the control outputs to: reduce a time it takes to achieve a desired output of the actuator(s); to reduce energy dissipation; to prevent damaging over voltage and/or over current conditions; and/or to achieve any desired balance between speed, accuracy, and energy.

It should be recognized that FIG. 20 is a simplified depiction of what may be implement on a tensorial level with many setpoints, many control signals, and many actuators 2008. It should also be recognized that the actuators may be higher-level actuators (such as generators, match networks, RF sources, and bias supplies) and lower-level constructs within the higher-level actuators. For example, the DC section 908 and the power amplifier 906 are examples of actuators within a generator that may be controlled (as discussed further herein as a non-limiting example). By way of further example, the voltage of the DC section may be controlled, and a frequency of the power amplifier may be controlled using the tensorial control 2001.

As another example, the match network 116 is an example of an actuator 2008, which also comprises actuators such as variable capacitors that may be controlled using of the delay estimation and predictive control aspects of the delay/amplitude estimator 2004 and predictive control section 2012, respectively. It is contemplated, for example, that variable capacitors of the match network 116 may be controlled in isolation (e.g., based upon reflected power) or in connection with a variable frequency drive of the generator 102 using the of the delay/amplitude estimator 2004 and predictive control section 2012. As a further example, the bias supply 120 is an actuator 2008, and the bias supply 120 comprises actuators 2008 such as a power supply (e.g., to establish a rail voltage) and a switching-section to establish timing of a periodic asymmetrical voltage waveform. These actuators 2008 of a bias supply may be controlled (using the estimation and prediction techniques of the delay/amplitude estimator 2004 and predictive control section, respectively) to control the bias supply 120. Or other actuators of the bias supply may be controlled in view of other actuators such as the RF source 118 and/or generator 102 to synchronize the bias supply 120, the RF source 118, and/or the generator 102 to achieve desired plasma processing recipe results and/or to prevent undesired plasma modulation (e.g., due to intermodulation frequencies).

In more general terms, various aspects of the delay estimation and predictive control may enable direct, unhindered (or without response delay) control of a parallel multi-actuator or multi-knob nonlinear control system (such as the plasma processing systems 100, 2000). A controller utilizing the delay estimation and predictive may enable more responsiveness (e.g., maximize dynamic range in real time) of a parallel multi-actuator nonlinear and/or chaotic control system. Moreover, the delay estimation and predictive aspects of this disclosure may enable improved controls (e.g., to maximize the speed of the response and achieve the shortest response time to reach a desired setpoint value) of a parallel multi-actuator nonlinear and/or chaotic control system. The delay estimation and predictive aspects may also enable all of the above functions and advantages to be achieved even when some of the actuators of the control system are arbitrarily slower than other actuators of the control system.

Another aspect of the delay estimation and predictive control of this disclosure may enable all of the above functions and advantages to be achieved even when multi-level pulsing with a number of states (going up to an arbitrary number) is desired, and/or arbitrary waveform tracking is required on a nonlinear and/or chaotic dynamic load. Yet another aspect may also enable all of the above functions and advantages to be achieved even while minimizing the control energy expended in the system. As discussed further herein, the delay estimation and predictive control aspects may also enable all of the above functions and advantages to be achieved while protecting hardware from faults relating to high dissipation, high currents, and/or high voltages. Moreover, another aspect of the delay estimation and predictive control methodologies may also enable all of the above functions and advantages to be achieved even while making sure all the different actuators work cooperatively together such that no actuator is controlling itself in a manner that hinders, impedes, or interferes with the control of the other actuators in such a way that would cause the system response to become slower, or require more energy to be achieved from any or all of the other actuators.

Figure 21:
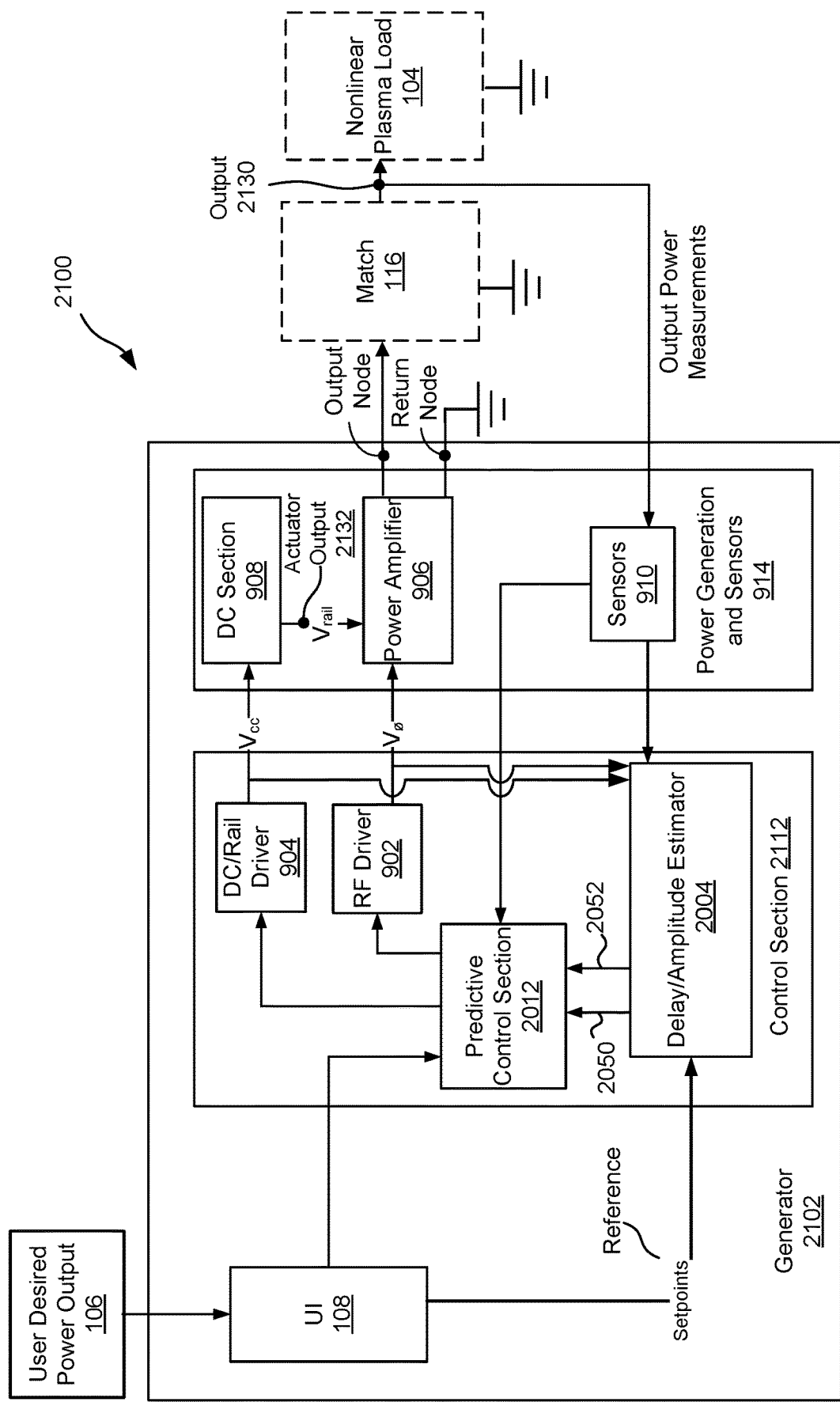
FIG. 21 is a block diagram depicting an example of a generator implementing the control system of FIG. 21.

Referring next to FIG. 21, shown is a plasma processing system 2100 that comprises a generator 2102 that is similar to the generator 102 depicted in FIG. 9 except that control aspects of the generator 2102 differ from the generator 102. The generator 2102 depicted in FIG. 21 is presented as a non-limiting example of an actuator 2008 that is a higher-level actuator and in which the control aspects of the delay/amplitude estimator 2004 and the predictive control section 2012 may be implemented. In the depicted generator 2102, the DC section 908 and the power amplifier 906 are examples of actuators 2008 that are lower-level actuators described with reference to FIG. 20. More specifically, the DC section 908 is an example of a slow actuator 316 and the power amplifier 906 is an example of the fast actuator 314 described with reference to FIGS. 3, 4, 5A, and 5B.

As shown, both the delay/amplitude estimator 2004 and the predictive control section 2012 receive measurements of the controlled parameter that is controlled at an output 2130 within the plasma processing system 2100. In this example, the output 2130 is at an output of the match network 116, but in other instances other outputs and other parameters within the plasma processing system 2100 may be measured (depending upon the delay to be calculated). In addition, the delay/amplitude estimator 2004 and the predictive control section 2012 receive a reference signal, which defines target values for the controlled parameter that is controlled at the output 2130. The controlled parameter that is controlled at the output 2130 depicted in FIG. 21 may be, for example, at least one of forward power, reflected power, and reflection coefficient.

The delay/amplitude estimator 2004 is configured to calculate a delay between the target values (e.g., forward power values of a multi-level pulsed waveform) of the reference signal and corresponding actual controlled parameter values achieved at the output 2130. And in addition, the delay/amplitude estimator 2004 is configured to provide, based upon the delay, the time-shifted amplitude error 2052 indicative of an error between the target values and the actual parameter values.

In this example, the predictive control section 2012 is configured to adjust the DC section 908, based upon the delay and the time-shifted amplitude error 2052, in advance of when an actual voltage, $V_{rail}$, is needed at an actuator output 2132 of the DC section 908 while maintaining the control parameter (e.g., forward power) at the output 2130 within a threshold range. The threshold range for example, may be +/−0.5% of the target value (e.g., forward power value) that is specified by the reference signal.

The threshold range may also be based upon a change or delta in error between a desired reference setpoint and achieved setpoint per time step. In some implementations, for example, on an ongoing basis, the predictive control section 2012 may rapidly and frequently effectuate an adjustment to the DC section 908 within each control clock cycle to achieve desired speed and/or energy dissipation. But the predictive control section 2012 may also dynamically upper and lower bound the allowable change in magnitude of the DC section 908 such that (under steady state conditions) at any instant of time, the predictive control section may maintain the desired setpoint, or the achieved setpoint error, at or approximate to zero, or approaching zero. In other words, under steady state conditions, a change or delta in error of the steady state measurement per time step may be maintained as:

$$\frac{\Delta e}{T_S} = \text{Threshold} \qquad \text{(Equation 2)}$$

Where Ts is an update rate (of a control clock cycle) of the control output to the RF amplifier, and the desired threshold, which may be zero or another acceptable value.

To maintain Equation 2, the predictive control section 2012 may operate to ensure that the change in setpoint amplitude of the rail voltage, $V_{rail}$, over the system time step $$\frac{\Delta A_{slow}}{T_S}$$

(where $A_{slow}$ generally represents $V_{rail}$) never allows the change in setpoint amplitude of the fast control signal, $V_\emptyset$, over the system time step $$\frac{\Delta A_{fast}}{T_S}$$

(where $A_{fast}$ generally represents $V_\emptyset$) to fail to achieve the desired or intended setpoint for the controlled parameter at the output 2130 because the amplitude of the rail voltage, $V_{rail}$, itself is too small. In other words, a change in $V_{rail}$ may be limited by the predictive control section 2012 so that the power amplifier 906 can continue to provide a desired value for the controlled parameter at the output 2130.

Although the predictive control section 2012 limits changes to the rail voltage, $V_{rail}$, the predictive control section 2012 may preemptively adjust (due to the inherent delay of the DC section 908) the rail voltage, $V_{rail}$, so that the rail voltage, $V_{rail}$, starts to change in advance of when a specific rail voltage, $V_{rail}$, is needed in order to provide a desired power state at the output 2130. In addition, as discussed further herein, the rail voltage, $V_{rail}$, may be adjusted (based upon predicted energy dissipation) to reduce energy losses, while at the same time, any changes to the rail voltage, $V_{rail}$, are bounded to mitigate against any errors between the target value of the controlled parameter (defined by the reference signal) and the actual parameter value applied at the output 2130. More specifically, the error mitigation (e.g., to maintain a threshold level of error) is achieved by bounding changes to the rail voltage, $V_{rail}$, so that the power amplifier 906 is able to adjust to maintain the parameter at the output 2130 at a desired setting (set by the reference signal).

Figure 23A:
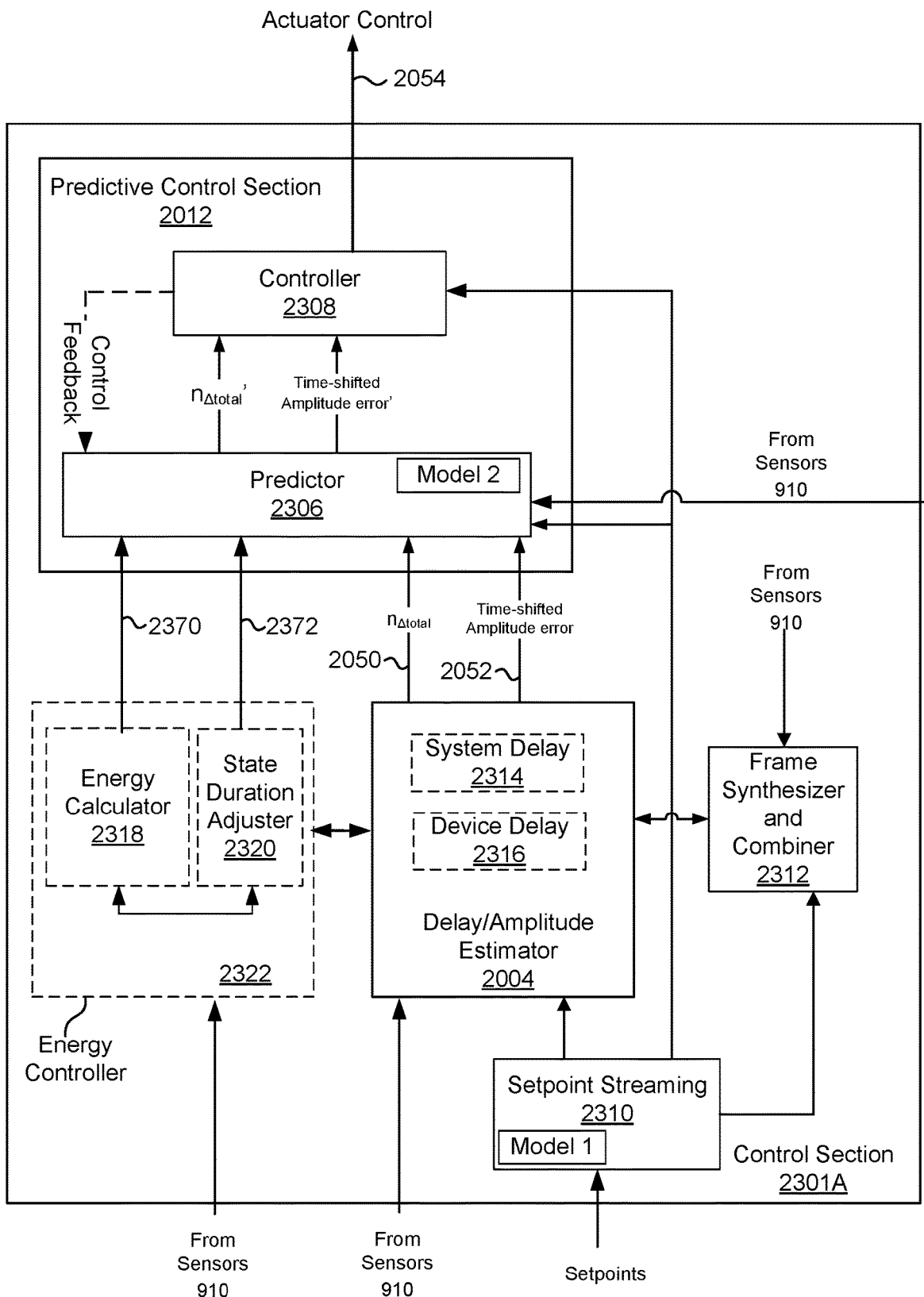
FIG. 23A depicts an example of the control section depicted in FIG. 22C.

Referring next to FIG. 23A, shown is a block diagram depicting a control section 2301A that comprises the delay/amplitude estimator 2004 and the predictive control section 2012 along with other components. As shown, the control section 2301A comprises a setpoint streaming module 2310 coupled to both the delay/amplitude estimator 2004 and a frame synthesizer and combiner 2312, which is also coupled to the delay/amplitude estimator 2004. In addition, an optional energy controller 2322 is shown coupled to the delay/amplitude estimator 2004 and a predictor 2306, which is shown functionally as a portion of the predictive control section 2012. The optional energy controller 2322 comprises an energy calculator 2318 and a state duration adjuster 2320, which form the depicted connection between the optional energy controller 2322 and the predictor 2306. Also shown within the predictive control section 2012 is a controller 2308 that is configured to provide one or more actuator control signals 2054. One of ordinary skill in the art will appreciate, in view of this disclosure, that the functional constructs depicted in FIG. 23A may be combined into fewer functional units or may be further separated. Moreover, the functional constructs depicted in FIG. 23A may be implemented across different types of underlying hardware such as a programmed field programmable gate array (FPGA) or one or more processors capable of executing processor executable code that is stored in memory (also referred to as a CPU).

Figure 23B:
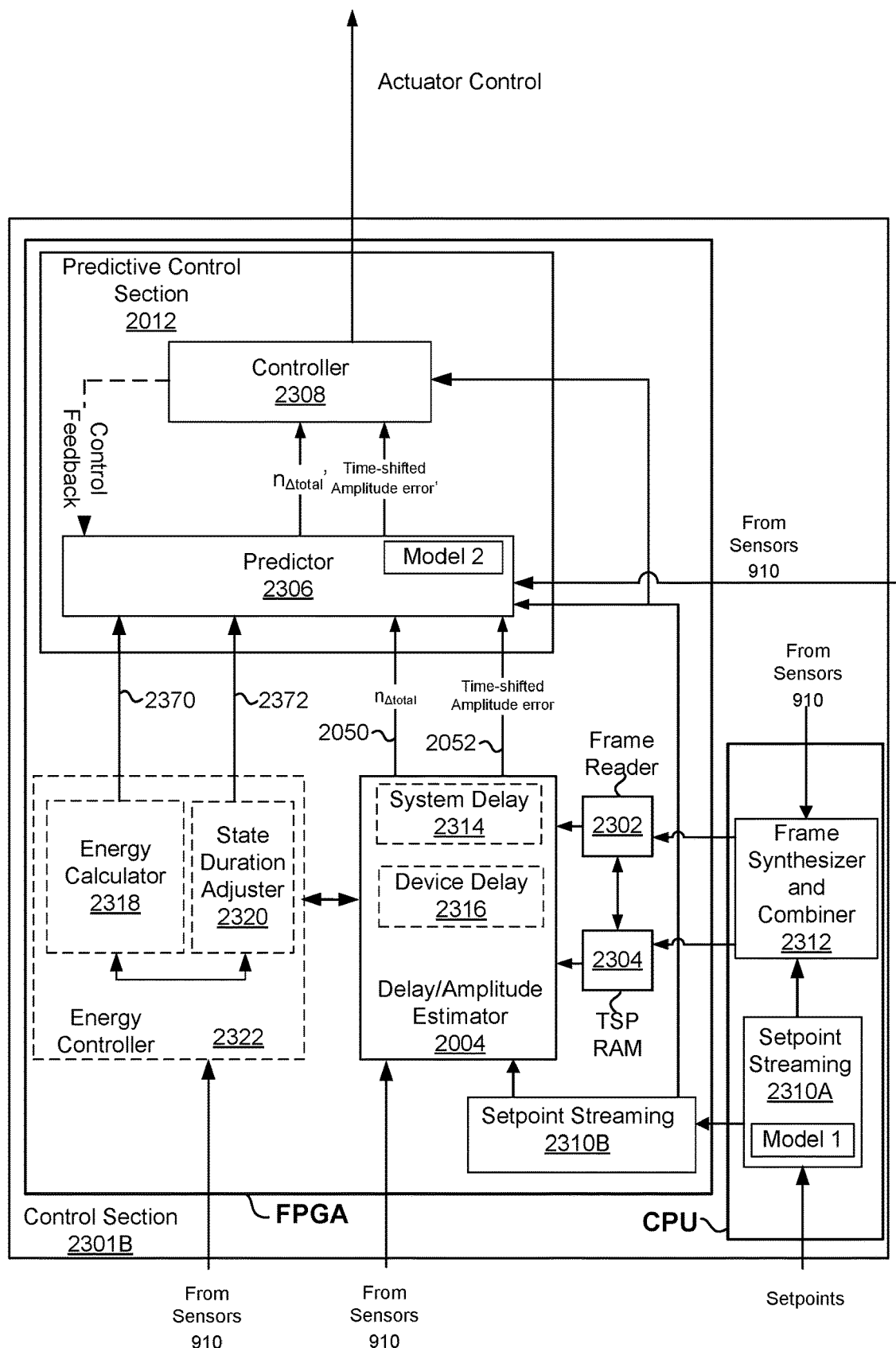
FIG. 23B depicts another example of the control section depicted in FIG. 22C.

Referring to FIG. 23B for example, shown is another control section 2301B, which is an example of how the control section 2301A depicted in FIG. 23A may be realized across hardware. More specifically, the frame synthesizer and combiner 2312 may be implemented by processor executable code that is executed by a processor (e.g., as a part of a central processing unit (CPU)). And in FIG. 23B, the setpoint streaming module 2310 of FIG. 23A is distributed between a first setpoint streaming module 2310A (where the first setpoint streaming module 2310A is implemented by processor executable code that is executed by a processor (e.g., as a part of the central processing unit (CPU)) and a second setpoint streaming module 2310B is implemented by a programmed FPGA. In addition, a frame reader 2302 and TSP RAM are implemented by a programmed FPGA; both the frame reader 2302 and TSP RAM are coupled together;

both are arranged between the frame synthesizer and combiner 2312; and both are coupled to each other. The remaining constructs (the constructs other than the frame synthesizer and combiner 2312 and the setpoint streaming module 2310A) depicted in FIG. 23A are implemented by the programmed FPGA in FIG. 23B.

In operation, the frame synthesizer and combiner 2312 functions to remove noise from the measurements received from the sensors 905 and create frames from the cleaned measurement data. For the purpose of this disclosure, a frame is a set of samples processed in a batch, and thus frames can be processed in parallel and then the outputs of the frame processing can be serialized. The frames, or synthesized frame data, can be provided to the delay/amplitude estimator 2004 to allow parallelized processing of the synthesized frame data. An aspect of the frame synthesizer and combiner 2312 is that it enables the measurements to be formatted to fit into the structure of the FPGA more easily.

The setpoint streaming modules 2310A and 2310B generally function to receive a target setpoint input (e.g., desired multi-level pulsing setpoints or multi-state setpoints with desired waveform shape and timing specifications for each state), from the user interface 108, and the setpoint streaming modules 2310A and 2310B may produce, generate, and transmit a setpoint waveform (to the delay/amplitude estimator 2004) with the multiple pulsing levels or states and in accordance with the other desired waveform shape and timing specifications for each pulsing level or state. Although some traditional example plasma processing systems have requirements for one or two states or one or two level pulsing in a setpoint signal provided to a control module of a controller for the plasma processing system, some emerging example systems may have a requirement for four states or four level pulsing, which setpoint waveform streaming modules 2310A, 2310B may accommodate. More specifically, the setpoint streaming modules 2310A, 2310B may receive multiple desired inputs and provide multiple desired outputs as part of the desired setpoint waveform and produce a corresponding multi-input multi-output (MIMO) setpoint waveform, as an intrinsic feature of its tensorized nature.

As shown, the setpoint streaming module 2310A may produce an initial model (first model), Model 1, based upon the desired setpoint waveform shapes and parameters from the user interface. For example, a user (e.g., a human or a signal from a controller) may specify particular attributes for a setpoint waveform such as, for example and without limitation, power level, rise time, overshoot, and steady state values. And the setpoint streaming module may transform these specifications into a system model. Based upon the system model (Model 1), the setpoint streaming module 2310A may generate a seed waveform. When generating the seed waveform, an optimized number of uniformly and/or non-uniformly sampled points may be used, and the number of sample points may correspond to a number of points that may reduce regression or interpolation processing burden (and hence, reduce time and use of resources) in the FPGA. The seed waveform generated by setpoint streaming module 2310A may correspond to points that define a whole single setpoint waveform pulse cycle for the next two interrupts of the CPU while omitting any data that is repetitive or superfluous for constructing the setpoint waveform. The setpoint streaming module 2310A may transmit the set of seed waveform data to setpoint streaming module 2310B. Details of implementing an exemplary setpoint streaming module may be found in U.S. patent application Ser. No. 17/509,539, filed Oct. 25, 2021, entitled Robust Tensorized Shaped Setpoint Waveform Streaming Control, which is incorporated by reference.

The frame reader 2302 in connection with the TSP RAM 2304 functions to receive and read, within the FPGA, the frames that are received from the frame synthesizer and combiner 2312. The TSP RAM may enable four states or four level pulsing. An example of TSP-RAM systems that this disclosure may accommodate are disclosed in U.S. patent application Ser. No. 17/516,578, filed Nov. 1, 2021, entitled Tensor Non-Linear Signal Processing Random Access Memory, which is incorporated by reference.

As shown, the delay 2050 output from the delay/amplitude estimator 2004 may be a total delay, $n_{A total}$, which may be a function of both a system delay 2314 and device delay 2316. More specifically, the device delay 2316 may comprise an internal delay, $n_d$, due to computations which are determined by the processor design (e.g., FPGA and/or CPU design). This internal delay, $n_d$, corresponds to the number of samples between receiving an input to the control section 2301A, 2301B and generating one or more actuator control signals 2054. This value may be determined during production of the control section 2301A, 2301B and may simply be retrieved from memory. The system delay 2314 comprises unknown delay, $n(t)_A$, which may be calculated as disclosed further herein with reference to FIGS. 31-34.

As shown, the predictive control section 2012 may comprises a predictor 2306 which uses a second model, Model 2, to predict results of applying the total delay, $n(t)_{\Delta total}$ and time-shifted amplitude error 2052 to the one or more actuator control signals 2054, and the predictive control section further modifies the one or more actuator control signals 2054 based on this prediction to provide more robust control signals for one or more actuators 2008 (such as, for example, the DC section 908 and the power amplifier 906) of the plasma processing system 2000.

In addition to receiving the delay ($n_{\Delta total}$) 2050 and the time-shifted amplitude error 2052, the predictor 2306 may receive an energy-indicator signal 2370 from an energy calculator 2318 and a state duration adjustment signal 2372 from a state duration adjuster 2320, which are optional components that enable an amount of energy that is dissipated to be managed. In operation, an energy monitor 516 computes the energy consumed in any one cycle or system time step as a sum of integrals (over time of actuators signals) multiplied by a conversion constant to discretize the energy of a single system time step. In the context of a slow actuator and a fast actuator, the energy consumed may be calculated as:

$$\varepsilon = S \, (\int u_{slow} \partial t, \int u_{fast} \partial t)$$

Where $u_{slow}$ is a slow actuator signal and $u_{fast}$ is a fast actuator signal, and S is the conversion constant to discretize the energy of a single system time step.

The state duration adjuster 2320 generally operates to calculate the duration of any one state and compare it to the control delays and cross-delays and then provide the state duration adjustment signal 2372 to enable the predictor 2306 to make sure the controlled actuators (e.g., the DC section 908 and the power amplifier 906) have enough time in advance to actuate a specific state with a desired level of energy consumption while maintaining a high-speed response behavior.

Figure 24:
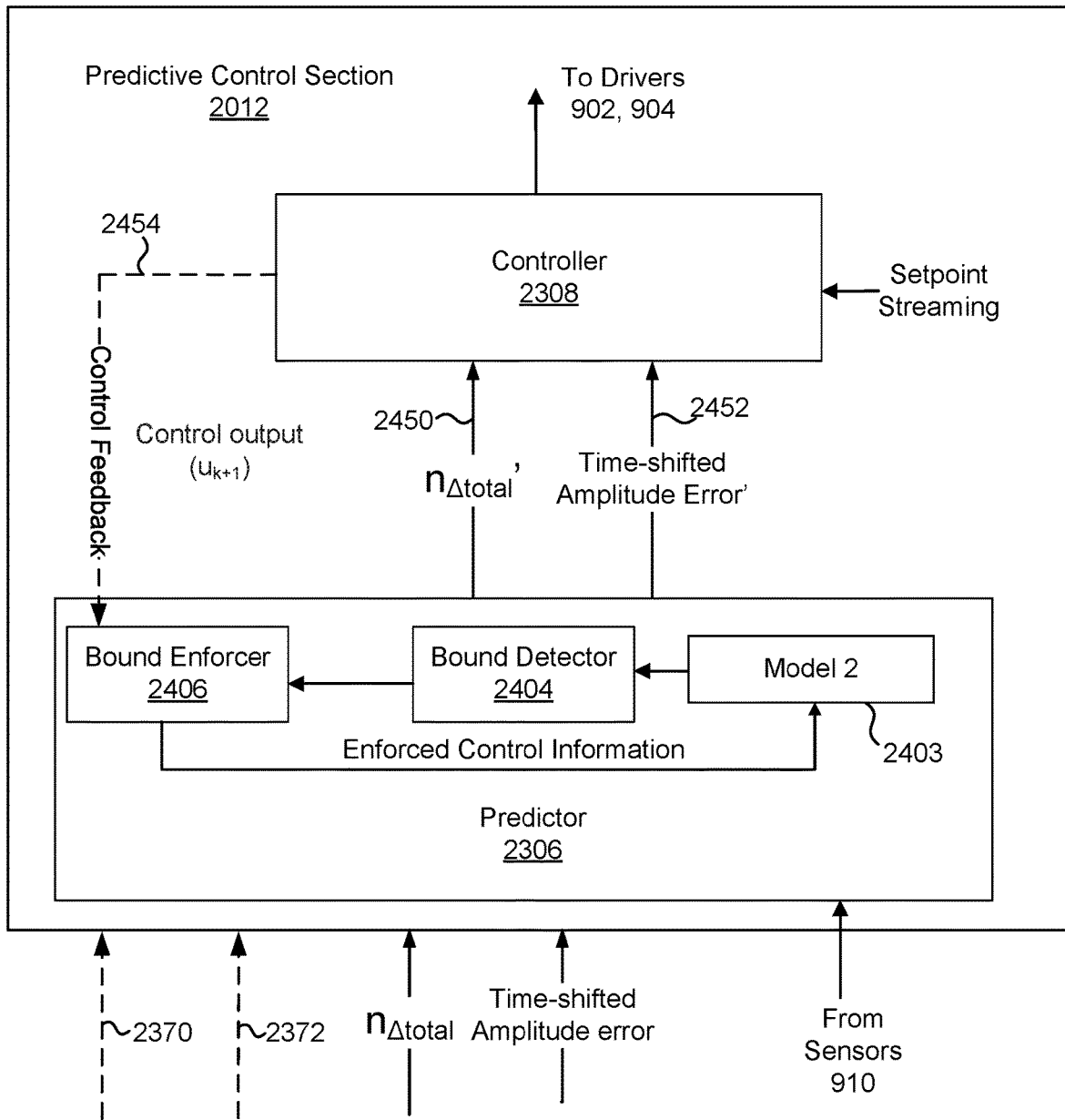
FIG. 24 is a block diagram depicting an example of the predictive control section of FIGS. 20, 21, 23A, and 23B.

Referring next to FIG. 24 shown is an example of the predictive control section 2012. As shown, the predictor 2306 in the embodiment depicted in FIG. 24 comprises a bound enforcer 2406 that is in communication with both a bound detector 2404 and the second model 2403, and the bound detector 2404 is also in communication with the second model 2403. As shown, the predictor 2306 provides an adjusted delay signal 2450 ($n_{\Delta total'}$) and an adjusted time-shifted amplitude error 2452 (time-shifted amplitude error') to the controller 2308 based upon the bound restrictions placed upon an actuator (e.g., the DC section 908).

More specifically, the second model 2403 provides a model of the plasma processing system 2000 to enable a prediction of how the actuator outputs 2032 will respond to potential changes to control signals provided to the actuators 2008. As those of ordinary skill in the art will appreciate, the second model 2403 may be created using mathematical models for the plasma processing system 2000 as a whole and/or mathematical models for the individual actuators 2008, and the mathematical models may be augmented by empirical measurements. As shown in FIG. 24, the second model 2403 may be updated on an ongoing basis based upon control feedback 2454 from the controller 2308 and measurements from the sensors 905 (that may provide measurements of the actuator outputs 2032 such as controlled-parameter values).

In operation, the second model 2403 may provide an indication to the bound detector 2404 of whether the controlled parameter (e.g., forward power) at the load output 2030 will deviate beyond a threshold error in response to particular changes to an actuator (e.g., rail voltage, $v_{rail}$, output by the DC section 908). The second model 2403 may also provide an indication to the bound detector 2404 about whether an actuator setting may create, for example and without limitation, an overvoltage situation, a runaway control condition, and/or instability. As yet another example, the bound detector 2404 may also utilize the second model 2403 to determine whether adjustments to an actuator based upon the energy-indicator signal 2370 and the state duration adjustment signal 2372 will cause an error between a setpoint and a controlled parameter.

If the bound detector 2404 detects that controlling an actuator based upon the time-shifted error signal will create a problem, the bound detector 2404 may pass boundary enforcement conditions to the bound enforcer 2406, and the bound enforcer 2406 may produce an adjusted time-shifted amplitude error signal 2452 that limits how much an actuator may change. More specifically, the controller 2308 will adjust the one or more actuator control signals 2054 provided to the corresponding actuators 2008 based upon the changes made to the magnitude of the adjusted time-shifted amplitude error 2452.

Figure 26:
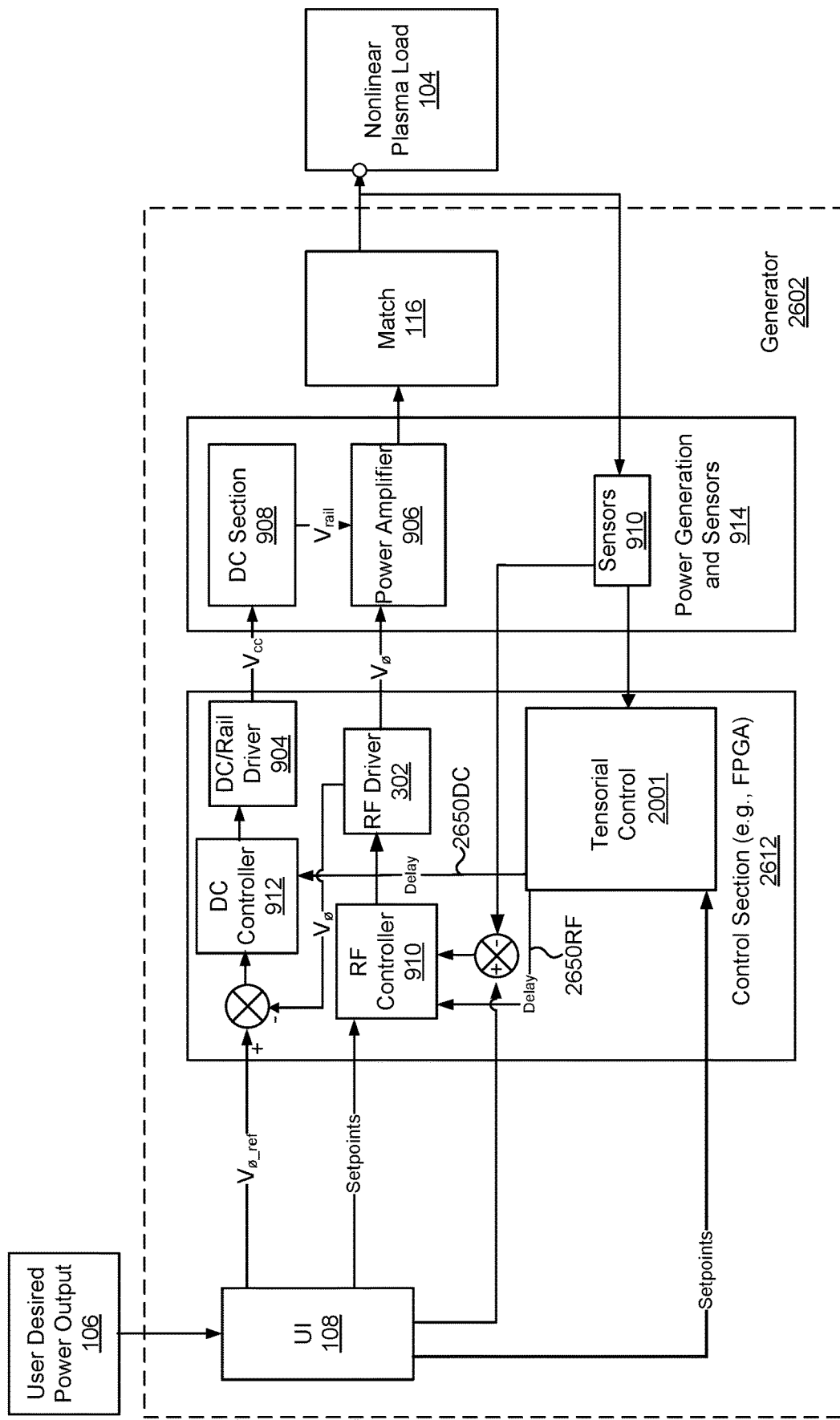
FIG. 26 is a block diagram depicting a hybrid control approach that incorporates aspects of the control reactive and predictive methodologies described herein.

Referring next to FIG. 26, shown is an example of a generator 2602 that utilizes a hybrid approach between the reactive control methodology described with reference to FIGS. 9-19 and the predictive control approach described with reference to FIGS. 20-25. As shown, the generator 2602 is similar to the generator 102 depicted in FIG. 9 except that the tensorial control 2001 may be used to provide a delay signal 2650RF to the RF controller 910 and a delay signal 2650DC to the DC controller 913. In this control approach, the prediction mechanisms described with reference to FIGS. 20-25 are not utilized, so the generator 2602 is not able to adjust the rail voltage, Vrail, in advance of when it is needed, but the delay signals delay signals 2650RF, 2650DC may be used to enforce bounds to limit how much the rail voltage may be moved.

Figure 27:
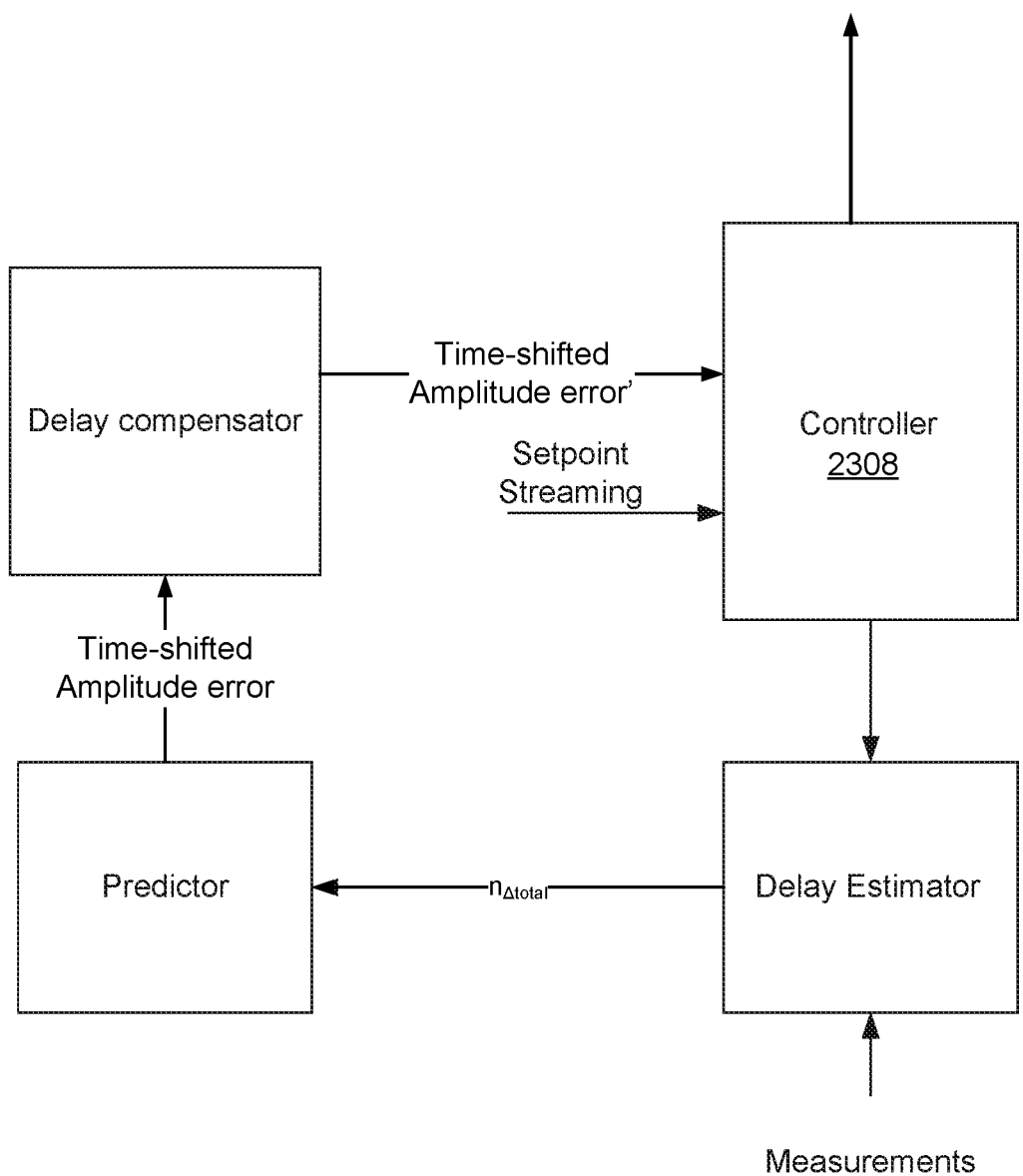
FIG. 27 is a block diagram illustrating an example control architecture that may be used to implement the control functionality of FIG. 20.
Figure 28:
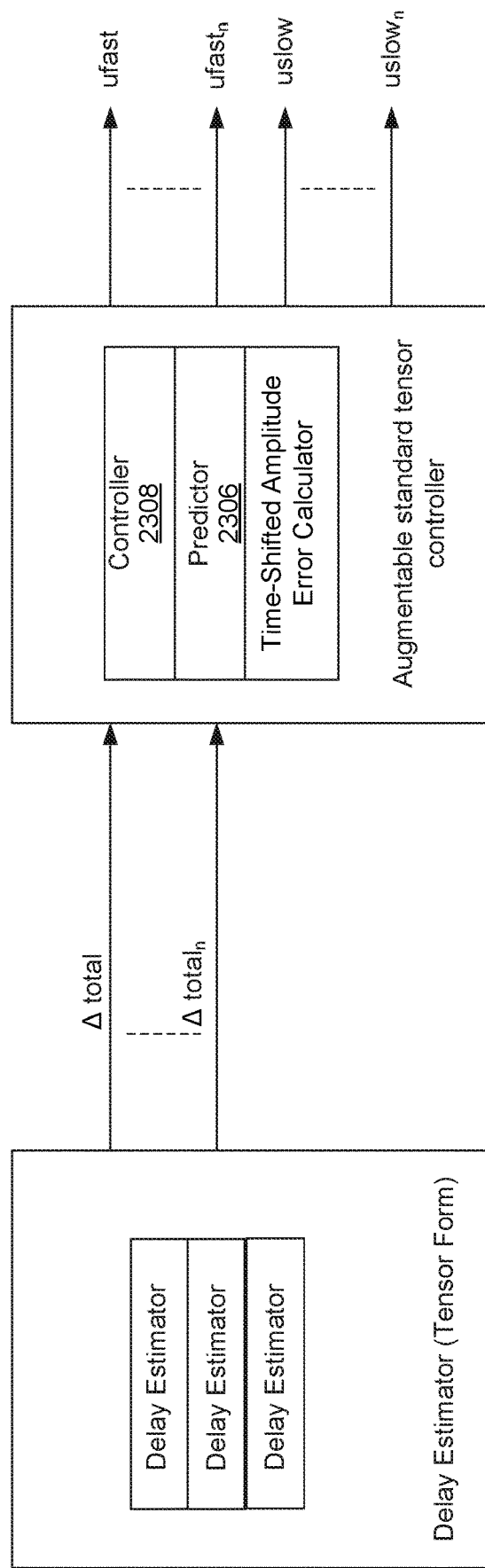
FIG. 28 is a block diagram illustrating an example control architecture that may be used to implement the control functionality of FIG. 20.
Figure 29:
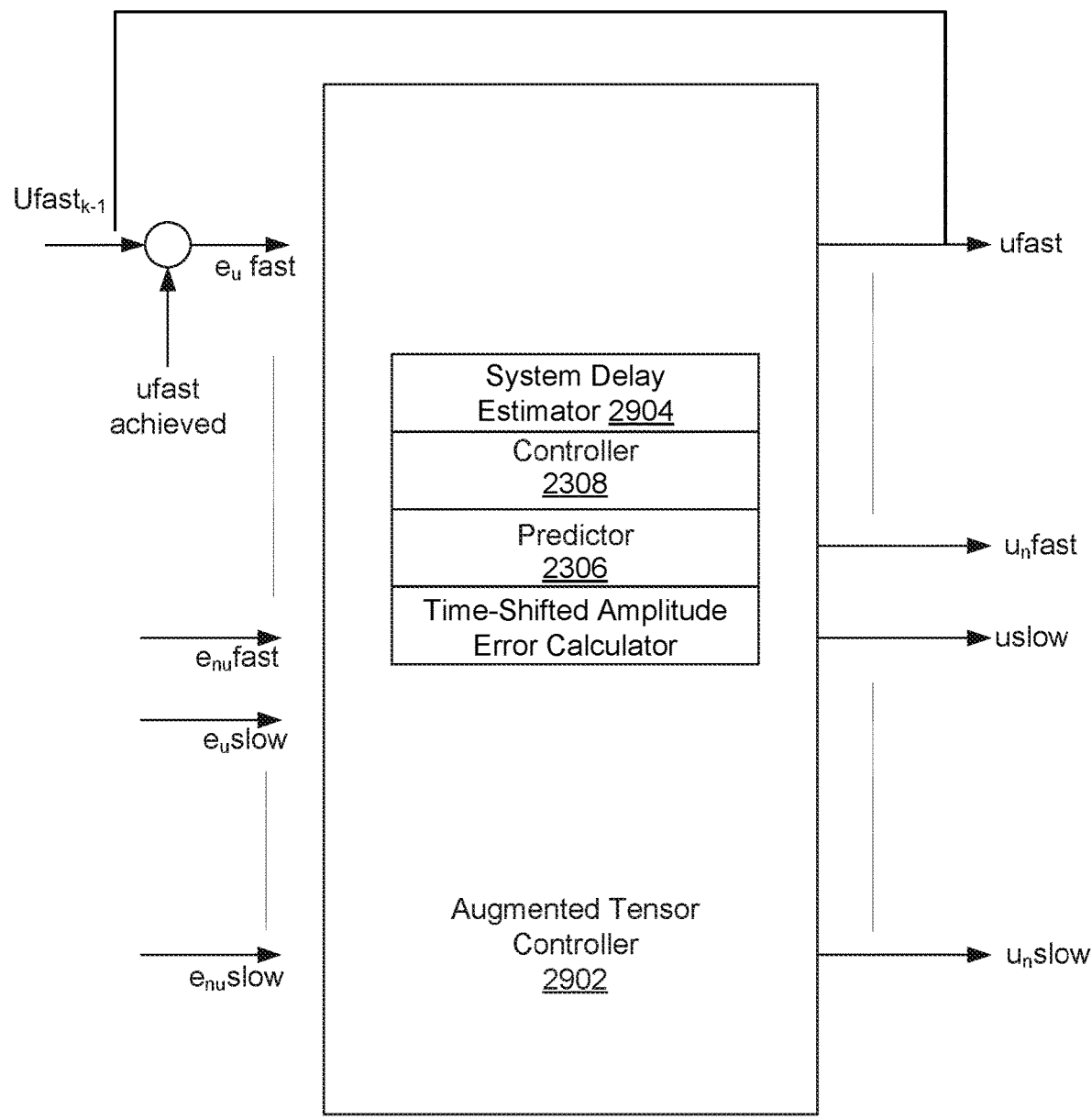
FIG. 29 is a block diagram illustrating an example control architecture that may be used to implement the control functionality of FIG. 20.

Referring to FIGS. 27, 28, and 29 shown are block diagrams depicting various arrangements that may be used to implement the functionality of the delay/amplitude estimator 2004 and the predictive control section 2012. More specifically, the variations depicted in FIGS. 27, 28, and 29 show mathematical variations for implementing the same functions of the delay/amplitude estimator 2004 and the predictive control section 2012 described with reference to FIGS. 20-26. Referring to FIG. 27 for example, the functions of the delay/amplitude estimator 2004 and the predictive control section 2012 may be distributed among different constructs. More specifically, the calculations for the time-shifted amplitude error 2052 are provided by a predictor block, and calculations for the adjusted time-shifted amplitude error (time-shifted amplitude error') are provided by a delay compensator block. The variation of FIG. 27 may be preferred in systems that are limited in terms of computational power.

In contrast, the implementation of the functional aspects of the delay/amplitude estimator 2004 and the predictive control section 2012 in FIG. 28 may be preferably carried out in a system with greater amounts of computational power due to parallel processing that is utilized. More specifically, multiple delay estimator blocks may compute delay errors for many actuators in parallel, and the delay errors may be passed into an augmentable standard tensor controller, which effectuates the calculation of the time shifted amplitude error, and implements the controller 2308 and the predictor 2306. As a consequence, multiple control signals for the actuators 2008 are provided in parallel.

Referring to FIG. 29, shown is yet another variation that may be used with legacy systems, which adds an additional functionality to compensate for a delay in each actuator. As shown, multiple actuator control errors are received at an augmented tensor controller 2902 where each actuator control error is an error between a reference signal for an actuator and a corresponding actuator output. The errors are added as additional states to the tensorial control 2001. In this implementation, the depicted system delay estimator block 2904 calculates the delay based upon the measurements at the output of a match network and the setpoint.

FIGS. 31 to 36 will dive into embodiments and details of the delay/amplitude estimator 2004 shown in FIGS. 20, 21, 23A and 23B. Generally, the delay/amplitude estimator 2004 takes the (1) reference signal defining target values for a parameter that is controlled at an output within the system (e.g., desired waveform setpoints and forward power measured at an output of a match network resulting from the setpoints) and (2) measurements of the parameter that is controlled at the output via the reference signal, and determines the total time delay, $n(t)_{\Delta total}$. It also uses this total time delay, $n(t)_{\Delta total}$, to determine an amplitude error based on a time-shifted comparison of measurements (or the actual parameter values) and the reference signal. This amplitude error is the previously mentioned time-shifted amplitude error. The amplitude error largely accounts for, and allows the system to reject, noise and dynamic uncertainty. The total time delay and time-shifted amplitude error are used in the predictive control section to predict actuator(s) outputs and further modify control signals to the actuator(s) to achieve the desired outputs within a threshold of noise and dynamic uncertainty. The adjusted control signals can then be passed to driver(s) or other actuator(s) for achieving the desired output. In short, actuator control signals can be modified in advance of the timing dictated by the reference signal alone. This optimizes output parameters such as power efficiency that can be degraded by delays in the system. Similarly, control signals can be adjusted in advance of the reference signal (setpoint) timing to account for predicted maximum noise and dynamic uncertainty, to again optimize output parameters and maintain the output within a threshold range.

More specifically, the delay/amplitude estimator performs a cross correlation between measured waveforms (or discretized data) and setpoint waveforms (or discretized data) using a set of initial guesses for the total time delay between the measured waveforms and setpoint waveforms. A time delay determined by this cross correlation can be used in the predictive control section to adjust control signals. At the same time, the delay/amplitude estimator can identify noise and dynamic uncertainty in the measured signal/values and provide an error or compensation for these amplitude errors to the predictive control section. In some cases, a maximum bounded limit resulting from noise and dynamic uncertainty can be used to provide further robust control. The predictive control section can then use these amplitude errors and the time delay to predict an outcome at the actuators should a corresponding control signal be passed to the actuators and further adjust the control signal(s) based on this prediction. For instance, the predictive control section 2012 may dynamically upper and lower bound the allowable change in magnitude of an actuator such that (under steady state conditions) at any instant of time, the predictive control section 2012 may maintain the desired setpoint, or the achieved setpoint error, at or approximate to or approaching zero. Details of this prediction will be further described relative to FIGS. 37-41. The reference signal can take various forms including a time varying streaming setpoint such as an arbitrary waveform or a pulsed waveform as seen, for instance, in FIG. 2.

In some implementations, the delay/amplitude estimator can group measurements and setpoints into frames to allow parallel processing of its comparisons, cross correlations, and calculations. When measurements, y(t), are grouped into frames, the measurements can be denoted as $y_i[k]$, where i is a frame number and k is a sample number within a given frame. When a setpoint waveform r(t) is broken into groups of frames, the discretized waveform can be denoted as $r_i[k]$. Frames comprising repeating setpoints can be analyzed together (in parallel), which is particularly helpful where pulsed or periodic waveforms are used. One time delay can be determined for each frame allowing these delays to be determined in parallel on a processor such as an FPGA, CPU, or combination of the two, running the delay/amplitude estimator. Frame data can be created in the setpoint streaming as previously described or within the delay/amplitude estimator (e.g., see optional estimator frame synthesizer 3203 in FIGS. 32 and 33).

In some embodiments, the setpoints sand measurements can be grouped into frames, via a frame synthesizer, such as frame synthesizer and combiner 2312 in FIG. 23A, to enable parallel processing of frames. The frame synthesizer and combiner 2312 can clean the measurements and create frames from the cleaned data. For the purpose of this disclosure, a frame is a set of samples processed in a batch, and thus frames can be processed in parallel and then the outputs of frame processing can be serialized. The frames, or synthesized frame data, can be provided to the hypothesis tester 3108 to allow parallelized processing of the synthesized frame data (i.e., processing in parallelized frames).

In more general terms, various aspects of the delay/amplitude estimator may enable direct, unhindered (or without response delay) control of a parallel multi-actuator or multi-knob nonlinear control system (such as the plasma processing system 100). More specifically, the delay/amplitude estimator enables (1) deterministic measurement, control, and aggregation of signal amplitudes; (2) sinusoidal measurement, control, and signal aggregation of amplitude(s) and phase(s) simultaneously; (3) sinusoidal measurement, control, and signal aggregation of amplitude(s), phase(s), and frequency(ies) simultaneously; (4) time delay, cross-delay and reverse cross-delay for measurements, controls, and aggregate arbitrary signals; (5) time delay, cross-delay and reverse cross-delay for measurements, controls, and aggregate arbitrary signals when data is merged from multiple sensing or processing sources; (6) all of the above for n→infinity sinusoidal measurements, controls, and aggregate signals in the presence of different noise sources and types; (7) all of the above for arbitrary measurement, controls, and aggregate signals in the presence of different noise sources and types; and (8) all of the above in the presence of different noise sources and types and different interference sources and types. The delay/amplitude estimator is especially effective in its ability to process inputs in a coupled and tensorial fashion to deal with large nonlinear and/or chaotic multiple input multiple output (MIMO) systems. The delay/amplitude estimator can also factor in bounded levels of dynamic uncertainty in the system, response, numerics, quantization, modeling, specifications, timing, estimates, measurements, predictions, and detections. All of the above can also be scaled to shorter sampling biases, non-uniform sampling, different numbers of inputs and/or outputs, real-time processors, and hardware/software architecture.

The embodiments of the delay/amplitude estimator discussed relative to FIGS. 31-34 are particularly useful where processing resources are limited since the more complicated operations such as finding a time delay, noise, and dynamic uncertainty, are performed in parallel, while the simpler prediction operations based on these three inputs is performed serially.

Figure 31:
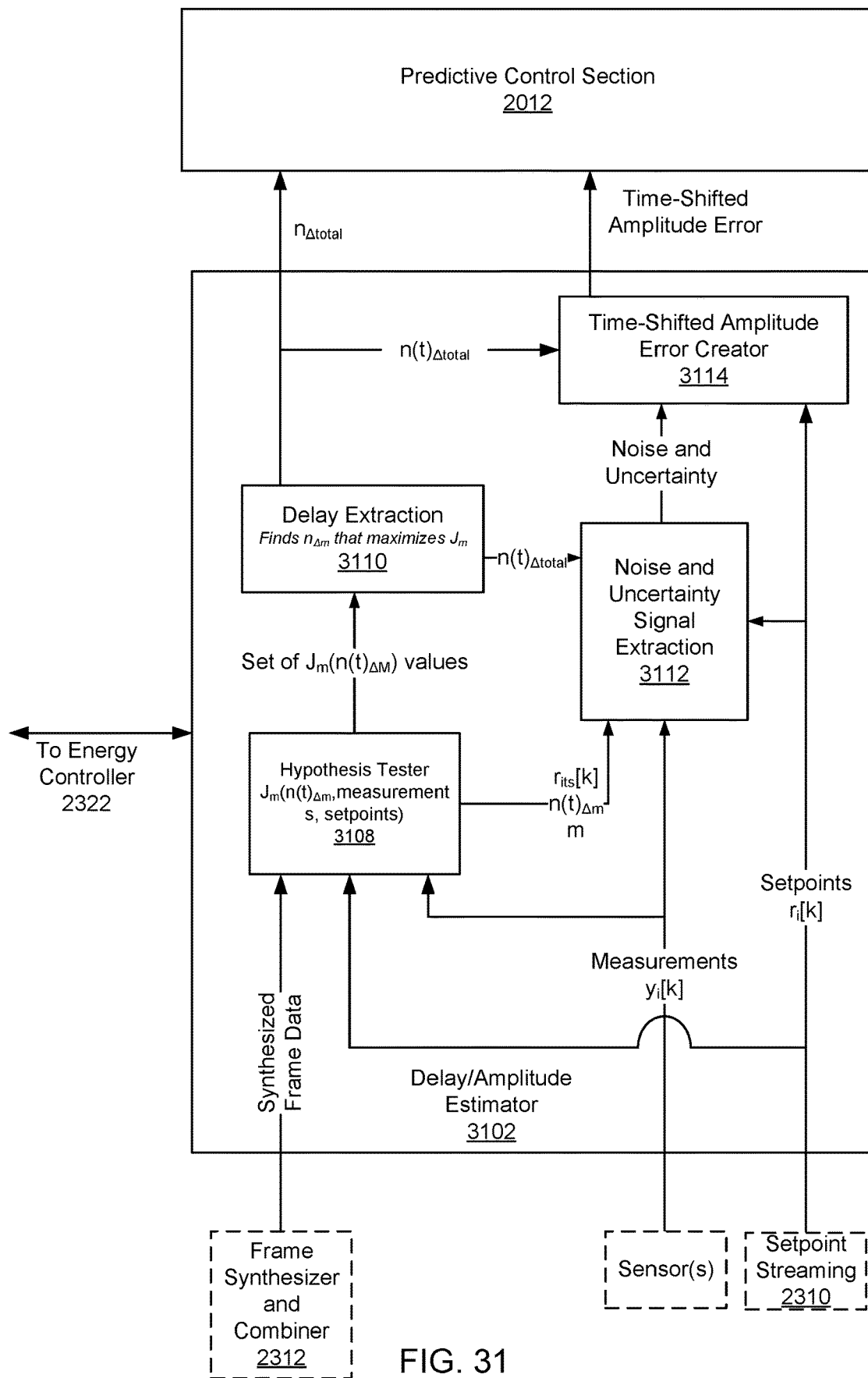
FIG. 31 illustrates an embodiment of the delay/amplitude estimator.

FIG. 31 illustrates an embodiment of the delay/amplitude estimator 3102 configured to receive or access synthesized frame data (data that has been cleaned and filtered to remove irrelevant inputs), setpoints, and measurements for one or more control parameters as inputs. In some embodiments, the delay/amplitude estimator 3102 can be part of a plasma processing system. From these inputs, the delay/amplitude estimator 3102 produces two outputs: a total estimated time delay for the system $n(t)_{\Delta total}$ (hereinafter referred to as "total delay", "total time delay" or "delay") and a time-shifted amplitude error. The time-shifted amplitude error largely accounts for (or encompasses) at least noise and dynamic uncertainty among other lesser sources of amplitude error. Time-shifted refers to the fact that setpoints are time-shifted (i.e., delayed) by the determined total time delay, before the time-shifted amplitude error is determined. These outputs are provided to a predictor (e.g., 2306 in FIG. 23A) of the predictive control section 2012, which uses them to predict how the control signal(s) and/or actuator output(s), when based on the delay and time-shifted amplitude error, will react to potential control signal changes—in advance of actually changing the control signal(s). By predicting how the actuator output(s) and/or energy dissipation will be affected (in advance of actually changing the control signals to the actuators) the predictive control section 2012 may preemptively adjust the control signal(s) to achieve desired results and maintain the output within a threshold range. For example, based upon predicted-control-signal outputs the predictive control section 2012 may adjust the control outputs to: reduce a time it takes to achieve a desired output of the actuator(s); to reduce energy dissipation; to prevent damaging over voltage and/or over current conditions; and/or to achieve any desired balance between speed, accuracy, and energy.

The delay/amplitude estimator 3102 can include a hypothesis tester 3108, a delay extraction 3110, a noise and uncertainty signal extraction 3112, and a time-shifted amplitude error creator 3114. The hypothesis tester 3108 can determine metrics for any extraction algorithm. For instance, in the illustrated embodiment, the hypothesis tester 3108 takes setpoints for the one or more actuators and corresponding measurements for the one or more actuators (i.e., what was the output from previous setpoints), and performs a group of cross correlations between the setpoints and measurements using a set of delay guesses, $n(t)_{\Delta m}$, (or "delay guesses") to determine a set of cost functions $J_m(n(t)_{\Delta m})$ (and cost function values) as given by Equation 3:

$$J_m(n(t)_{\Delta m}) = \Sigma_{l=1}^{n_l} \Sigma_{k=n_\Delta}^{n_k} \Sigma_{i=1}^{n_i} [\{y_i[k] r_i[k-n(t)_\Delta] \alpha_l\} * \{\mu_l y_i[k] \log_2(r_i[k-n(t)_\Delta])\}]$$ (Equation 3)

Where m is an index of the set of delay guesses, $n(t)_{\Delta m}$, and each cost function $J_m(n(t)_{\Delta m})$ value is associated with setpoints that are time shifted by the corresponding delay guess, $n(t)_{\Delta m}$. These time-shifted versions of the setpoints (or target values of the reference signal) can be denoted $r_{its}[k]$. In other words, $r_{its}[k]$ is a delayed or time-shifted version of the input setpoints $r_i[k]$. Probing the cost function, $J_m(n(t)_{\Delta m})$, for multiple frames, k, based on the target values of the setpoints and the corresponding actual parameter values achieved at the output, may involve a cross correlation between measurements or the corresponding actual parameter values, $y_i[k]$, and the time-shifted setpoints, $r_i[k-n(t)_{\Delta m}]$, where the target values of the setpoints $r_i[k]$ are delayed by a delay guess $n(t)_{\Delta m}$. The cross correlation allows probing of different delay guesses, $n(t)_{\Delta m}$, in the set of delay guesses, to see which one minimizes an error between time-shifted setpoints and measurements. The innermost summation across $n_i$ accounts for the frames, the middle summation across $n_k$ accounts for the samples k in a given frame i, and the outermost summation across $n_l$, accounts for $\alpha_l$ and $\beta_l$ coefficients which can be used for consecutive samples (i.e., sample sets) in the same frame, hence leading to multiple sets of samples.

The variables $\alpha_l$ and $\beta_l$ are design parameters specified during design, calibration, and tuning to allow better scaling of the values to fit into real hardware. They can be considered part of the first model or Model 1 (depicted in FIGS. 23A and 23B). The * operator represents tensorial manipulation. The summation operations allow parallelization of frames for different control paths (i.e., for a MIMO system), and while three nested summations are shown, other combinations can also be utilized without departing from the scope and intent of this disclosure. In the illustrated embodiment, parallelization is achieved over four dimensions, though the disclosure is scalable to more dimensions depending on the problem. The results of each cost function operation can be stored in memory (e.g., 3308 in FIG. 33) for all tested values of the delay guesses $n(t)_{\Delta m}$. The system is configured to calculate an instance of the total delay, $n(t)_{\Delta total}$, for each of the parallelized frames. While Equation 3 demonstrates a specific cost function, this is illustrative only, and various other cost functions known to those of skill in the art can be utilized to find the best delay guess $n(t)_{\Delta m}$.

To enhance the use of limited computing resources, the measurements and setpoints can be grouped into frames and parallelized. Equation 3 assumes such frame treatment of the data, and thus i is used to denote the frame and k to denote the sample number. The cost function can be evaluated in parallel (e.g., over four dimensions) due to this tensorial approach (where setpoints and measurements are split into multiple frames such that r and y are matrices (or tensors where multiple inputs and/or outputs are utilized and thus each r and y is a matrix of a matrix)). The measurements in Equation 3 can be expressed as a tensor $y_i[k]$, wherein i corresponds to the parallel frame number "i". The tensor $y_i[k]$ corresponds to the different inputted measurements and controls as a function of the frame "i" and sample "k" such that $\{i=1, \ldots, n_f\}$ and where k is the sample number for each measurement with the parallel frame "i" such that $\{k=1, \ldots, n_s\}$. The setpoints can be expressed as another tensor $r_i[k]$ where i corresponds to the parallel frame number "i", and the setpoint(s) can be an arbitrary waveform. The tensor $r_i[k]$ corresponds to the different setpoints as a function of the frame "i" and sample "k" such that $\{i=1, \ldots, n_f\}$ and where k is the sample number for each setpoint with the parallel frame "i" such that $\{k=1, \ldots, n_s\}$.

With delay guesses plugged into each element in the set of cost functions $J_m(n(t)_{\Delta m})$, the delay extraction 3110 can then determine a best delay or total delay $n(t)_{\Delta total}$ that maximizes the cost function $J_m(n(t)_{\Delta m})$ for a given frame. In other words, the delay extraction 3110 finds the $J_m(n(t)_{\Delta m})$ function corresponding to a time-shifted set of setpoints, $r_{its}(k)$, that is best aligned with the synthesized frame data.

Part of Equation 3, or any cost function, likely involves time-shifted sets of setpoints, $r_{its}[k]$, one for each cost function $J_m(n(t)_{\Delta m})$ value, and these time-shifted sets of setpoints, $r_{its}[k]$, can be passed to the noise and uncertainty signal extraction (NUE) 3112. By time-shifted, it is meant that each setpoint is delayed by $n(t)_{\Delta m}$. The total delay $n(t)_{\Delta total}$ can be passed to both the NUE 3112 and the predictive control section (e.g., the predictive control section 2012 in FIGS. 20, 21, and/or 23A). One will appreciate that since a total delay for each frame is determined, $n(t)_{\Delta total}$ is a tensor having values for each frame and where there may be different total delays for different control paths.

The NUE 3112 takes the total delay $n(t)_{\Delta total}$ from the delay extraction 3110 and the time-shifted versions of the setpoints, $r_{its}[k]$, from the hypothesis tester 3108, selects a one of the time-shifted setpoint discretized waveforms corresponding to the total delay $n(t)_{\Delta total}$, which can be called the "selected time-shifted setpoints," and removes the delay from the comparison between measurements and setpoints via Equation 4:

$$NIU_i[k] = r_{its}[k] - y_i[k] \quad \text{(Equation 4)}$$

Where $NIU_i[k]$ is an amplitude difference between the selected time-shifted setpoints and the measurements. In other words, while an amplitude difference could be determined from the raw measurements and setpoints, any time delay that existed would lead to an inaccuracy in the amplitude difference since it wouldn't be taken from phase-aligned waveforms or data sets. To overcome this, the setpoints are time-shifted or delayed, by the total delay $n(t)_{\Delta total}$, and then the difference between the time-shifted setpoints and the measurements is taken. In some embodiments, the $NIU_i[k]$ can be passed directly to the predictive control section 2012 and used to predict outputs based on a control signal. However, further information can be gleaned from the $NIU_i[k]$, such as noise and dynamic uncertainty, and these can then be passed to the predictive control section 2012 to provide more robust control than the $NIU_i[k]$ alone provides. Therefore, in preferred embodiments, the $NIU_i[k]$ is further analyzed rather than being passed directly to the predictive control section 2012.

The time-shifted amplitude difference, $NIU_i[k]$, can be broken up into at least two primary portions: noise and dynamic uncertainty. And these can then be used to create bounds on the control signal in the predictive control section 2012. One way to develop these bounds, is to remove the noise from the measurements, and then use the denoised time-shifted amplitude difference to find the dynamic uncertainty. Optionally, the known dynamic uncertainty can then be plugged back into a model of the bounded measurements to determine the noise.

In an embodiment, aligned sample points in a set of frames can be averaged to get an average value for that sample point across the set of frames, which effectively neutralizes the influence of noise. For instance, a measurement with a repeating pattern of power pulses could be broken into four frames, each frame having the same setpoint waveform, but slightly different output measurements due to noise and uncertainty. For each sample point k, there will be four data values—one for each frame. Given the identical setpoints for each of the four frames, an ideal system would produce four identical outputs or measured signals/values. However, in reality the four measured points at the same sample point in the four frames are different—at least in part due to noise. By taking an average of these four measured sample points, and knowing that taking an average of a noisy signal over a sufficient period of time will neutralize or average out the noise, the resulting average largely represents the output without noise (i.e., removes the influence of noise). So, for the four exemplary frames, an average across all four frames can be taken at each sample point to give a single averaged frame with a waveform that is an average of the four frames and thus at least somewhat free from noise. This can be called an average frame or a denoised frame or set of measurements. One of skill will appreciate that this noise reduction is enhanced and gets more accurate as the number of frames increases. It should also be noted that this is just one of many denoising processes that can be implemented in the NUE.

Figure 32:
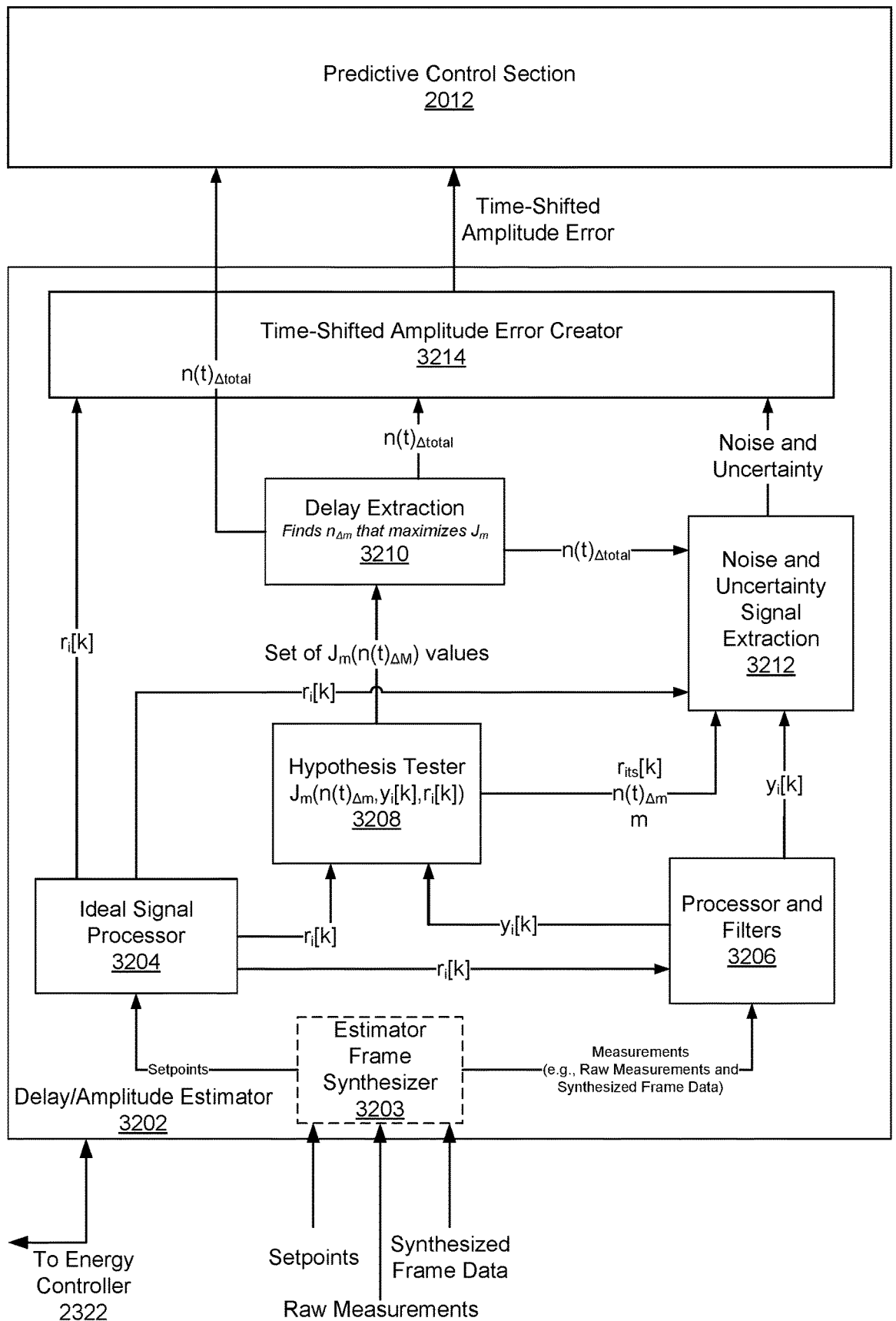
FIG. 32 illustrates another embodiment of the delay/amplitude estimator.
Figure 33:
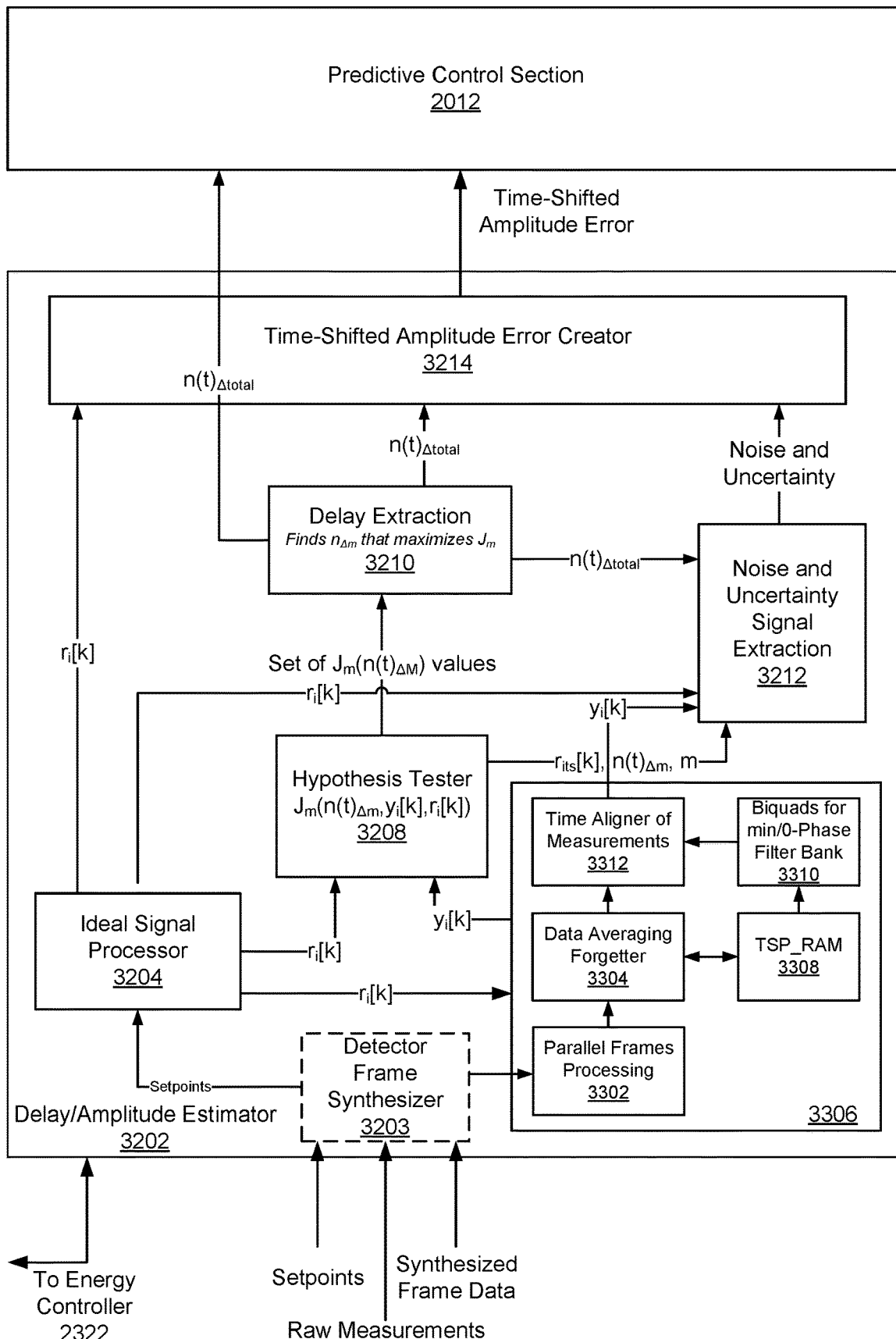
FIG. 33 illustrates a delay/amplitude estimator, with a specific embodiment of the processor and filters.

Although not shown in FIGS. 31-33, in some embodiments, an optional energy controller 2322 can issue an offset to be added or subtracted from the total delay $n(t)_{\Delta total}$ computed to account for more optimized energy consumption.

Figure 36:
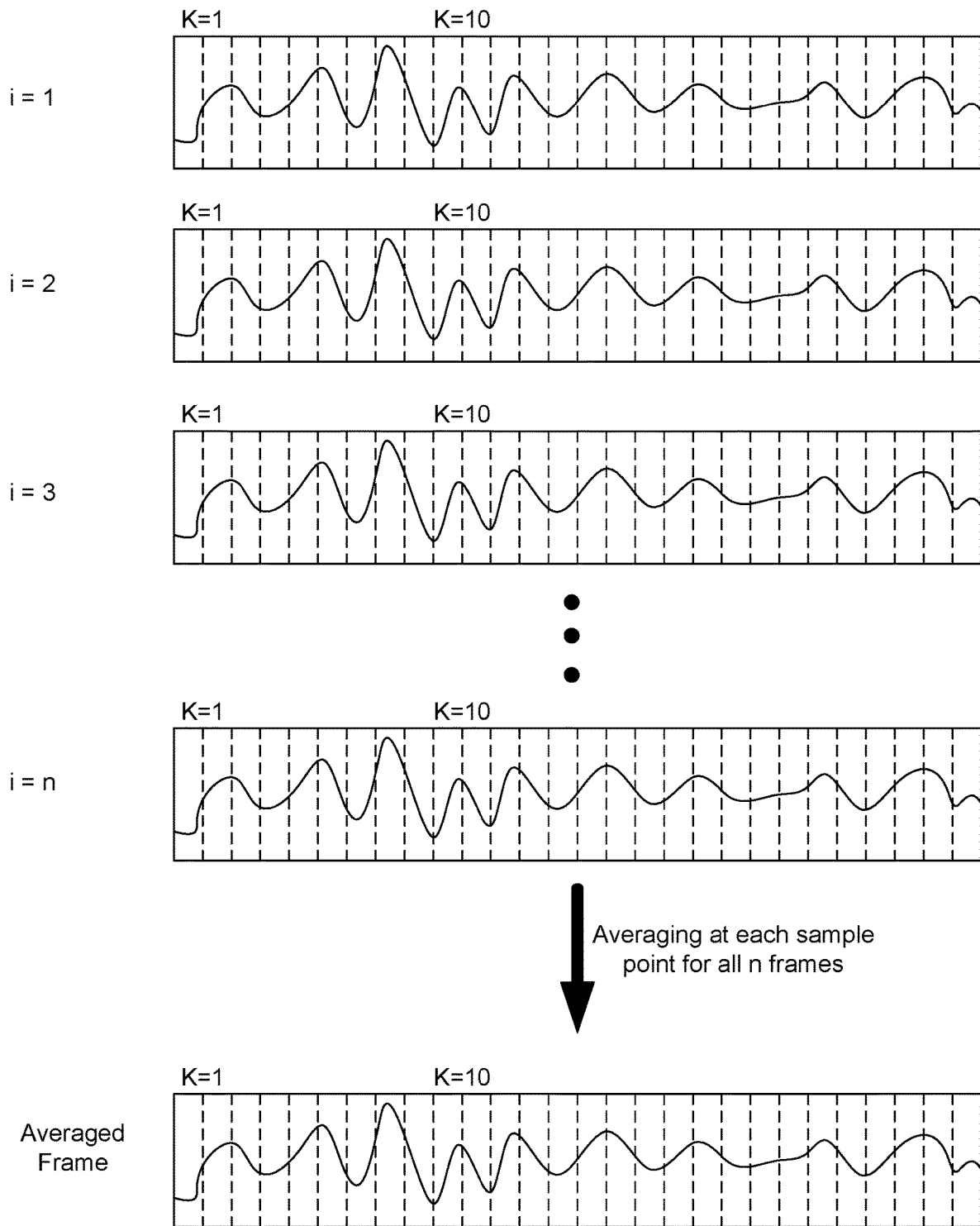
FIG. 36 provides an illustrative example of the denoising process.

FIG. 36 provides an illustrative example of the denoising process in the NUE. A repeating arbitrary waveform is split into n frames, with the first three and the $n^{th}$ frames being shown in the figure. Each frame takes a repeating portion of the arbitrary waveform, such that the data in each frame should be aligned by sample points k with each other. For instance, looking at sample k=10, one sees that the measured data is largely at the same amplitude and has largely the same decreasing slope, though some variations between the frames exists due to noise and dynamic uncertainty. For each sample point k, an average across all n frames can be taken to give a corresponding sample point in an output averaged frame. By taking an average across all frames, the averaged frame largely removes noise, which then allows the NUE to home in on and identify dynamic uncertainty.

If there was any misalignment between frames, for instance, where a waveform changes over time (e.g., due to different periods in a plasma processing recipe), then frames can be denoised in batches so that averaging is performed over aligned frames in one batch and aligned frames in a second batch, etc. Where such misalignment occurs, there will be multiple averaged output frames. In the illustrated example, all frames are aligned so only a single output averaged frame results. Although FIG. 36 is illustrated in terms of an arbitrary waveform, pulsed and more regularized waveforms can also be denoised via the illustrated averaging method.

This denoising effectively removes the noise portion from the $NIU_i[k]$, thus leaving primarily the dynamic uncertainty portion, which can be denoted as $u_d[k]$. From here, the difference between the denoised time-shifted amplitude difference, $NIU_i[k]$, and the setpoints gives the average dynamic uncertainty, $u_d[k]$. This average dynamic uncertainty can then be used to derive the noise, denoted AWGN ($\sigma^2$) (although it was previously removed, the averaging process does not allow the noise to be known). More specifically, the average dynamic uncertainty can be removed from the raw measurements, and then the raw measurements can be removed from the result to give the noise. A standard deviation, a, of the noise can then be determined.

With the noise and dynamic uncertainty known, Equation 5 can be used to ascertain a bounded set of measurements (or worst-case scenario for noise and dynamic uncertainty) as:

$$y_i[k]_{wc} = r_{its}[k] + / - \|AWGN(\sigma^2)\|_{L_1} + / - \|u_d[k]\|_{L_1} \quad \text{(Equation 5)}$$

Where $y_i[k]_{wc}$ is a worst case or bounded set of measurements assuming the setpoints $r_i[k]$. This can also be referred to as the bounded uncertain noisy waveform of the controlled system. The worst-case scenario for the noise found in the denoising process is represented by the $L_1$ norm of the additive white gaussian noise (found form the $NIU_i[k]$) times the square of the variance in that noise, or $\|AWGN(\sigma^2)\|_{L_1}$. The $L_1$ norm takes a maximum value of the element within the brackets and is thus the maximum of the additive white gaussian noise whose distribution is characterized by a zero mean and a variance that corresponds to this maximum value. The worst-case scenario for the dynamic uncertainty is found as the $L_1$ norm of the dynamic uncertainty $u_d[k]$ found from the $NIU_i[k]$. In other words, Equation 5 provides the time-shifted setpoints plus or minus the maximum noise and plus or minus the maximum dynamic uncertainty, and these three elements together give a bounded or worst-case set of measurements, $y_i[k]_{wc}$ assuming the setpoints $r_i[k]$.

Although average dynamic uncertainty has been described, this value is mathematically without distinction in this application from uncertainty, disturbance, and parametric uncertainty and these terms can be used interchangeably.

The NUE 3112 passes the worst case or bounded set of measurements $y_i[k]_{wc}$, or just the $L_1$ norms of noise and dynamic uncertainty (i.e., $\|AWGN(\sigma^2)\|_{L_1}$ and $\|u_d[k]\|_{L_1}$), to the time-shifted amplitude error creator 3114. These values along with the total delay $n(t)_{\Delta total}$ can be used to generate the time-shifted amplitude error, details of which are provided relative to FIG. 34. The time-shifted amplitude error creator 3114 passes the time-shifted amplitude error to the predictive control section 2012 and the delay extraction 3110 passes the total delay $n(t)_{\Delta total}$ to the predictive control section 2012. In other words, the delay/amplitude estimator section 3102 passes a total time delay and a total amplitude error (after time-shifting the setpoints) to the predictive control section 2012.

The predictive control section 2012 utilizes the total time delay and the time-shifted amplitude error, to control one or more actuators whose net effect is to control one or more outputs of the system. In other words, it can predict the bounds of the control effects such that the minimum performance requirements can be maintained where operation is at the bounds and better performance can be achieved when operating within the bounds. More specifically, the predictive control section 2012 uses these values to predict how the control signal(s) and or actuator output(s) will react to potential control signal changes—in advance of actually changing the control signals. By predicting how the actuator outputs will be affected (in advance of actually changing the control signals to the actuators 2008) the predictive control section 2012 may adjust the control signals to achieve desired result. For example, based upon predicted-control-signal outputs the predictive control section may adjust the control outputs to: reduce a time it takes to achieve a desired output of the actuator(s); reduce energy dissipation; prevent damaging over voltage and/or over current conditions; and/or to achieve any desired balance between speed, accuracy, and energy.

It should be noted that $n(t)_{\Delta total}$, $n(t)_\Delta$, and $n_d$ are not scalars, but can be vectors, matrices, or tensors depending on the number of inputs and outputs of the system. In its simplest manifestation it is a vector that corresponds to the delays associated with different inputs and outputs, it becomes a matrix when for example the delays are also dependent on the input/output levels (very common in RF Amplifiers is the presence of deadtime), and if the other entities are also affecting the values such as device tolerances, temperature region, reflection coefficients (just to mention a few) then $n(t)_{\Delta total}$ becomes a tensor. For instance, each control/actuator path in the system between input and actuator control may include different paths and thus a different internal delay $n_d$. For instance, a rail, frequency, and drive actuator can each have a different internal delay, $n_d$. Similarly, these three actuators may each involve a different delay depending on the product in which they are implemented. For instance, a different chipset in the controller of three different products, each having the same rail, frequency, and drive actuator, can lead to an internal delay tensor, $n_d$, having nine values.

It should also be noted that the total delay $n(t)_{\Delta total}$ can be a simple delay such as the difference between a reference signal and an actuator output measurement. However, more complex delays can also be determined based on several constitute delays such as those inside and outside of the actuator(s) (e.g., internal delays within an actuator and external delays outside of an actuator). In one example, the total delay $n(t)_{\Delta total}$ is a function of both system and device delay (e.g., 2314 and 2316 in FIG. 23A). More specifically, the total delay $n(t)_{\Delta total}$ can include an internal delay, $n_d$, due to computations which are determined by the processor design (e.g., FPGA and/or CPU design). This internal delay, $n_d$, corresponds to the number of samples between receiving an input to the control section and generating a control output. This value is known from the factory and thus is not calculated by the system disclosed herein, but rather is retrieved from memory. An unknown delay, $n(t)_\Delta$, is what this disclosure seeks to determine. This unknown delay, $n(t)_\Delta$, when added to the known internal delay, $n_d$, gives the total delay $n(t)_{\Delta total}$ as Equation 6:

$$n(t)_{\Delta total} = n(t)_\Delta + n_d \quad \text{(Equation 6)}$$

Despite this definition of the total delay, $n(t)_{\Delta total}$, in practice hardware limitations may lead to alternative estimations of the total delay. For instance, where resources are more limited, one can assume $n(t)_{\Delta total} = n(t)_\Delta$. Alternatively, one can assume $n(t)_{\Delta total} = n(t)_\Delta = n_d$ and then use a convergence algorithm to more accurately determine $n(t)_\Delta$. Additionally, those of skill in the art may account for the internal delay, $n_d$, in various ways without departing from the scope and intent of this disclosure. For instance, despite the definition of Equation 6, $n_d$, can be accounted for at any of various locations, or hardcoded into certain algorithms, such that it need not be used in processing and thereby memory and processing resources can be conserved.

In some embodiments, the setpoints can be provided by the user interface (UI) 108 as shown in FIG. 21 (e.g., in the form of a target multi-level pulsed waveform) or the setpoint streaming module 2310 of FIG. 23A (e.g., in the form of setpoints). The setpoint streaming module 2310 can create a waveform from a set of discrete setpoints. The setpoints or synthesized frame data can be provided to the hypothesis tester 3108 and the time-shifted amplitude error creator 3114.

In some embodiments, the measurements of parameters of the actuator(s) output can be obtained from one or more sensors, such as the sensor(s) 905 in FIGS. 20 and/or 21. For instance, the sensor(s) may reside in a power generation section of the system, such as power generation and sensors 914 in FIG. 21. The measurements can be provided to the hypothesis tester 3108 and the noise and uncertainty signal extraction 3112.

FIG. 32 provides an alternative embodiment of a delay/amplitude estimator 3102 where processing of the setpoints and measurements occurs before signals reach the hypothesis tester. The delay/amplitude estimator 3202 is configured to receive or access synthesized frame data (data that has been cleaned and filtered), setpoints, and measurements for one or more control parameters as inputs, and produces two outputs: a total estimated time delay for the system, nonoral, and a time-shifted amplitude error. These outputs are provided to a predictor (e.g., 2306 in FIG. 23A) of the predictive control section 2012, which uses them to predict results of applying the delay and time-shifted amplitude error to a control signal, and to further modify the control signal based on this prediction to provide more robust control signals for one or more actuators such as RF and DC/rail drivers of a plasma processing system.

As with FIG. 31, the delay/amplitude estimator 3202 can include a hypothesis tester 3208, a delay extraction 3210, a noise and uncertainty signal extraction 3212, and a time-shifted amplitude error creator 3214, which all operate in a similar fashion to the identically named elements in FIG. 31, and thus the descriptions of those elements apply equally to FIG. 32.

What is primarily different in FIG. 32 is that the inputs are provided to an optional estimator frame synthesizer 3203 that parallelizes the incoming signals into frames for parallel use within the delay/amplitude estimator 3202. In particular, the estimator frame synthesizer 3203 splits the inputted frames into frames that are the same size and can be highly parallelized. When operating on synthesized frame data, the estimator frame synthesizer 3203 may change some frames based on setpoints and measurements, for instance where there is a mismatch between clocking of a CPU and an FPGA. The setpoint frames can be passed to an ideal signal processor 3204, which generates a matrix or tensorial representation of the setpoint frames as $r_i[k]$, where i is the frame number and k is the sample number. In other words, the ideal signal processor 3204 determines the desired setpoint frames and data as well as characteristics of the waveforms (e.g., periodicity, rise time, settling time, overshoot, etc.) as detailed in U.S. patent application Ser. No. 17/509,539, filed Oct. 25, 2021, entitled Robust Tensorized Shaped Setpoint Waveform Streaming Control which is incorporated by reference. The measurements, for instance raw measurements and synthesized frame data, are passed to the processor and filters 3206, which generates a matrix or tensorial representation of the measurements as $y_i[k]$. Both of these matrices or tensors, $r_i[k]$ and $y_i[k]$, are passed to the hypothesis tester 3208, where operation continues as described in FIG. 31. Additionally, the ideal signal processor 3204 passes the setpoint frames $r_i[k]$ to the time-shifted amplitude error creator 3214, the NUE 3212, and the processor and filters 3206. Further, the processor and filters 3206 pass the measurement frames $y_i[k]$ to the NUE 3212.

One will appreciate that the functionality of the delay/amplitude estimator 3102 and 3202 and the predictive control section 2012 may be carried out in parallel or may be serially effectuated.

FIG. 33 illustrates the delay/amplitude estimator 3202, with a specific embodiment of the processor and filters 3206. The embodiment of the processor and filters 3306 includes a parallel frames processing component 3302 that receives the parallel measurement frames $y_i(k)$ from the estimator frame synthesizer 3203.

To process the data in real-time, tale data can be flushed. However, instead of merely deleting this stale data, the stale data can be filtered into a smaller data set and stored in memory such as TSP_RAM 3308 to be recalled when needed. To align 3312 the measurements with respect to phase shift (which appears due to the measurement system), the processor and filters 3306 passes the measurements through a minimum/zero-phase filter bank 3310 whose coefficients are also stored in the memory (e.g., 3308), and deployed into biquads in real-time. Stale data that is not filtered and stored can be flushed via data averaging forgetter 3304.

All other aspects of FIG. 33 are substantially similar to FIG. 32 and the descriptions relative to FIG. 32 are equally applicable to FIG. 33 and will not be repeated for the sake of brevity.

Figure 34:
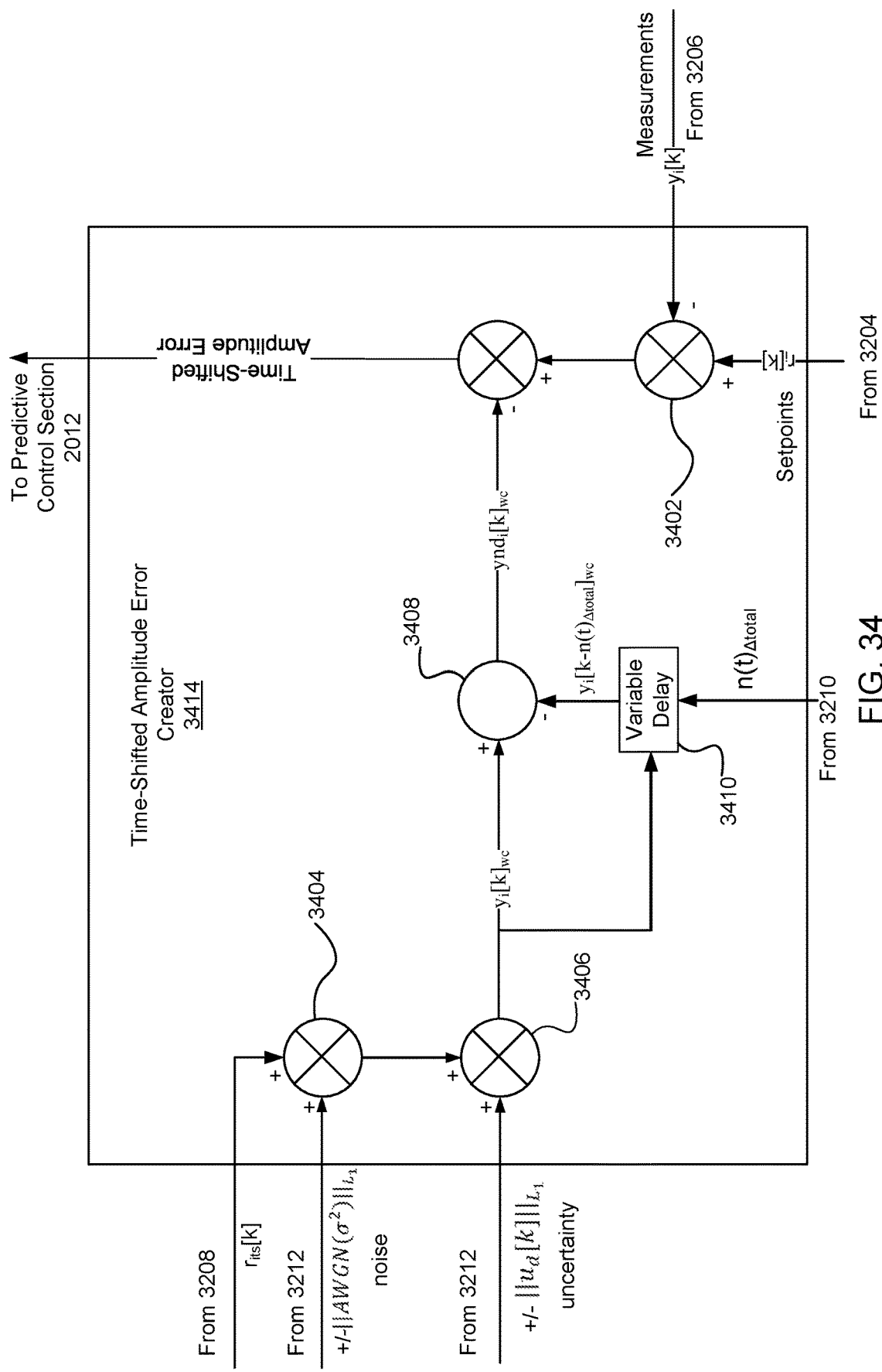
FIG. 34 illustrates details of a time-shifted error creator that may or may not be the same as the time-shifted error creators shown in FIGS. 31-33.

FIG. 34 illustrates details of a time-shifted amplitude error creator that may or may not be the same as the time-shifted amplitude error creators 3114 and 3214 shown in FIGS. 31-33. This time-shifted amplitude error creator 3414 is responsible for taking the total delay, the measurements, the setpoints, the time-shifted setpoints, and the $L_1$ norms of the noise and average dynamic uncertainty, and generating the time-shifted amplitude error that is then used by the predictive control section to generate a control signal for the actuator(s). More specifically, a difference between the measurements and setpoints is found at 3402. Another input to 3414 can be the bounded or worst case set of measurements, $y_i[k]_{wc}$, or as shown, the time-shifted setpoints, $r_{its}[k]$, and the $L_1$ norms can be inputs to the time-shifted amplitude error creator 3414, and the bounded or worst case set of measurements, $y_i[k]_{wc}$, can be determined within the time-shifted amplitude error creator 3414 via 3404 and 3406. In other words, the $L_1$ norms can be added to the time-shifted setpoints, $r_{its}[k]$, to give the bounded or worst case set of measurements, $y_i[k]_{wc}$. The variable delay 3410 takes the total time delay $n(t)_{\Delta total}$ and determines how to shift the bounded or worst case set of measurements, $y_i[k]_{wc}$ (e.g., by how many samples). Finding $y_i[k]_{wc}$ minus $y_i[k-n(t)_{\Delta total}]_{wc}$ at 3408 gives $ynd_i[k]_{wc}$, which is the noise and disturbance in the output corrected for the total time delay, $n(t)_{\Delta total}$. The output $ynd_i[k]_{wc}$ is then subtracted from the result of 3402 as $(r_i[k]-y_i[k])-(ynd_i[k]_{wc})$ to give the time-shifted amplitude error. These operations can also be written as $(r_i[k]-y_i[k])-(y_i[k]_{wc}-y_i[k-n(t)\Delta total]_{wc})$.

Figure 35:
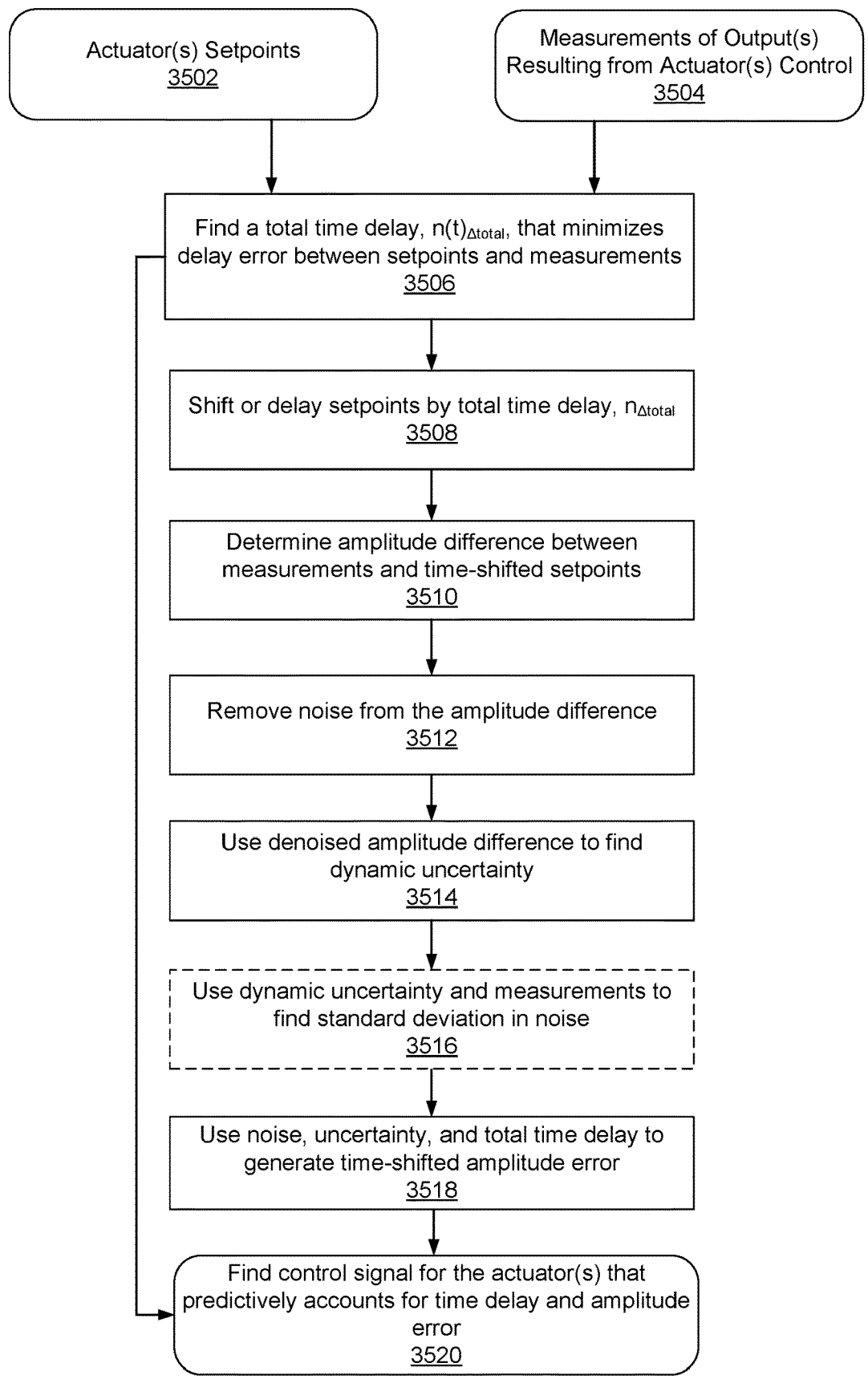
FIG. 35 is a flowchart depicting a method of predictive control.

FIG. 35 illustrates a method of predictive control that starts with user-provided setpoints or a setpoint waveform (Block 3502) and raw measurements of a control output resulting from the setpoints (Block 3504). These inputs are compared, for instance, in a cross correlation using a cost function, $J_m$, and a set of time delay guesses, $n_{\Delta m}$, to find a one of the time delays, $n_{\Delta total}$, that minimizes a time error between the setpoints and the measurements (Block 3506). This total time delay, $n_{\Delta total}$, can be used to shift or delay the setpoints (Block 3508) and an amplitude difference between the time-shifted setpoints and the measurements can be found (Block 3510). Noise can then be removed from this time-shifted amplitude (Block 3512), for instance by averaging aligned sample points across multiple frames of data, and then an average dynamic uncertainty can be found from the denoised time-shifted amplitude difference (Block 3514). Optionally, the average dynamic uncertainty along with the measurements can then be used to ascertain the standard deviation, a, of the noise (optional Block 3516). The total time delay, $n(t)_{\Delta total}$, along with the noise and dynamic uncertainty (or just the denoised time-shifted amplitude difference and the dynamic uncertainty) can be used to determine a time-shifted amplitude error (Block 3518). This time-shifted amplitude error and the total time delay, $n(t)_{\Delta total}$, can then be used to find a control signal for controlling one or more actuators (Block 3520), where the control signal is configured to affect an actuator change before a setpoint of that actuator occurs while maintaining the output within bounds. Further modifications to the control signal via a predictor can also be implemented as discussed elsewhere in this disclosure.

In some embodiments, finding a total time delay, $n(t)_{\Delta total}$, can involve providing a set of cost functions $J_m$ in terms of: (1) delay guesses $n(t)_{\Delta m}$, where m is a number of guesses that are tested; and (2) the tensorial representations of the setpoint and measurement frames $r_i[k]$ and $y_i[k]$. For instance, this can occur in a hypothesis tester such as 3108 or 3208 in FIGS. 31 and 32, respectively. Finding the total time delay, $n_{\Delta total}$, can further involve finding a one of the delay guesses $n(t)_{\Delta m}$ that maximizes the cost function $J_m$ and denoting this as the total time delay, $n(t)_{\Delta total}$. This can occur, for instance, in a delay extraction, such as 3110 or 3210 in FIGS. 31 and 32, respectively. In some embodiments, the method of FIG. 35 can use cross correlation between the setpoint and measurement frames $r_i[k]$ and $y_i[k]$ for different delay guesses $n(t)_{\Delta m}$ to find the total time delay, $n_{\Delta total}$.

Finding the noise and dynamic uncertainty is intended to provide bounds for the eventual control signal that is developed. In other words, the control signal should account for a worst case of noise and dynamic uncertainty and thus, the $L_1$ norm of noise and dynamic uncertainty is used to determine coefficients that are used to generate the time-shifted amplitude error (B lock 3518). For instance, an NUE, such as 3112 or 3212 in FIGS. 31 and 32, respectively can pass the $L_1$ norms of noise $\|AWGN(\sigma^2)\|_{L_1}$ and dynamic uncertainty $\|u_d[k]\|_{L_1}$ to a time-shifted amplitude error creator, such as 3114 or 3214 in FIGS. 31 and 32, respectively.

For the purposes of this disclosure, the time delays, $n(t)_d$, $n(t)_\Delta$, $n(t)_{\Delta m}$, and $n(t)_{\Delta total}$, have units of number of samples, though other units of time can also be implemented with minor variations to the operations herein disclosed. The nomenclature $n(t)$ indicates that these delays are functions of a continuous time. However, in some embodiments, the delays can be discretized in terms of sample points rather than a continuous timescale.

Although the implementations shown in FIGS. 31-36 allow slower hardware to achieve gains, additional functionality and performance is possible via a multi-step ahead predictor, which is described relative to FIGS. 37-41.

FIG. 37A depicts a graph 3700-$a$ of normalized signal amplitude against time for a controlled parameter, according to various aspects of the present disclosure. The normalized signal amplitude may correspond to measured data of a first signal, such as the signal measured at the output of an actuator (e.g., RF Driver 902, DC/Rail Driver 904, Power Amplifier 906), the feed forward power, reflected power, reflection coefficient, or any other applicable signal that can be measured in the system and controlled via a control signal. Graph 3700-$a$ depicts two waveforms 3702-$a$ and 3702-$b$, where waveform 3702-$a$ is produced in response to control signals generated by implementation of a multi-step ahead prediction algorithm (e.g., in the predictive control section 2012), while waveform 3702-$b$ is produced in response to control signals generated by a prior art control algorithm. Graph 3700-$a$ further shows the setpoint/reference amplitude, also referred to as the target value, desired for the measured signal. As noted above, the setpoints can be provided by the user interface (UI) 108 as shown in FIG. 21 (e.g., in the form of a target multi-level pulsed waveform) or the setpoint streaming module 2310 (e.g., setpoint streaming modules 2310A, 2310B) of FIG. 23B (e.g., in the form of setpoints). The setpoint streaming module 2310 can create a waveform from a set of discrete setpoints.

Some aspects of the present disclosure are directed to a multi-step ahead predictor configured for internally estimating and/or predicting the response of a non-linear system, such as, but not limited to, a non-linear and chaotic plasma chamber/generator, to a control actuation. In some cases, the predictive control section 2012 in FIG. 23B may perform one or more internal computations/operations between adjacent measurements. For instance, the predictor 2306 may perform one or more internal computations without the measurements corresponding to the controls issued by the controller 2308 being available for one or more internal clock cycles for a multitude of reasons, e.g., actuation hardware (e.g., power amplifier, match, DC Rail, etc.) is much slower than the controller, sensing hardware is incapable of measuring the raw data needed to be input to the controller to compute the actuation value, sensing hardware has a failure and is no longer usable (temporarily and/or indefinitely), sensing hardware is subject to high levels of noise and/or interference, and sensing hardware needs to be recalibrated, to name a few non-limiting examples.

As seen, graph 3700-$a$ depicts one or more internal clock cycles (shown by the short, dotted arrows) and one or more clock cycles (shown by the longer dashed arrows). In this example, there are eight (8) internal clock cycles for each clock cycle and the measurement data is available every eight internal clock cycles. FIG. 37A depicts when new measurement data comes into the predictive control section 2012 with the triangle symbol. For instance, measurement data comes in at time $t=t_k$, $t_{k+n}$, $t_{k+2n}$, and so on. During the internal clock cycles (e.g., $t=t_{k+1} \ldots t_{k+n-1}$), there may be no measurement data available. However, according to aspects of the present disclosure, the predictive control section comprising at least the predictor 2306, a second model of the system (e.g., Model 2), and the controller 2308 may compute internal control signal values and predicted internal measurements (e.g., in response to said computed internal control signal values) to enhance the quality of the control output (e.g., actuator control) sent out by the controller 2308 when the next measurement is available.

FIG. 37B depicts a graph 3700-$b$ of control output values used to adjust an actuator against time, according to various aspects of the present disclosure. Control signal waveform 3705-$a$ may be an example of the control output/actuator control generated by the predictive control section 2012 and used to produce the measurement data seen in waveform 3702-$a$ in FIG. 37A, in accordance with aspects of the present disclosure. Further, control signal waveform 3705-$b$ may be an example of a control output/actuator control generated by a prior art control algorithm and used to produce the measurement data seen in the waveform 3702-$b$. As seen, graph 3700-$b$ shows a plurality of control signal values 3720-$a$, 3720-$b$, and 3720-$c$ that are actually sent out to an actuator, and a plurality of internal control signal values 3715 that are computed for one or more of the internal clock cycles between measurements. For instance, at time $t=t_k$, the controller 2308 sends a first control signal 3705-$a$ to the actuator, where the first control signal 3705-$a$ is based on a previous/most recent internal control signal value 3720-$a$ computed by the controller 2308, for instance, for a last internal clock cycle of the previous clock cycle.

In accordance with various aspects of the present disclosure, the predictive control section 2012 may compute internal control signal values 3715 between time $t_k$ and $t_{k+n}$ until the next measurement is available. In some cases, the internal control signal values 3715 may be computed based on the most recent measurement available (e.g., measurement at time $t_k$). For example, the controller may feedback a first internal control signal value 3715, shown as $u_{k+1}$ in FIG. 40, to the predictor 2306 based on the measurement. The predictor 2306 then computes a predicted internal measurement ($x_{k+1}$ in FIG. 40) for the first internal clock cycle and sends it to the controller 2308, based on which the controller 2308 feedbacks another internal control signal value ($u_{k+2}$) for the next internal clock cycle, and so on. In other words, the internal control signal values and the predicted internal measurements are processed by the predictor 2306 and controller 2308 in a looped fashion, where the internal control signal values (e.g., control feedback in FIG. 23B) are based on the previous/most recent predicted internal measurement. Thus, as seen, while the controller 2308 controls, in a current clock cycle, the actuator using the internal control signal value computed for a last internal clock cycle of a previous clock cycle, the controller 2308 and predictor 2306 continue to optimize the actuator control that will be applied for the next clock cycle. In some cases, this optimized actuator control for the next clock cycle may be based on the most recent or previous "actual" measurement (i.e., for the current clock cycle), the one or more internal control signal values and/or the internal predicted measurements calculated for the internal clock cycles of the current clock cycle. In this way, instead of computing a single control signal value for each clock cycle, as seen in the control signal waveform 3705-$b$ produced by a prior art control algorithm, multiple internal control signal values may be calculated based on the multiple predicted internal measurements predicted (i.e., by the predictor 2306 and a second model of the system (e.g., Model 2)), and the last internal control signal value (e.g., optimized control signal) may be applied as the actuator control for the next clock cycle. As seen in FIG. 37A, the multi-step ahead prediction described above facilitates in reducing the time needed to achieve the desired setpoint, as compared to the prior art. For instance, the normalized amplitude of waveform 3702-$a$ matches the desired setpoint within 2 clock cycles, while the normalized amplitude of waveform 3702-$b$ does not match the desired setpoint even after 3 clock cycles.

Figure 38:
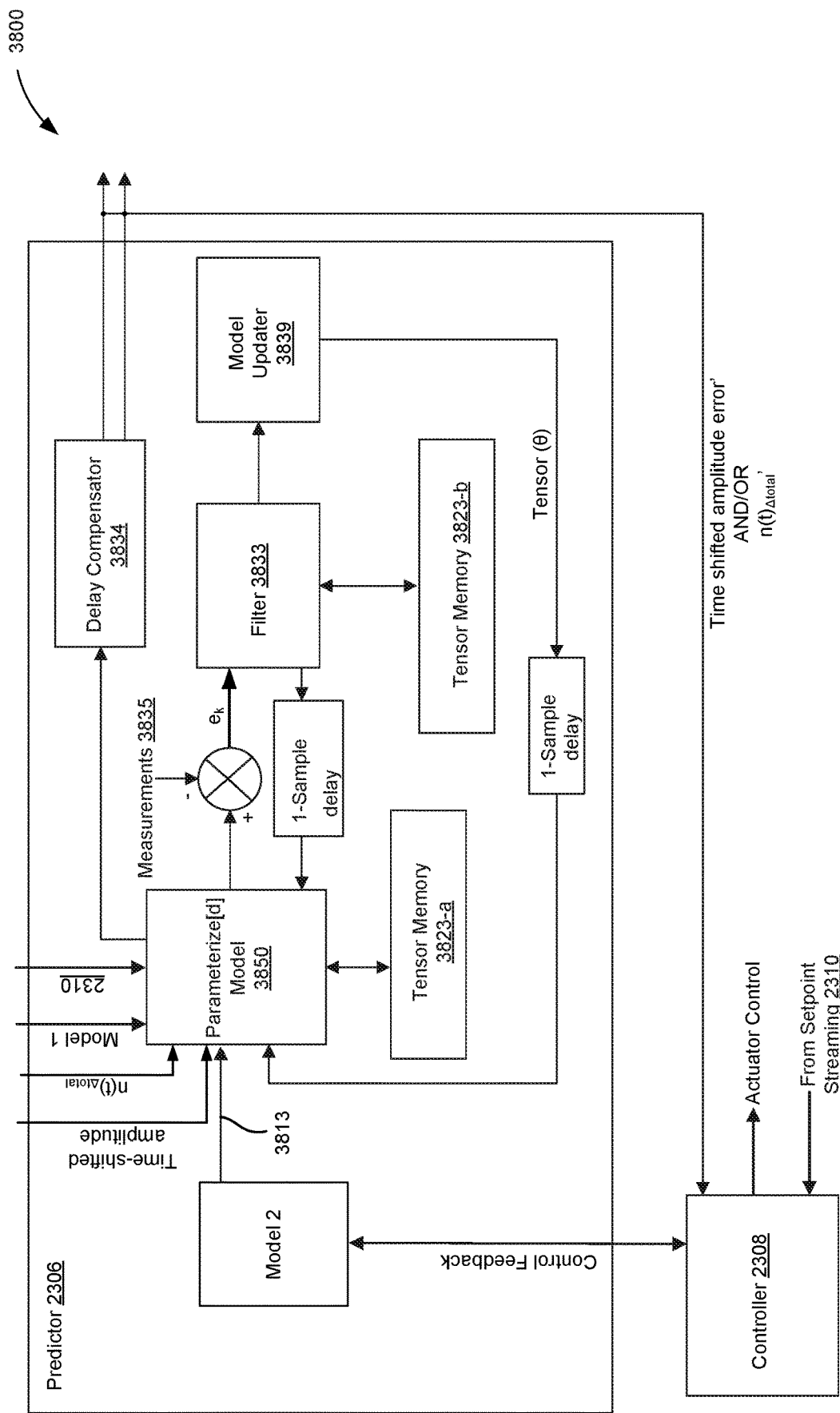
FIG. 38 illustrates a detailed schematic diagram of the predictive control section in FIG. 23B, in accordance with one or more aspects of the present disclosure.

FIG. 38 illustrates a detailed schematic diagram 3800 of the predictive control section 2012 in FIG. 23B, in accordance with one or more aspects of the present disclosure. As seen, the predictive control section comprises the predictor 2306 and the controller 2308, where the predictor 2306 further comprises a second model (e.g., the second model 2403), a model parametrization module 3850, a delay compensator 3834, a model updater 3839, a filter 3833 (e.g., a smoothing filter), and tensor memory (e.g., tensor memory 3823-$a$, 3823-$b$). In some cases, the predictive control section 2012 may be implemented using a second model (e.g., the second model 2403) created based on an adaptation mechanism. The second model may be used to describe the plasma dynamics, or any other measurable signal/controlled parameter/controlled output of the system in FIG. 21. Broadly, the second model may be used to describe the plasma dynamics at time $t_k$ using one or more parametrized functions (e.g., tensorial non-linear parametrized functions):

$$\dot{x}_k = f(x_k, u_k, \theta_k) \quad \text{(Equation 7)}$$

$$y_k = g(x_k, u_k, \theta_k) \quad \text{(Equation 8)}$$

where the system time evolution may be described by Equation 7 for $\dot{x}_k$, the system output by Equation 8 for $y_k$, the measurements by $x_k$, and the control signals by $u_k$. In some cases, f and g may be tensorial nonlinear parametrized functions, where the parametrization is done through a tensor Ok. In other words, $\dot{x}_k$, $x_k$, $y_k$, $u_k$, f (x, u, $\theta$), and g (x, u, $\theta$) are time-varying multi-input multi-output (MIMO) coupled tensors, in some examples. In some other cases, f and/or g may be linear functions.

As seen, the model parametrization module 3850 of the predictor 2306 may take one or more inputs from other elements of the system in FIG. 23B and produce one or more outputs. For example, the model parametrization module 3850 may take a time-shifted amplitude error a total estimated delay for the system $n_{\Delta total}$, the Model 1, and input from the setpoint streaming module 2310. Additionally, the model parametrization module 3850 may also receive predicted internal measurements 3813 as computed by the Model 2 (e.g., the second model 2403). The model parametrization module 3850 may be at least one of electronically, logistically, and communicatively coupled to tensor memory 3823-$a$, which may store data related to the various MIMO coupled tensors listed above in Equations 7 and 8.

At the beginning of the process, a set of model(s) corresponding to the frames for a CPU clock cycle may be input into the setpoint streaming module 2310B of the FPGA. In some examples, the set of model(s) may correspond to Model 1 in the setpoint streaming module 2310A. In some examples, the set of model(s) may comprise one or more of the setpoint sequence and one or more models corresponding to specific parts of one or more frames. Alternatively, the set of model(s) may comprise pointwise models representing an initial guess of the process. In either case, the FPGA may start generating the points for it for interpolation, which are then passed to the system, based on which the Model 1 is created. These points may be associated with, or may define, a setpoint sequence. Further, the interpolation of the setpoint sequence may be used to create the Model 1, in some examples. In some cases, the predictor 2306 may receive the Model 1 and the setpoint streaming, for instance, the Model 1 may be passed through the setpoint streaming module 2310, which is then used to initialize Model 2 in the predictor 2306. In some examples, the initial parametrizations for Model 2 may be based on the parametrizations for Model 1. In other words, the starting or initial value of Model 2 is the same as, or similar to Model 1. This initial parametrization of Model 2 may be updated as the multi-step ahead predictor provides measurement predictions, in accordance with aspects of the present disclosure. For instance, the model parametrization module 3850 may receive predicted internal measurements 3813 as computed by the Model 2, which are then compared to one or more measurements 3835 to determine an error $e_k$. In some cases, this error $e_k$, also referred to as a prediction or modeling error, corresponds to a difference between the current model used to generate the predicted measurement(s) and the actual model derived from the measurement(s) 3835. This error $e_k$ may be used to update the parametrizations of the second model used for predicting measurements. The filter 3833, which may be an example of a smoothing filter, may receive the error $e_k$ and clean it to remove noise and other disturbances so it can be processed by the model updater 3839. The model updater 3839 may determine a change in parametrization of the second model based on the smoothed and/or cleaned error $e_k$ received from the filter 3833. In some examples, the model updater 3839 may output an updated tensor ($\theta$). As noted above, the parametrization of the functions f and g in Equations 7 and 8 may be done through the tensor, $\theta$. The updated tensor output by the model updater 3839 may be fed back to the model parametrization module 3850 and used to update the second model (e.g., the second model 2403) used for subsequent predictions. In some cases, the $\theta$ tensor may be passed through a 1-sample delay so it is received at the next clock cycle, or alternatively, the next internal clock cycle. The smoothing filter 3833 may also be coupled to a tensor memory 3823-$b$, in some examples. In some cases, the tensor memory 3823-$b$ may be the same as, or similar to, the tensor memory 3823-$a$.

The delay compensator 3834 may receive the predicted measurements, actual measurements, time-shifted amplitude error 2052, and/or n(t)$_{\Delta total}$ from the model parametrization module 3850 and output the adjusted time-shifted amplitude error 2452 and/or the adjusted time delay n(t)$_{\Delta total}'$ that is fed into the controller 2308. The controller 2308 then processes the adjusted time-shifted amplitude error 2452 and/or the adjusted time delay n(t)$_{\Delta total}'$, along with the setpoint streaming module 2310, to compute the actuator control signal sent to the driver(s) (e.g., RF driver 902 and DC/Rail driver 904 in FIG. 21).

Figure 39:
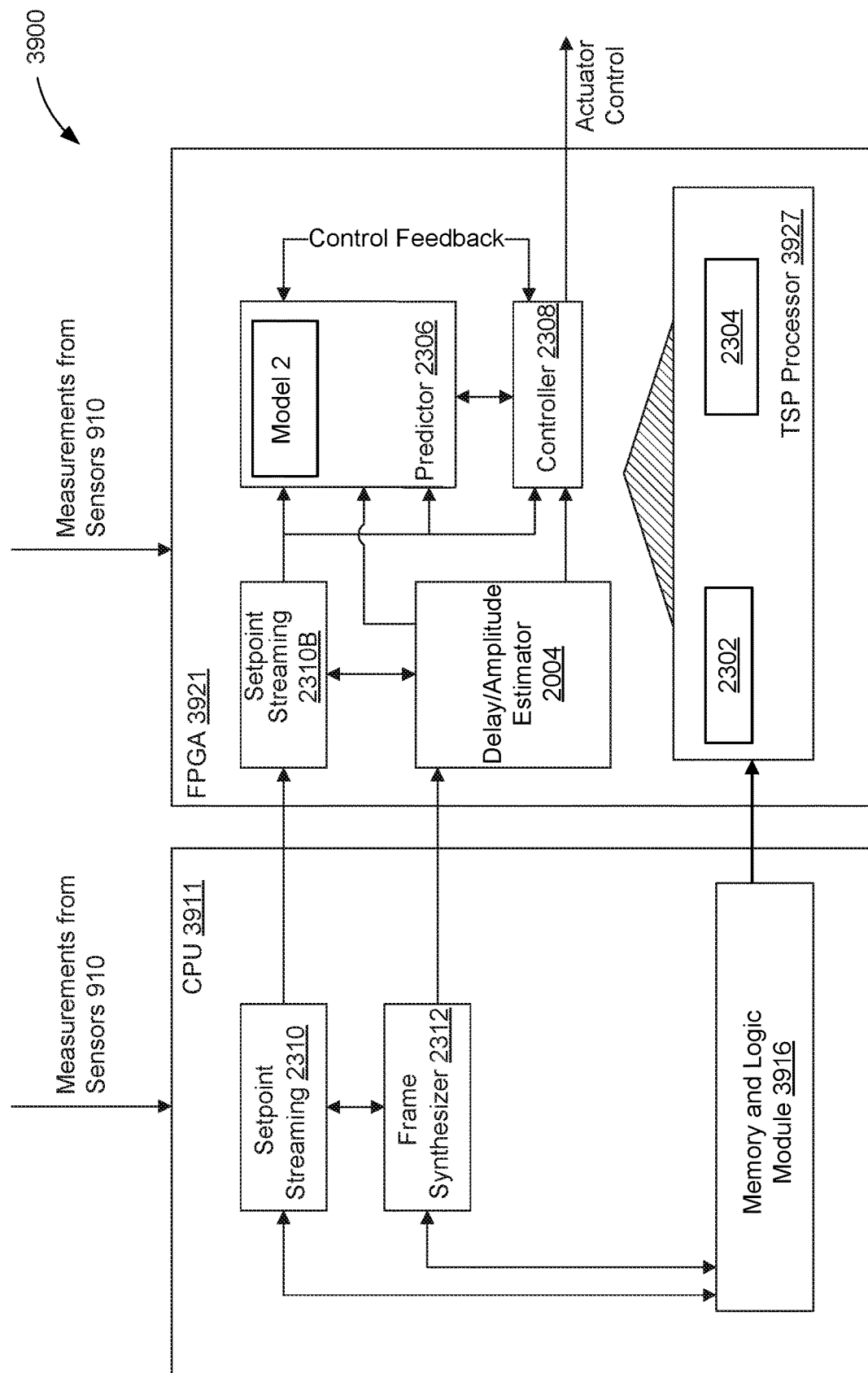
FIG. 39 is a block diagram illustrating an example control architecture that may be used to implement the control functionality of FIG. 20, according to various aspects of the present disclosure.

Turning now to FIG. 39, is a block diagram 3900 illustrating an example control architecture that may be used to implement the control functionality of FIG. 20, in accordance with various aspects of the present disclosure. In some examples, the control architecture may be implemented across a CPU 3911 and a FPGA 3921. The CPU 3911 and/or the FPGA 3921 may be similar or substantially similar to the CPU and/or FPGA described above in relation to FIG. 23B. The CPU 3911 and/or the FPGA 3921 may receive measurement data from the sensors 905, where the measurements may be blocked/chunked into frames, via the frame synthesizer and combiner 2312 in the CPU, to enable parallel processing. The frame synthesizer and combiner 2312 can clean the measurements and create frames from the cleaned data. For the purpose of this disclosure, a frame is a set of samples processed in a batch, and thus frames can be processed in parallel and then the outputs of frame processing can be serialized. The frame synthesizer and combiner 2312 may also be configured to process the synthesized frames so that they are compatible for further processing in the delay/amplitude estimator 2004 in the FPGA 3921. In some embodiments, the setpoints can be provided by the UI 108 as shown in FIG. 21 (e.g., in the form of a target multi-level pulsed waveform) or the setpoint streaming module 2310 of the CPU 3911, for instance, in the form of setpoints. The setpoint streaming module 2310 may be similar or substantially similar to the setpoint streaming described above in relation to FIGS. 23A and/or 23B. In some cases, the setpoint streaming module 2310 creates a waveform from a set of discrete setpoints.

The CPU 3911 may further comprise a memory and logic module 3916 that is electronically, logistically, and/or communicatively coupled to the setpoint streaming module 2310 and the frame synthesizer and combiner 2312. The memory and logic module 3916 of the CPU 3911 may also communicate with the TSP processor 3927 in the FPGA 3921, where the TSP processor may comprise the frame reader 2302 and the TSP RAM 2304 described above in relation to FIG. 23B. In some cases, the memory and logic module 3916 may store synthesized frames and/or coefficients of setpoint streaming, which enables communication between the FPGA and the CPU even though they operate at different speeds. While not necessary, in some embodiments, the memory and logic module 3916 stores the data in the form of a matrix of matrices. The TSP processor 3927 may communicate with one or more of the elements (e.g., delay/amplitude estimator 2004, controller 2308, predictor 2306, setpoint streaming module 2310B) of the FPGA 3921, as depicted by the large, hatched triangle. The delay/amplitude estimator 2004 may operate, as described in relation to the preceding figures, to output a n(t)$_{\Delta total}$ and a time-shifted amplitude error to the predictor 2306. The predictive control section 2012 comprising the predictor 2306 and the controller 2308 operate in a looped manner, where they exchange predicted internal measurements and the internal control signal values, respectively, until a next measurement is available. The controller 2308 transmits the actuator control, for instance, at or near the time when the next measurement arrives from the sensors 905.

As noted above in relation to FIGS. 37A and 37B, in some cases, the controller 2308 may compute a control signal value at a faster clock cycle rate (e.g., once every 31.25 nanoseconds) than the clock cycle rate (e.g., once every 250 nano seconds) at which the control signal is passed to the actuator, or alternatively, the clock cycle rate at which the actual measurements/parameter values of the controlled parameter are available.

Figure 40:
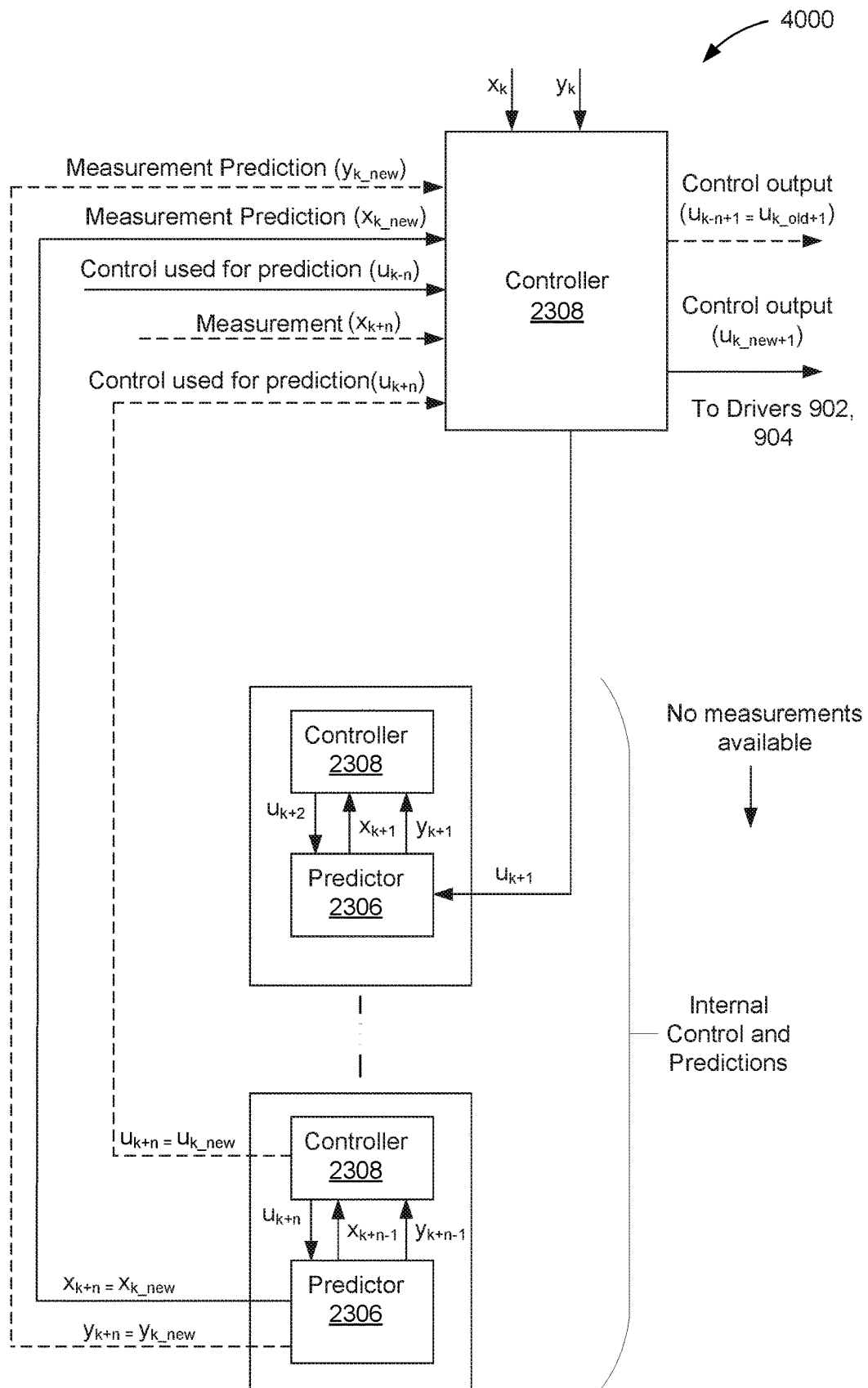
FIG. 40 illustrates an example of a process flow that may be implemented in the predictive control section of FIGS. 20, 21, 23A, and 23B, according to various aspects of the present disclosure.

FIG. 40 illustrates an example of a process flow 4000 implemented in the multi-step ahead predictor (e.g., predictive control section 2012), according to various aspects of the present disclosure. Here, the start of each "longer" clock cycle (i.e., clock cycle corresponding to when a measurement is fed to the controller 2308) is denoted by an index of the form: "k+i*n", where "i" incrementally increases after each clock cycle. Further, the internal clock cycles are denoted by an index of the form: "k+i*n+m", where 0≤m≤n.

As seen, a measurement (e.g., a controlled parameter, such as forward power, reflected power, reflection coefficient, frequency, RF drive/bias voltage, to name a few non-limiting examples) comes in at time $t_k$, which is at or near the time when the controller 2308 adjusts the actuator with the output control signal ($u_{k-n+1}$), where the control signal, $u_{k-n+1}$, output by the controller 2308 is based on a last internal control signal value calculated from the previous "longer" clock cycle. This "k-n" index may be referred to as kola as it corresponds to the previous clock cycle. The controller 2308 initiates the multi-step ahead prediction by sending a control feedback/internal control signal value, $u_{k+1}$, based on the most recent measurement, $x_k$. The predictor receives the control signal value, $u_{k+1}$, and outputs a predicted internal measurement $x_{k+1}$ that is sent to the controller 2308. The controller 2308 processes the predicted internal measurement and outputs another internal control signal value, $u_{k+2}$, based on the predicted internal measurement, $x_{k+1}$. This process is repeated until the last internal clock cycle, i.e., the time at which the next measurement is available. When the next measurement is available, the internal state or the last internal measurement of the predictor, which may be represented as $x_{k+n}$ or $x_{k\_new}$, is compared to the actual measurement for updating the second model (e.g., the second model 2403). In some cases, the internal control signal value, $u_{k+n}$, computed by the controller is used to predict the internal measurement, $x_{k+n}$ or $x_{k\_new}$. Further, the last control signal value, $u_{k+n+1}$ or $u_{k\_new+1}$ for this clock cycle (i.e., the "longer" clock cycle starting at $t_k$) computed in response to the last/most recent predicted internal measurement, $x_{k+n}$, is used as the actuator control (i.e., for the next longer clock cycle starting at $t_{k+n}$) and output to the drivers 902, 904.

As used herein, the tensor $y_k$ may be used to refer to the measurement tensor corresponding to the controlled output, such as an output coupled to a plasma processing chamber. Alternatively, the tensor $y_k$ may refer to a measurement tensor for a first controlled parameter within the system, such as forward power or the output of the power amplifier 906, and the tensor $x_k$ may refer to a measurement tensor for another controlled parameter, such as the RF driver voltage (Vo) in FIG. 21. In some cases, the measurement tensor $y_k$ may be defined using a function that takes the measurement tensor $x_k$ as an input. As seen in FIG. 40, the control algorithm depicted by way of process flow 4000 may also be implemented for use in a MIMO system, where there are multiple-inputs and multiple-outputs. For instance, $x_k$ and $y_k$ may correspond to measurement data received from different sensors 905. In such cases, multiple control signals (e.g., both internal and output control) may be calculated for the multiple actuators 2008. In other words, the predictive control section 2012 may be deployed for internally predicting multiple controlled parameters measured at multiple sensors 905, as well as computing multiple output control signals for adjusting multiple actuators 2008.

In some examples, when a measurement arrives, the second model's predicted measurement for that sample/internal clock cycle may compared with the actual measurement to update the second model. For example, an error may be computed from equations (9) and (10), where k in the equation(s) is the time at which the measurement is made available:

$$e_{xk} = x_{k_{measured}} - x_{k_{predicted}} \quad \text{(Equation 9)}$$

$$e_{yk} = y_{k\_measured} - y_{k_{predicted}} \quad \text{(Equation 10)}$$

Further, using equations 7, 8, 9, and 10, the second model may be updated at time $t_k$ for computing the next internal predicted measurements, i.e., until a new measurement arrives by Equations 11 and 12, where in Equation 12 below, $y_{k\_new} = y_{k\_old} + e_{yk}$.

$$\dot{x}_{k\_new} = f(x_{k\_old} + e_{xk}, u_k, \theta_k) \quad \text{(Equation 11)}$$

$$y_{k\_new} = g(x_{k\_old} + e_{xk}, u_k, \theta_k) \quad \text{(Equation 12)}$$

Optionally, a $\Delta f_k$ and a $\Delta g_k$ may be used to update the second model at every internal clock cycle (e.g., every 31.25 nanoseconds, when the actuator control is sent every 250 nanoseconds), such that from Equations 11 and 12, the $\Delta f_k$ and the $\Delta g_k$ may be calculated as follows:

$$\Delta f_k = \triangleright \{f_{new} - f_{old}\} \quad \text{(Equation 13)}$$

$$\Delta g_k = \triangleright \{g_{new} - g_{old}\} \quad \text{(Equation 14)}$$

where in Equations 13 and 14, the $\triangleright \{.\}$ operator computes the change in the parametrization of the second model per one or more of the internal clock cycles based on a pre-selected interpolation method (e.g., linear, spline, cubic, Hermite, Chebyshev, Gaussian, Exponential, to name a few non-limiting examples), where the interpolation occurs between the previously computed second model based on the actual measurements and the currently computed second model based on the actual measurements. This interpolation may be used to estimate the error correction term. For example, the error correcting term of the internal prediction model (e.g., Model 2, second model 2403) may be estimated based on the interpolation, two or more actual measurements over the length of a pulse or pre-selected time window, and the pre-selected interpolation method based on said measurements.

Thus, using the $\Delta f_k$ and $\Delta g_k$ Equations 13 and 14, respectively, the second model may be updated at every internal step/clock cycle (e.g., 31.25 nanoseconds) until the next measurement arrives for the next clock cycle (e.g., in 250 nanoseconds), using the following equations:

$$\dot{x}_{k\_new} = f(x_{k\_old} + e_{xk}, u_k, \theta_k) \quad \text{(Equation 15)}$$

$$y_{k\_new} = g(x_{k\_old} + e_{xk}, u_k, \theta_k) \quad \text{(Equation 16)}$$

In some embodiments, the control architecture in FIGS. 38 and 39 may be implemented in a parallel structure, which may enable the addition of one or more operations. For instance, using a parallel structure, the hardware implementation in FIG. 38 may be replicated a plurality of times (e.g., 8 times in the example where the internal control signals are generated every 31.25 ns and the control outputs are generated every 250 ns) as a series of blocks, where each block is triggered a pre-defined amount of time after the previous, time-wise, block. In some cases, the duration of time between when a block is triggered, and a subsequent block is triggered may be based on the duration of the internal clock cycle. In some circumstances, a parallel implementation, as a series of time-wise blocks, achieved by pipe-lining the multi-step ahead prediction mechanism may allow a longer processing time (e.g., 250 ns) and a shortened synthesized control rate (e.g., around 31.25 ns).

Figure 41:
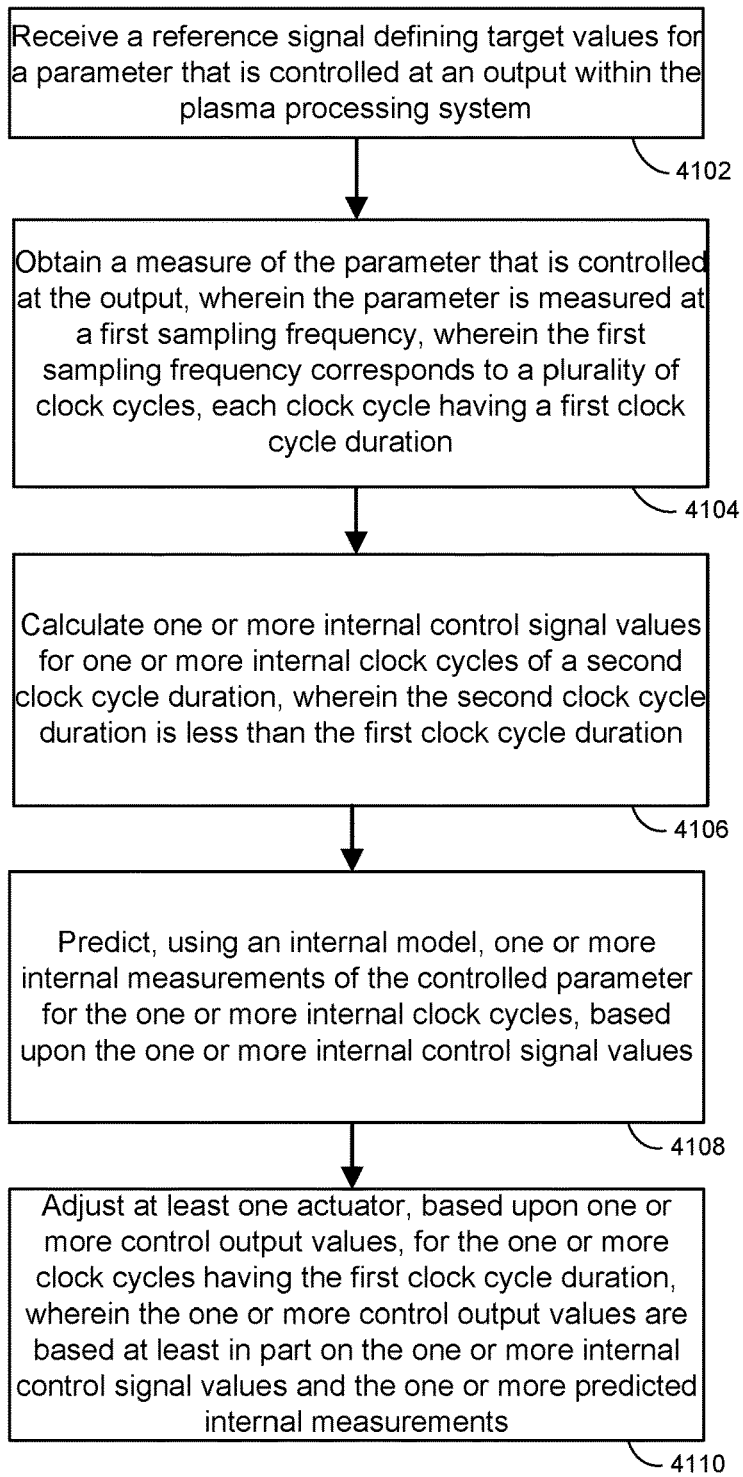
FIG. 41 is a flow chart depicting a method for controlling aspects of a plasma processing system.

FIG. 41 illustrates a method 4100 for controlling a non-linear system, such as a plasma processing system, in accordance with one or more implementations. The method 4100 may be implemented using one or more of the control section 2112, the predictive control section 2012, the FPGA, and the CPU, described in relation to the preceding figures.

At step 4102, the method 4100 comprises receiving a reference signal defining target values for a parameter that is controlled at an output within the plasma processing system.

The method further comprises obtaining a measure of the parameter that is controlled at the output. In some embodiments, the parameter is measured at a first sampling frequency, where the first sampling frequency corresponds to a plurality of clock cycles, each clock cycle having a first clock cycle duration (step 4104).

At step 4106, the method comprises calculating one or more internal control signal values for one or more internal clock cycles of a second clock cycle duration, where the second clock cycle duration is less than the first clock cycle duration. Next, at step 4108, the method 4100 comprises predicting, using a second model, one or more internal measurements of the controlled parameter for the one or more internal clock cycles, based upon the one or more internal control signal values.

At step 4110, the method comprises adjusting at least one actuator for the one or more clock cycles having the first clock cycle duration, where the adjusting is based upon one or more control output values. In some cases, the one or more control output values are based at least in part on the one or more internal control signal values and the one or more predicted internal measurements.

Figure 42:
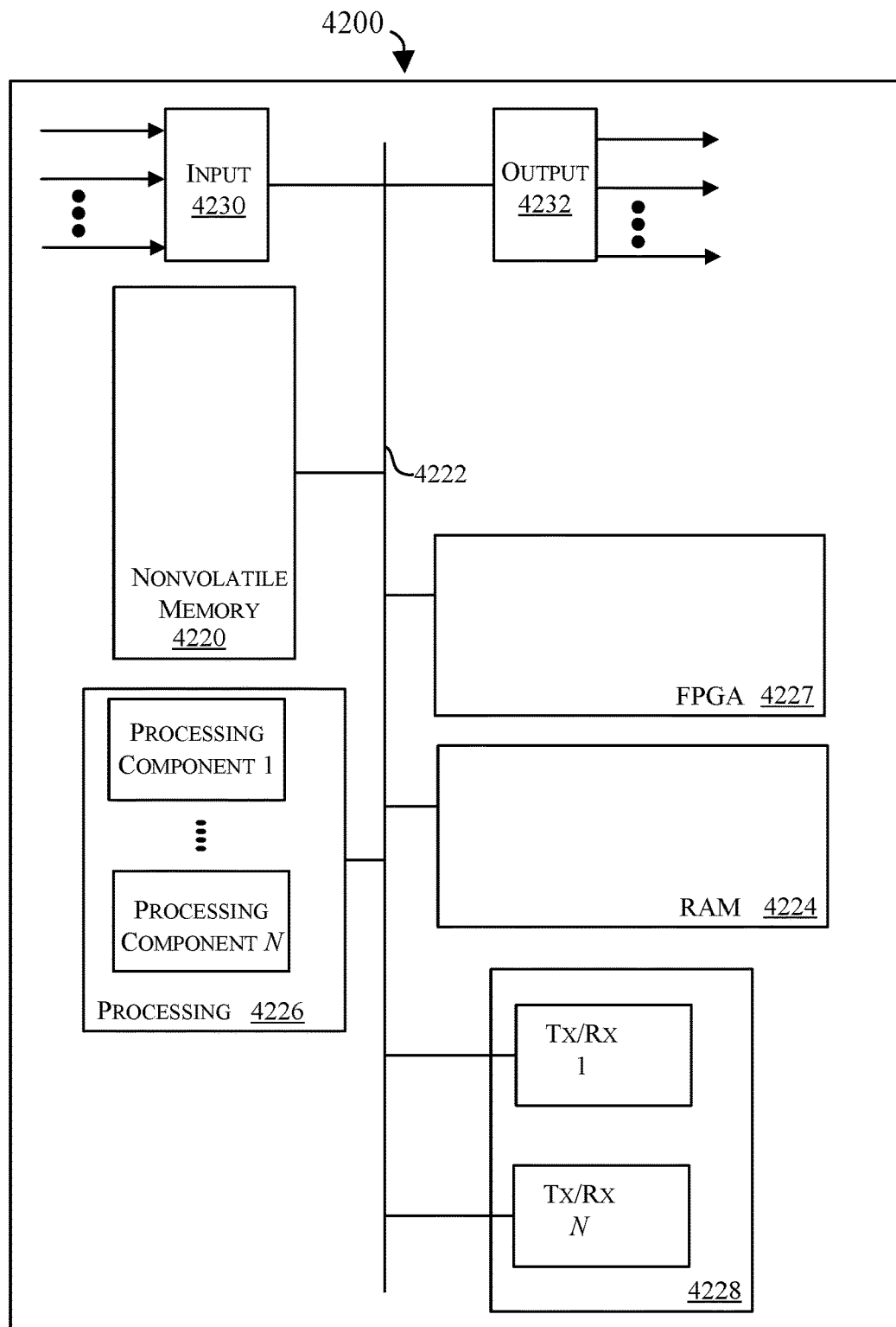
FIG. 42. is a block diagram depicting aspects of a computing system that may be utilized in connection with embodiments disclosed herein.

The methods described in connection with the embodiments disclosed herein may be embodied directly in hardware, in processor-executable code encoded in a non-transitory tangible processor readable storage medium, or in a combination of the two. Referring to FIG. 42 for example, shown is a block diagram 4200 depicting physical components that may be utilized to realize the control section 112, 302, 602, 912, 2112, 2301A, 2301B, and 2612 and/or the tensorial control 2001, according to an exemplary embodiment. As shown, in this embodiment nonvolatile memory 4220 is coupled to a bus 4222 that is also coupled to random access memory ("RAM") 4224, a processing portion (which includes N processing components) 4226, a field programmable gate array (FPGA) 4227, and a transceiver component 4228 that includes N transceivers. None of these components are required, and any combination of these may be included in the systems disclosed herein. For instance, where an FPGA 4227 is implemented, the processing portion 4226 may not be used, and vice versa. Although the components depicted in FIG. 42 represent physical components, FIG. 42 is not intended to be a detailed hardware diagram; thus, many of the components depicted in FIG. 42 may be realized by common constructs or distributed among additional physical components. Moreover, it is contemplated that other existing and yet-to-be developed physical components and architectures may be utilized to implement the functional components described with reference to FIG. 42.

In general, the nonvolatile memory 4220 is non-transitory memory that functions to store (e.g., persistently store) data and processor-executable code (including executable code that is associated with effectuating the methods described herein). In some embodiments for example, the nonvolatile memory 4220 includes bootloader code, operating system code, file system code, and non-transitory processor-executable code to facilitate the execution of a method to select a master state and thereby more effectively control raising and lowering of the rail voltage of the DC section 908 described with reference to FIGS. 5 and 6 described further herein.

In many implementations, the nonvolatile memory 4220 is realized by flash memory (e.g., NAND or ONENAND memory), but it is contemplated that other memory types may be utilized as well. Although it may be possible to execute the code from the nonvolatile memory 4220, the executable code in the nonvolatile memory is typically loaded into RAM 4224 and executed by one or more of the N processing components in the processing portion 4226.

The N processing components in connection with RAM 4224 generally operate to execute the instructions stored in nonvolatile memory 4220 to enable a method to select a master state and thereby more effectively control raising and lowering of the rail voltage. For example, non-transitory, processor-executable code to effectuate the methods described with reference to FIGS. 5 and 6 may be persistently stored in nonvolatile memory 4220 and executed by the N processing components in connection with RAM 4224. As one of ordinarily skill in the art will appreciate, the processing portion 4226 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 4226 may be configured to effectuate one or more aspects of the methodologies described herein (e.g., the method to select a master state and thereby more effectively control the slow actuator 316 as described in FIGS. 3 and 6 or the DC rail voltage of the DC/Rail Driver 904 in FIGS. 9 and 21). For example, non-transitory processor-readable instructions may be stored in the nonvolatile memory 4220 or in RAM 4224 and when executed on the processing portion 4226, cause the processing portion 4226 to perform a method of controlling the DC/rail driver 904 and the RF driver 902. Alternatively, non-transitory FPGA-configuration-instructions may be persistently stored in nonvolatile memory 4220 and accessed by the processing portion 4226 (e.g., during boot up) to configure the hardware-configurable portions of the processing portion 4226 to effectuate the functions of the control section 112, 302, 602, 912, 2112, 2301A, 2301B, 2612.

Alternatively, the FPGA 4227 may include non-transitory processor-executable code to facilitate the execution of a method to select a master state and thereby more effectively control raising and lowering of the slow actuator 316 described with reference to FIG. 3 described further herein. The FPGA 4227 may include on-board memory to access data such as the target multi-level waveform, or may access off-chip memory such as the nonvolatile memory 4220 accessible via bus 4222.

The input component 4230 operates to receive signals (e.g., feedback from the sensors 905 and/or signals from the user interface 108 such as the target multi-level pulsed waveform) that are indicative of one or more aspects of the target waveform or conditions of the nonlinear and/or chaotic load 104. The signals received at the input component may include, for example, a measurement of power delivered to the plasma processing chamber. The output component generally operates to provide one or more analog or digital signals to effectuate an operational aspect of the control section 302 generally. For example, the output portion 4232 may provide the controller signal to the RF driver 902 or the control signal to the DC/rail driver 904 described with reference to FIG. 9.

The depicted transceiver component 4228 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A plasma processing system comprising:
a user interface configured to receive a reference signal defining target values for a parameter that is controlled at an output within the plasma processing system;
at least one sensor to obtain a measure of the parameter that is controlled at the output;
a delay/amplitude estimator configured to:
calculate a delay between the target values of the reference signal and corresponding actual parameter values achieved at the output; and
provide, based upon the delay, a time-shifted amplitude error indicative of an error between the target values and the actual parameter values, the error encompassing at least noise and dynamic uncertainty; and
a predictive control section configured to preemptively adjust at least one actuator, based upon the delay and the time-shifted amplitude error.

2. The plasma processing system of claim 1, wherein the time-shifted amplitude error is based on a difference between a time-shifted version of the target values and the corresponding actual parameter values achieved at the output.

3. The plasma processing system of claim 1, wherein the predictive control section is further configured to adjust the at least one actuator, in advance of when an actual parameter value is desired at an actuator output of the at least one actuator while maintaining the output within a threshold range.

4. The plasma processing system of claim 1, wherein the delay/amplitude estimator is configured to process the target values and the actual parameter values in parallelized frames.

5. The plasma processing system of claim 4, wherein the delay/amplitude estimator is configured to calculate an instance of the delay for each of the parallelized frames.

6. The plasma processing system of claim 1, further comprising a time-shifted error creator configured to use the delay, the noise, and the dynamic uncertainty to calculate the time-shifted amplitude error.

7. The plasma processing system of claim 1, further comprising a hypothesis tester configured to:
probe a cost function based on:
the target values of the reference signal;
the corresponding actual parameter values achieved at the output;
a set of delay guesses; and
generate:
a set of cost function values each corresponding to a different one of the set of delay guesses; and
a time-shifted set of the target values of the reference signal each shifted by a different one of the set of delay guesses.

8. The plasma processing system of claim 7, further comprising a noise and uncertainty signal extraction configured to select a time-shifted set of target values from the time-shifted set of target values, as a selected time-shifted set of target values, corresponding to a one of the set of delay guesses corresponding to a maximum of the set of cost function values.

9. The plasma processing system of claim 8, wherein the noise and uncertainty signal extraction is further configured to identify noise and dynamic uncertainty in the corresponding actual parameter values from a difference between the selected time-shifted set of target values and the corresponding actual parameter values.

10. The plasma processing system of claim 1, wherein the delay comprises an internal delay and external delay.

11. A method of modifying control signals to one or more actuators based on measurements of one or more parameters of outputs of the one or more actuators and based on setpoints, the method comprising:
finding a total time delay that minimizes a total time delay between (1) time-shifted versions of the setpoints and (2) the measurements;
selecting a one of the time-shifted versions of the setpoints corresponding to the total time delay as a set of selected time-shifted setpoints;
determining an amplitude difference between the measurements and the set of selected time-shifted setpoints;
removing noise from the amplitude difference to form a denoised amplitude difference;
using the denoised amplitude difference to find a dynamic uncertainty of the amplitude difference;
using the noise, the dynamic uncertainty, and the total time delay, to generate a time-shifted amplitude error; and
passing a control signal to the one or more actuators that predictively accounts for the total time delay and the time-shifted amplitude error.

12. The method of claim 11, wherein finding the total time delay uses a cross correlation between the measurements and the time-shifted versions of the setpoints using a set of initial guesses for the total time delay between the measurements and the time-shifted versions of the setpoints.

13. The method of claim 11, wherein finding the total time delay comprises minimizing a cost function for multiple frames of the measurements, where frames comprising repeating portions of the measurements are analyzed in parallel.

14. The method of claim 11, wherein the total time delay is a tensor representing multiple inputs and multiple outputs.

15. The method of claim 11, wherein the time-shifted versions of the setpoints, the measurements, and the dynamic uncertainty are used to find a standard deviation of the noise.

16. A non-transitory, tangible computer readable storage medium, encoded with processor readable instructions to perform a method for generating control signals that preemptively account for delay and amplitude errors in a control system, the method comprising:
taking measurements at an output of one or more actuators;
finding a total time delay that minimizes a total time delay between (1) time-shifted versions of setpoints for the one or more actuators and (2) the measurements;
selecting a one of the time-shifted versions of the setpoints corresponding to the total time delay as a set of selected time-shifted setpoints;
determining an amplitude difference between the measurements and the set of selected time-shifted setpoints;
removing noise from the amplitude difference to form a denoised amplitude difference;
using the denoised amplitude difference to find a dynamic uncertainty of the amplitude difference;

using the noise, the dynamic uncertainty, and the total time delay, to generate a time-shifted amplitude error; and controlling the one or more actuators preemptively to account for the total time delay and the time-shifted amplitude error.

17. The non-transitory, tangible computer readable storage medium of claim 16, wherein the time-shifted amplitude error accounts for control system noise.

18. The non-transitory, tangible computer readable storage medium of claim 17, wherein the time-shifted amplitude error accounts for control system dynamic uncertainty.

19. The non-transitory, tangible computer readable storage medium of claim 16, further comprising using the dynamic uncertainty and the measurements to find the noise that was removed from the amplitude difference.

20. The non-transitory, tangible computer readable storage medium of claim 16, wherein controlling occurs before a time dictated by the setpoints.

* * * * *